US012813050B2

(12) United States Patent
Hyun et al.

(10) Patent No.: US 12,813,050 B2
(45) Date of Patent: Nov. 24, 2026

(54) BACKPLANE SUBSTRATE, DISPLAY DEVICE, AND TILED DISPLAY DEVICE

(71) Applicant: Samsung Display Co., LTD., Yongin-si (KR)

(72) Inventors: Jin Ho Hyun, Yongin-si (KR); Seung Wook Kwon, Yongin-si (KR); Hee Chang Yoon, Yongin-si (KR); Hye Min Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 455 days.

(21) Appl. No.: 18/458,816

(22) Filed: Aug. 30, 2023

(65) Prior Publication Data

US 2024/0097088 A1 Mar. 21, 2024

(30) Foreign Application Priority Data

Sep. 16, 2022 (KR) ........................ 10-2022-0116992

(51) Int. Cl.

*H10H 20/857* (2025.01)
*G09G 3/32* (2016.01)
*H10W 90/00* (2026.01)

(52) U.S. Cl.

CPC ............. *H10H 20/857* (2025.01); *G09G 3/32* (2013.01); *H10W 90/00* (2026.01); *G09G 2300/026* (2013.01); *G09G 2310/0216* (2013.01)

(58) Field of Classification Search

CPC ....... H10H 20/857; H10W 90/00; G09G 3/32; G09G 2300/026; G09G 2310/0216; G09G 2300/023; G09G 2300/0426; G09G 2300/0814; G09G 2300/0819; G09G 2300/0861; G09G 2300/0866; G09G 2320/045; G09G 3/3266; G09G 3/3275; H10K 77/10; H10K 50/805; H10K 59/1213; H10K 59/122; H10K 59/124; H10K 59/131; H10K 59/18; H10K 59/35

See application file for complete search history.

(56) References Cited

U.S. PATENT DOCUMENTS

| | | | | |
|---|---|---|---|---|
| 11,903,270 | B2 | 2/2024 | Kim et al. | |
| 2019/0363146 | A1* | 11/2019 | Takahashi ................. | G09F 9/30 |
| 2019/0363267 | A1* | 11/2019 | Tanaka ...................... | G09F 9/30 |

(Continued)

FOREIGN PATENT DOCUMENTS

| | | |
|---|---|---|
| KR | 10-2021-0086281 A | 7/2021 |
| KR | 10-2021-0086309 A | 7/2021 |
| KR | 10-2021-0113478 A | 9/2021 |

*Primary Examiner* — Victor A Mandala

(74) *Attorney, Agent, or Firm* — Womble Bond Dickinson (US) LLP

(57) ABSTRACT

A backplane substrate, a display device, and a tiled display device are provided. The backplane substrate of a display device includes subpixels. The backplane substrate includes a support substrate, a circuit layer on a first surface of the support substrate and including pixel drivers corresponding to the subpixels, respectively, an electrode layer on the circuit layer and including an anode and a cathode corresponding to an emission area of each of the subpixels, a bank layer on the circuit layer and corresponding to an area around the emission area of each of the subpixels, and a valley spaced from edges of the support substrate and penetrating at least the bank layer.

35 Claims, 41 Drawing Sheets

(56) References Cited

U.S. PATENT DOCUMENTS

| | | | | |
|---|---|---|---|---|
| 2019/0363275 | A1* | 11/2019 | Ochi | G09F 9/301 |
| 2020/0083306 | A1* | 3/2020 | Choi | H10K 59/121 |
| 2020/0343190 | A1* | 10/2020 | Wu | H05K 1/189 |
| 2020/0381653 | A1* | 12/2020 | Bang | H10K 59/122 |
| 2022/0003909 | A1* | 1/2022 | Song | G02B 5/201 |
| 2022/0123256 | A1 | 4/2022 | Hyun et al. | |
| 2022/0190042 | A1* | 6/2022 | Ye | G06F 3/0412 |
| 2022/0190071 | A1* | 6/2022 | Bae | H10K 59/122 |
| 2022/0208900 | A1* | 6/2022 | Kwon | H10K 59/122 |
| 2022/0285647 | A1* | 9/2022 | Cho | H10K 59/122 |
| 2023/0075253 | A1* | 3/2023 | Kim | H10D 86/471 |
| 2023/0077098 | A1* | 3/2023 | Kim | H10K 50/844 |
| 2023/0189572 | A1* | 6/2023 | Lee | H10K 59/122 257/40 |
| 2024/0215342 | A1* | 6/2024 | Huang | H10K 50/865 |
| 2024/0215419 | A1* | 6/2024 | Li | H10K 59/805 |
| 2024/0251616 | A1 | 7/2024 | Kim et al. | |
| 2024/0389385 | A1* | 11/2024 | Zhu | H10K 59/1201 |
| 2025/0081732 | A1* | 3/2025 | Xu | H10K 59/1201 |
| 2025/0107386 | A1* | 3/2025 | Wang | H10K 59/122 |
| 2025/0160124 | A1* | 5/2025 | Han | H10K 59/122 |

* cited by examiner

T3 : T31, T32
T4 : T41, T42
T10 : T101, T102
T11 : T111, T112

SEL : CH, S, D
CDL1 : G, GCE1~6, CE1, CE2, CE3
CDL2 : CE4, CE5, CE6
CDL3 : VIL, GIL, GWL, PWEL, PAEL, SWPL, GCL, VDL11 CCE1~8, DCE1,2
CDL4 : PWM_DL, PAM_DL, VDL12, VDCE, ANDE1

T16 : T161, 162
SEL : CH, S, D
CDL1 : G, GCE1~6, CE1, CE2, CE3
CDL2 : CE4, CE5, CE6
CDL3 : VIL, GIL, GWL, PWEL, PAEL, SWPL, GCL, VDL11 CCE1~8, DCE1,2
CDL4 : PWM_DL, PAM_DL, VDL12, VDCE, ANDE1

BACKPLANE SUBSTRATE, DISPLAY DEVICE, AND TILED DISPLAY DEVICE

CROSS-REFERENCE TO RELATED APPLICATION

This application claims priority to and the benefit of Korean Patent Application No. 10-2022-0116992, filed on Sep. 16, 2022, in the Korean Intellectual Property Office, the entire disclosure of which is incorporated by reference herein.

BACKGROUND

1. Field

The present disclosure relates to a backplane substrate, a display device, and a tiled display device.

2. Description of the Related Art

As the information society develops, demands for display devices for displaying images are increasing in various forms. The display devices may be flat panel displays such as liquid crystal displays, field emission displays, and light emitting displays.

The light emitting displays may include an organic light emitting display including an organic light emitting diode element as a light emitting element and a light emitting diode display including an inorganic light emitting diode element such as a light emitting diode (LED) as a light emitting element.

In the case of the organic light emitting display, the luminance or gray level of light of the organic light emitting diode element is adjusted by adjusting the magnitude of a driving current supplied to the organic light emitting diode element.

On the other hand, in the case of the light emitting diode display, because the color of light emitted from the inorganic light emitting diode element varies according to a driving current, may not be possible to properly display an image only by adjusting the magnitude of the driving current supplied to the inorganic light emitting diode element.

In one or more embodiments, the light emitting diode display may include a backplane substrate including a pixel driver, an anode, and a cathode of each subpixel and a light emitting element mounted on the anode and the cathode of each subpixel.

SUMMARY

When a process of preparing the backplane substrate and a process of mounting the light emitting elements on the backplane substrate are performed in separate work spaces, the transfer of the backplane substrate is unavoidable. When the backplane substrate is transferred, it may be temporarily covered by a protective layer in order to protect both surfaces of the backplane substrate from foreign matter or damage.

In addition, after the backplane substrate is moved to a work space where the process of mounting the light emitting elements is performed, the protective layer covering the backplane substrate must be removed in order to mount the light emitting elements and a circuit board.

Here, if the protective layer remains, it may cause a mounting defect of the light emitting elements.

Aspects and features of embodiments of the present disclosure provide a backplane substrate, a display device, and a tiled display device that can reduce a residual protective layer on an anode and a cathode.

Aspects and features of embodiments of the present disclosure also provide a backplane substrate, a display device, and a tiled display device that can improve image quality by preventing the color of a subpixel from being changed according to a driving current supplied to an inorganic light emitting diode element.

However, aspects and features of embodiments of the present disclosure are not restricted to the one set forth herein. The above and other aspects and features of embodiments of the present disclosure will become more apparent to one of ordinary skill in the art to which the present disclosure pertains by referencing the detailed description of the present disclosure given below.

According to one or more embodiments of the present disclosure, a backplane substrate of a display device including subpixels, includes a support substrate, a circuit layer on a first surface of the support substrate and including pixel drivers corresponding to the subpixels, respectively, an electrode layer on the circuit layer and including an anode and a cathode corresponding to an emission area of each of the subpixels, a bank layer on the circuit layer and corresponding to an area around the emission area of each of the subpixels, and a valley spaced from edges of the support substrate and penetrating at least the bank layer.

The display device further includes pixels, each including two or more adjacent subpixels from among the subpixels. The pixels include first pixels closest to the edges of the support substrate and second pixels adjacent to the first pixels. The valley is at a boundary between emission areas of the first pixels and emission areas of the second pixels and shaped similarly to the edges of the support substrate.

The circuit layer includes a semiconductor layer on the first surface of the support substrate, a first conductive layer on a first gate insulating layer covering the semiconductor layer, a second conductive layer on a second gate insulating layer covering the first conductive layer, a third conductive layer on an interlayer insulating layer covering the second conductive layer, a fourth conductive layer on a first planarization layer covering the third conductive layer, a fifth conductive layer on a second planarization layer covering the fourth conductive layer, and a third planarization layer covering the fifth conductive layer. The electrode layer is on the third planarization layer. The bank layer includes a bank planarization layer on the circuit layer and a bank insulating layer covering the bank planarization layer.

The bank insulating layer includes an inorganic insulating material. The bank insulating layer extends to edges of the emission area of each of the subpixels and covers a portion of edges of the anode and a portion of edges of the cathode.

The circuit layer further includes a first power wiring configured to transmit a first power to the pixel drivers, and a second power wiring configured to transmit a second power to the pixel drivers. The electrode layer further includes a third power wiring connected to the cathode of each of the subpixels. The valley includes a first valley portion overlapping the third power wiring and penetrating the bank planarization layer. A portion of the third power wiring between the first pixels and the second pixels contacts the bank insulating layer through the first valley portion.

The fifth conductive layer includes the second power wiring. The valley further includes a second valley portion overlapping the second power wiring, and a third valley portion different from the first valley portion and the second valley portion.

Each of the second valley portion and the third valley portion penetrates the bank planarization layer.

The second valley portion penetrates the bank planarization layer and the third planarization layer. A portion of the second power wiring between the first pixels and the second pixels contacts the bank insulating layer through the second valley portion.

The third valley portion penetrates the bank planarization layer and the third planarization layer.

The third valley portion penetrates the bank planarization layer, the third planarization layer, and the second planarization layer.

The electrode layer further includes an anode pad on the anode, and a cathode pad on the cathode. A light emitting element of each of the subpixels includes a flip chip-type micro-light emitting diode element and is mounted on the anode pad and the cathode pad of a corresponding subpixel of the subpixels.

The pixel drivers of the subpixels are electrically connected to the anodes of the subpixels, respectively. The circuit layer further includes a scan write wiring configured to transmit a scan write signal, a scan initialization wiring configured to transmit a scan initialization signal, a sweep signal wiring configured to transmit a sweep signal, a first data wiring configured to transmit a first data voltage, and a second data wiring configured to transmit a second data voltage. One pixel driver of the pixel drivers includes a first pixel driving circuit unit configured to generate a control current according to the first data voltage, a second pixel driving circuit unit configured to generate a driving current to be transmitted to the anode, according to the second data voltage, and a third pixel driving circuit unit configured to control a period during which the driving current is applied to the anode according to the control current of the first pixel driving circuit unit. The first pixel driving circuit unit includes a first transistor configured to generate the control current according to the first data voltage, a second transistor configured to apply the first data voltage of the first data wiring to a first electrode of the first transistor according to the scan write signal, a third transistor configured to apply an initialization voltage of an initialization voltage wiring to a gate electrode of the first transistor according to the scan initialization signal, a fourth transistor configured to connect the gate electrode of the first transistor and a second electrode of the first transistor according to the scan write signal, and a first capacitor located between the sweep signal wiring and the gate electrode of the first transistor.

The circuit layer further includes a gate voltage wiring configured to transmit a gate level voltage, a first emission wiring configured to transmit a first emission signal, and a scan control wiring configured to transmit a scan control signal. The first pixel driving circuit unit further includes a fifth transistor configured to connect the first power wiring to the first electrode of the first transistor according to the first emission signal, a sixth transistor configured to connect the second electrode of the first transistor to the third pixel driving circuit unit according to the first emission signal, and a seventh transistor configured to connect a first node between the sweep signal wiring and the first capacitor to the gate voltage wiring according to the scan control signal.

The second pixel driving circuit unit includes an eighth transistor configured to generate the driving current according to the second data voltage, a ninth transistor configured to apply the second data voltage of the second data wiring to a first electrode of the eighth transistor according to the scan write signal, a tenth transistor configured to apply the initialization voltage of the initialization voltage wiring to a gate electrode of the eighth transistor according to the scan initialization signal, and an eleventh transistor configured to connect the gate electrode of the eighth transistor and a second electrode of the eighth transistor according to the scan write signal.

The second pixel driving circuit unit further includes a twelfth transistor configured to connect the second power wiring to the first electrode of the eighth transistor according to the first emission signal, a thirteenth transistor configured to connect the first power wiring to a second node according to the scan control signal, a fourteenth transistor configured to connect the second power wiring to the second node according to the first emission signal, and a second capacitor located between the gate electrode of the eighth transistor and the second node.

The third pixel driving circuit unit is connected to the sixth transistor of the first pixel driving circuit unit at a third node. The third pixel driving circuit unit includes a fifteenth transistor including a gate electrode configured to connect to the third node, a sixteenth transistor configured to connect the third node to the initialization voltage wiring according to the scan control signal, a seventeenth transistor configured to connect a second electrode of the fifteenth transistor to the anode according to the second emission signal, an eighteenth transistor configured to connect the anode to the initialization voltage wiring according to the scan control signal, and a third capacitor located between the third node and the initialization voltage wiring.

The semiconductor layer includes a channel, a source electrode, and a drain electrode of each of the first through eighteenth transistors. The first conductive layer includes a gate electrode of each of the first through eighteenth transistors and first through third capacitor electrodes that are ends of the first through third capacitors, respectively. The second conductive layer includes fourth through sixth capacitor electrodes that are the other ends of the first through third capacitors, respectively. The third conductive layer includes the initialization voltage wiring, the scan initialization wiring, the scan write wiring, the first emission wiring, the second emission wiring, the sweep signal wiring, the gate voltage wiring and the scan control wiring. The fourth conductive layer includes the first data wiring and the second data wiring. The fifth conductive layer includes the second power wiring. The first power wiring includes a first power main wiring extending in a first direction, and a first power sub-wiring extending in a second direction and electrically connected to the first power main wiring. The third conductive layer further includes the first power main wiring. The fourth conductive layer further includes the first power sub-wiring. The third conductive layer further includes a third power auxiliary wiring configured to receive third power is applied.

The fourth conductive layer further includes a first anode connection electrode spaced from the first data wiring, the second data wiring and the first power main wiring and electrically connected to the seventeenth transistor, the eighteenth transistor and the nineteenth transistor. The fifth conductive layer further includes a second anode connection electrode spaced from the second power wiring and electrically connected to the first anode connection electrode. The anode is electrically connected to the second anode connection electrode.

The circuit layer further includes a first auxiliary insulating layer between the first planarization layer and the fourth conductive layer and including an inorganic insulating material, a second auxiliary insulating layer between the second planarization layer and the fifth conductive layer and including the inorganic insulating material, and a third auxiliary insulating layer between the third planarization layer and the electrode layer and including the inorganic insulating material.

According to one or more embodiments of the present disclosure, a display device includes a backplane substrate including pixel drivers respectively corresponding to subpixels and an anode and a cathode corresponding to an emission area of each of the subpixels, and light emitting elements respectively corresponding to the emission areas of the subpixels. Each of the light emitting elements is mounted on the anode and the cathode of each of the subpixels. The backplane substrate includes a support substrate, a circuit layer on a first surface of the support substrate and including the pixel drivers, an electrode layer on the circuit layer and including the anode and the cathode of each of the subpixels, a bank layer on the circuit layer and corresponding to an area around the emission area of each of the subpixels, and a valley spaced from edges of the support substrate and penetrating at least the bank layer.

The display device further includes pixels, each including two or more adjacent subpixels from among the subpixels. The pixels include first pixels closest to the edges of the support substrate and second pixels adjacent to the first pixels. The valley is at a boundary between emission areas of the first pixels and emission areas of the second pixels and shaped similarly to the edges of the support substrate.

The circuit layer includes a semiconductor layer on the first surface of the support substrate, a first conductive layer on a first gate insulating layer covering the semiconductor layer, a second conductive layer on a second gate insulating layer covering the first conductive layer, a third conductive layer on an interlayer insulating layer covering the second conductive layer, a fourth conductive layer on a first planarization layer covering the third conductive layer, a fifth conductive layer on a second planarization layer covering the fourth conductive layer, and a third planarization layer covering the fifth conductive layer. The electrode layer is on the third planarization layer. The bank layer includes a bank planarization layer on the circuit layer and a bank insulating layer covering the bank planarization layer. The bank insulating layer includes an inorganic insulating material and extends to edges of the emission area of each of the subpixels and covers a portion of edges of the anode and a portion of edges of the cathode.

The circuit layer further includes a first power wiring configured to transmit a first power to the pixel drivers, and a second power wiring configured to transmit a second power to the pixel drivers. The electrode layer further includes a third power wiring connected to the cathode of each of the subpixels. The fifth conductive layer includes the second power wiring. The valley includes a first valley portion overlapping the third power wiring, a second valley portion overlapping the second power wiring, and a third valley portion being other than the first valley portion and the second valley portion. The first valley portion penetrates the bank planarization layer. A portion of the third power wiring located between the first pixels and the second pixels contacts the bank insulating layer through the first valley portion.

The second valley portion penetrates the bank planarization layer and the third planarization layer. A portion of the second power wiring located between the first pixels and the second pixels contacts the bank insulating layer through the second valley portion.

The third valley portion penetrates the bank planarization layer, the third planarization layer, and the second planarization layer.

Each of the light emitting elements includes a base substrate, a first semiconductor on a surface of the base substrate, an active layer on a portion of the first semiconductor, a second semiconductor on the active layer and having a conductivity type different from that of the first semiconductor, a first contact electrode on another portion of the first semiconductor, and a second contact electrode on the second semiconductor.

The electrode layer further includes an anode pad on the anode, and a cathode pad on the cathode. The anode pad is electrically connected to the first contact electrode through an anode contact electrode. The cathode pad is electrically connected to the second contact electrode through a cathode contact electrode.

The pixel drivers of the subpixels are electrically connected to the anodes of the subpixels, respectively. The circuit layer further includes a scan write wiring configured to transmit a scan write signal, a scan initialization wiring configured to transmit a scan initialization signal, a sweep signal wiring configured to transmit a sweep signal, a first data wiring configured to transmit a first data voltage, and a second data wiring configured to transmit a second data voltage. One pixel driver of the pixel drivers includes a first pixel driving circuit unit configured to generate a control current according to the first data voltage, a second pixel driving circuit unit configured to generate a driving current to be transmitted to the anode, according to the second data voltage, and a third pixel driving circuit unit configured to control a period during which the driving current is applied to the anode according to the control current of the first pixel driving circuit unit. The first pixel driving circuit unit includes a first transistor configured to generate the control current according to the first data voltage, a second transistor configured to apply the first data voltage of the first data wiring to a first electrode of the first transistor according to the scan write signal, a third transistor configured to apply an initialization voltage of an initialization voltage wiring to a gate electrode of the first transistor according to the scan initialization signal, a fourth transistor configured to connect the gate electrode of the first transistor and a second electrode of the first transistor according to the scan write signal, and a first capacitor located between the sweep signal wiring and the gate electrode of the first transistor.

The circuit layer further includes a gate voltage wiring configured to transmit a gate level voltage, a first emission configured to wiring transmit a first emission signal, and a scan control wiring configured to transmit a scan control signal. The first pixel driving circuit unit further includes a fifth transistor configured to connect the first power wiring to the first electrode of the first transistor according to the first emission signal, a sixth transistor configured to connect the second electrode of the first transistor to the third pixel driving circuit unit according to the first emission signal, and a seventh transistor configured to connect a first node between the sweep signal wiring and the first capacitor to the gate voltage wiring according to the scan control signal.

The second pixel driving circuit unit includes an eighth transistor configured to generate the driving current according to the second data voltage, a ninth transistor configured to apply the second data voltage of the second data wiring to a first electrode of the eighth transistor according to the scan write signal, a tenth transistor configured to apply the initialization voltage of the initialization voltage wiring to a gate electrode of the eighth transistor according to the scan initialization signal, and an eleventh transistor configured to connect the gate electrode of the eighth transistor and a second electrode of the eighth transistor according to the scan write signal.

The second pixel driving circuit unit further includes a twelfth transistor configured to connect the second power wiring to the first electrode of the eighth transistor according to the first emission signal, a thirteenth transistor configured to connect the first power wiring to a second node according to the scan control signal, a fourteenth transistor configured to connect the second power wiring to the second node according to the first emission signal, and a second capacitor located between the gate electrode of the eighth transistor and the second node.

The third pixel driving circuit unit is connected to the sixth transistor of the first pixel driving circuit unit at a third node. The third pixel driving circuit unit includes a fifteenth transistor including a gate electrode connected to the third node, a sixteenth transistor configured to connect the third node to the initialization voltage wiring according to the scan control signal, a seventeenth transistor configured to connect a second electrode of the fifteenth transistor to the anode according to the second emission signal, an eighteenth transistor configured to connect the anode to the initialization voltage wiring according to the scan control signal, and a third capacitor located between the third node and the initialization voltage wiring.

The semiconductor layer includes a channel, a source electrode, and a drain electrode of each of the first through eighteenth transistors. The first conductive layer includes a gate electrode of each of the first through eighteenth transistors and first through third capacitor electrodes that are ends of the first through third capacitors, respectively. The second conductive layer includes fourth through sixth capacitor electrodes that are other ends of the first through third capacitors, respectively. The third conductive layer includes the initialization voltage wiring, the scan initialization wiring, the scan write wiring, the first emission wiring, the second emission wiring, the sweep signal wiring, the gate voltage wiring and the scan control wiring. The fourth conductive layer includes the first data wiring and the second data wiring. The fifth conductive layer includes the second power wiring. The first power wiring includes a first power main wiring extending in a first direction and a first power sub-wiring extending in a second direction and electrically connected to the first power main wiring. The third conductive layer further includes the first power main wiring. The fourth conductive layer further includes the first power sub-wiring. The third conductive layer further includes a third power auxiliary wiring to which third power is applied.

The fourth conductive layer further includes a first anode connection electrode spaced from the first data wiring, the second data wiring and the first power main wiring and electrically connected to the seventeenth transistor, the eighteenth transistor and the nineteenth transistor. The fifth conductive layer further includes a second anode connection electrode spaced from the second power wiring and electrically connected to the first anode connection electrode. The anode is electrically connected to the second anode connection electrode.

The backplane substrate further includes an additional circuit layer on a second surface of the support substrate, an additional planarization layer on a portion of the second surface of the support substrate and covering a portion of the additional circuit layer, an additional insulating layer on the second surface of the support substrate, covering the additional planarization layer, and including the inorganic insulating material, a side wiring on a side surface of the support substrate and electrically connecting the circuit layer and the additional circuit layer, and an overcoat layer covering the side wiring. A surface of the backplane substrate is covered with a first protective layer on the bank layer, and the other surface of the backplane substrate is covered with a second protective layer on the additional insulating layer. The first protective layer is in an area surrounded by the valley.

According to one or more embodiments of the present disclosure, a tiled display device includes display devices arranged parallel to each other, and a seam between the display devices. One display device of the display devices includes a backplane substrate including pixel drivers respectively corresponding to subpixels and an anode and a cathode corresponding to an emission area of each of the subpixels, and light emitting elements respectively corresponding to the emission areas of the subpixels. Each of the light emitting elements is mounted on the anode and the cathode of each of the subpixels. The backplane substrate includes a support substrate, a circuit layer on a first surface of the support substrate and including the pixel drivers, an electrode layer on the circuit layer and including the anode and the cathode of each of the subpixels, a bank layer on the circuit layer and corresponding to an area around the emission area of each of the subpixels, and a valley spaced from edges of the support substrate and penetrating at least the bank layer.

The one of the display devices further includes pixels, each of the pixels including two or more adjacent subpixels from among the subpixels. The pixels include first pixels closest to the edges of the support substrate and second pixels adjacent to the first pixels. The valley is located at a boundary between emission areas of the first pixels and emission areas of the second pixels and shaped similarly to the edges of the support substrate.

The circuit layer includes a semiconductor layer on the first surface of the support substrate, a first conductive layer on a first gate insulating layer covering the semiconductor layer, a second conductive layer on a second gate insulating layer covering the first conductive layer, a third conductive layer on an interlayer insulating layer covering the second conductive layer, a fourth conductive layer on a first planarization layer covering the third conductive layer, a fifth conductive layer on a second planarization layer covering the fourth conductive layer, and a third planarization layer covering the fifth conductive layer. The bank layer includes a bank planarization layer on the circuit layer and a bank insulating layer covering the bank planarization layer. The third conductive layer includes a first power main wiring transmitting first power and extending in a first direction. The fourth conductive layer includes a first power sub-wiring extending in a second direction intersecting the first direction and electrically connected to the first power main wiring. The fifth conductive layer includes a second power wiring configured to transmit a second power. The electrode layer further includes a third power wiring on the third planarization layer and connected to the cathode of each of the subpixels. The valley includes a first valley portion overlapping the third power wiring, a second valley portion overlapping the second power wiring, and a third valley portion other than the first valley portion and the second valley portion. The first valley portion penetrates the bank planarization layer. A portion of the third power wiring located between the first pixels and the second pixels contacts the bank insulating layer through the first valley portion.

The second valley portion penetrates the bank planarization layer and the third planarization layer. A portion of the second power wiring located between the first pixels and the second pixels contacts the bank insulating layer through the second valley portion.

The third valley portion penetrates the bank planarization layer, the third planarization layer, and the second planarization layer.

Each of the light emitting elements includes a base substrate, a first semiconductor on a surface of the base substrate, an active layer on a portion of the first semiconductor, a second semiconductor on the active layer and having a conductivity type different from that of the first semiconductor, a first contact electrode on another portion of the first semiconductor, and a second contact electrode on the second semiconductor. The electrode layer further includes an anode pad on the anode and a cathode pad on the cathode. The anode pad is electrically connected to the first contact electrode through an anode contact electrode. The cathode pad is electrically connected to the second contact electrode through a cathode contact electrode.

The backplane substrate further includes a signal pad on the first surface of the support substrate, a rear pad on a second surface of the support substrate which is opposite the first surface of the support substrate, a side wiring on a side surface of the support substrate and electrically connecting the signal pad and the rear pad, and a rear connection wiring on the second surface of the support substrate and electrically connected to the rear pad. The rear connection wiring is electrically connected to a circuit board through a conductive adhesive member.

The support substrate includes glass.

The display devices are arranged in a matrix of M rows and N columns.

A backplane substrate according to an embodiment is provided in a display device including subpixels and includes a support substrate, a circuit layer on a first surface of the support substrate, an electrode layer and a bank layer on the circuit layer, and a valley spaced apart from edges of the support substrate and penetrating at least the bank layer.

The display device may include pixels, each including two or more adjacent subpixels, and the pixels may include first pixels closest to the edges of the support substrate and second pixels adjacent to the first pixels.

The valley may be located at a boundary between emission areas of the first pixels and emission areas of the second pixels.

The bank layer may include a bank planarization layer around the emission area of each of the subpixels and a bank insulating layer covering the bank planarization layer.

The valley may penetrate at least the bank planarization layer.

Because the valley is included as described above, in the process of placing a first protective layer for protecting the electrode layer using an inkjet method when the backplane substrate is transferred, a liquid material of the first protective layer may be spread in an area surrounded by the valley, and a residue exceeding a threshold amount corresponding to the area surrounded by the valley may be accommodated in the valley. Accordingly, anode pads and cathode pads in the area surrounded by the valley may be completely covered with the first protective layer, but anode pads and/or cathode pads in the emission areas of the first pixels between the valley and the edges of the substrate may be prevented from being partially covered with the first protective layer. That is, it is possible to prevent edges of the first protective layer from overlapping the anode pads and/or the cathode pads.

Therefore, in the process of removing the first protective layer, it is possible to prevent, in advance, a defect in which portions of the edges of the first protective layer remain on the anode pads and/or the cathode pads. Accordingly, a mounting defect of light emitting elements due to a residue of the first protective layer can be prevented.

Therefore, a manufacturing defect rate of the display device and a manufacturing defect rate of a tiled display device including the display device can be reduced.

However, the effects, aspects, and features of embodiments of the present disclosure are not limited to the aforementioned effects, aspects, and features, and various other effects, aspects, and features are included in the present disclosure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
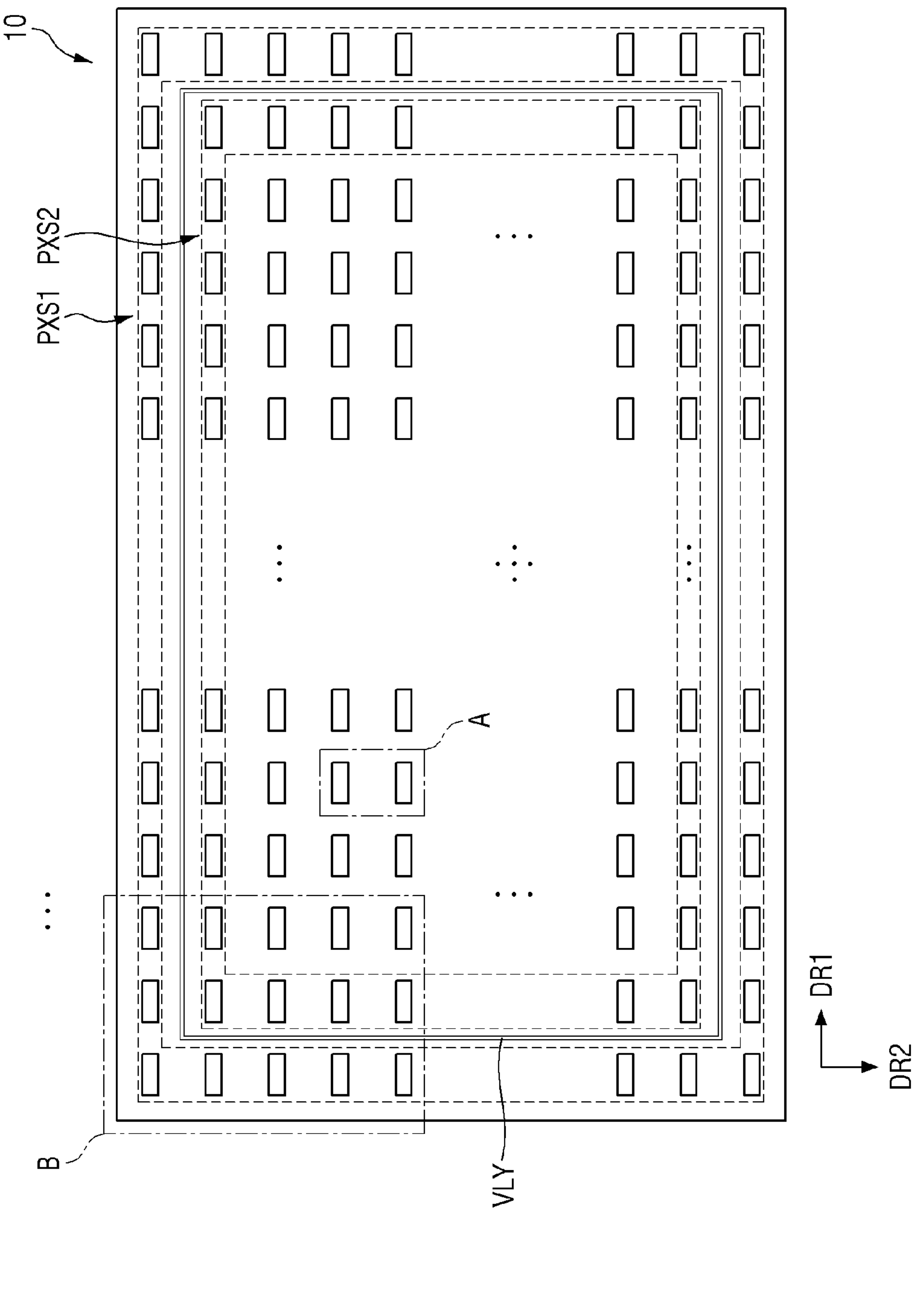
FIG. 1 is a plan view of a display device according to one or more embodiments.
Figure 2:
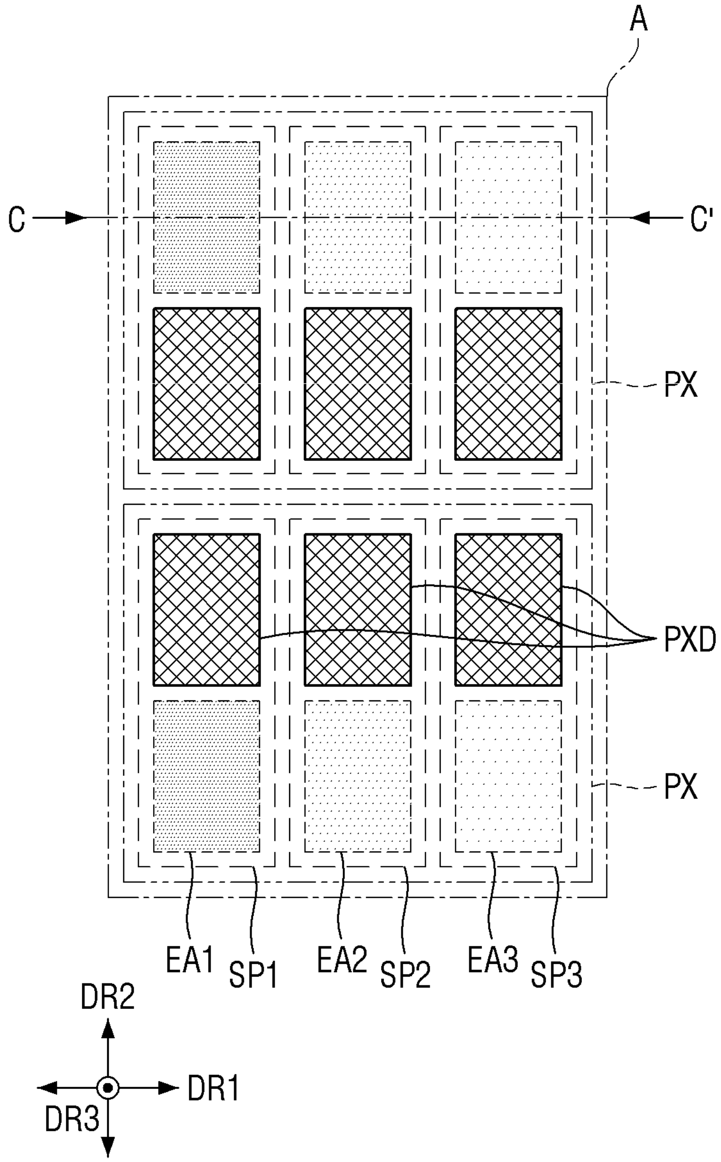
FIG. 2 is a detailed layout view of a portion A of FIG. 1.
Figure 3:
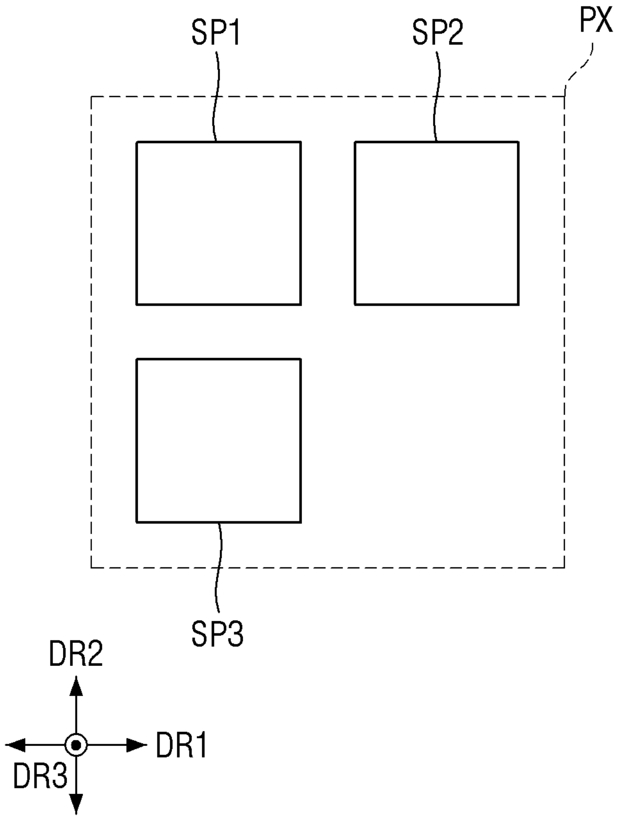
FIG. 3 is a layout view of an example of a pixel of FIG. 1.

FIG. 1 is a plan view of a display device 10 according to one or more embodiments. FIG. 2 is a detailed layout view of a portion A of FIG. 1. FIG. 3 is a layout view of an example of a pixel PX of FIG. 1.

Referring to FIG. 1, the display device 10 according to one or more embodiments is a device for displaying moving images or still images. The display device 10 may be used as a display screen in portable electronic devices such as mobile phones, smartphones, tablet personal computers (PCs), smart watches, watch phones, mobile communication terminals, electronic notebooks, electronic books, portable multimedia players (PMPs), navigation devices and ultra-mobile PCs (UMPCs), as well as in various products such as televisions, notebook computers, monitors, billboards and Internet of things (IoT) devices.

The display device 10 may be in the form of a flat plate. For example, the display device 10 may be shaped like a rectangular plane having long sides in a first direction DR1 and short sides in a second direction DR2 intersecting the first direction DR1. Each corner where a long side extending in the first direction DR1 meets a short side extending in the second direction DR2 may be rounded with a suitable curvature (e.g., a predetermined curvature) or may be right-angled. The planar shape of the display device 10 is not limited to a quadrilateral shape, but may also be another polygonal shape, a circular shape, or an oval shape. The display device 10 may be formed to be flat, but the present disclosure is not limited thereto. For example, the display device 10 may also include curved portions formed at left and right ends thereof and having a constant curvature or a varying curvature.

In addition, the display device 10 may be formed to be flexible so that it can be curved, bent, folded, or rolled.

The display device 10 includes pixels PX emitting light with their respective colors and luminances to display an image. The pixels PX may be arranged parallel to each other along the first direction DR1 and the second direction DR2 in a matrix.

The pixels PX may include first pixels PXS1 closest to the edges of the display device 10, that is, the edges of a support substrate 110 (see FIG. 4) and second pixels PXS2 adjacent to the first pixels PXS1.

That is, the first pixels PXS1 may be outermost pixels from among the pixels PX and may be arranged along the edges of the support substrate 110.

The second pixels PXS2 may be surrounded by the first pixels PXS1. That is, the first pixels PXS1 may be disposed between the edges of the support substrate 110 and the second pixels PXS2.

The display device 10 according to one or more embodiments includes a valley VLY disposed at a boundary between the first pixels PXS1 and the second pixels PXS2 and shaped similarly to the edges of the display device 10. The valley VLY is designed to limit the placement range of a first protective layer PTL1 (see FIG. 31) that temporarily covers a surface of a backplane substrate 101 (see FIGS. 4, 35) in order to prevent a damage when the backplane substrate 101 is transferred. This will be described in detail below.

Referring to FIG. 2, each of the pixels PX may include two or more subpixels SP1 through SP3 adjacent to each other and may display various colors by mixing colors of light emitted from the two or more subpixels SP1 through SP3.

In other words, the display device 10 may include the subpixels SP1 through SP3, and each of the pixels PX may be formed by two or more adjacent subpixels from among the subpixels SP1 through SP3.

Figure 4:
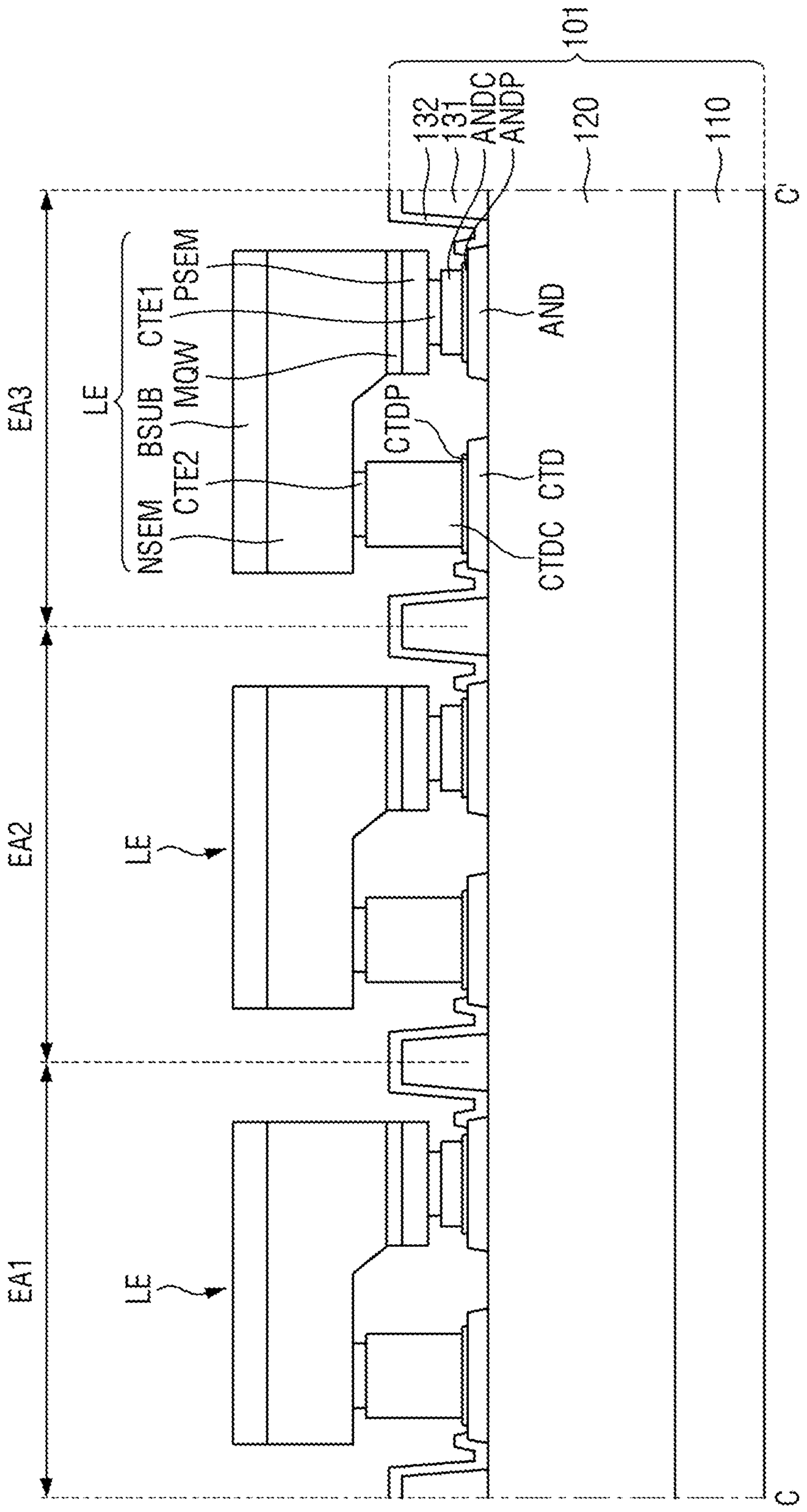
FIG. 4 is a cross-sectional view of a plane cut along the line C-C' of FIG. 2.

Each of the subpixels SP1 through SP3 may include an emission area EA1, EA2, or EA3 in which a light emitting element LE of FIG. 4 is mounted and a pixel driver PXD that supplies a driving current to the light emitting element LE.

That is, the pixel driver PXD may be disposed in a non-emission area between the emission areas EA1 through EA3.

The emission areas EA1 through EA3 corresponding to the subpixels SP1 through SP3, respectively, may have a rectangular, square, or rhombic planar shape. For example, each of the emission areas EA1 through EA3 may have a rectangular planar shape having short sides in the first direction DR1 and long sides in the second direction DR2.

Alternatively, each of the emission areas EA1 through EA3 may have a square planar shape including sides having the same length in the first direction DR1 and the second direction DR2 or may have a rhombic planar shape including sides having the same length in diagonal directions intersecting each other.

Each of the subpixels SP1 through SP3 may emit light in a wavelength region corresponding to any one of different colors.

The subpixels SP1 through SP3 may include a first subpixel SP1 corresponding to a first color due to a desired wavelength band (e.g., a predetermined wavelength band), a second subpixel SP2 corresponding to a second color due to a wavelength band lower than that of the first color, and a third subpixel SP3 corresponding to a third color due to a wavelength band lower than that of the second color. Here, the first color may be red having a wavelength band of about 600 to 750 nm, the second color may be green having a wavelength band of about 480 to 560 nm, and the third color may be blue having a wavelength band of about 370 to 460 nm. However, this is only an example, and the color of each of the first through third subpixels SP1 through SP3 according to one or more embodiments of the present specification is not limited thereto.

Each of the pixels PX may include the first subpixel SP1, the second subpixel SP2, and the third subpixel SP3 arranged parallel to each other along the first direction DR1.

Alternatively, referring to FIG. 3, the first subpixel SP1 and the second subpixel SP2 may be alternately disposed along the first direction DR1, and the third subpixel SP3 may be alternately disposed with each of the first subpixel SP1 and the second subpixel SP2 along the second direction DR2.

In this case, each of the pixels PX may include any one first subpixel SP1 and any one second subpixel SP2 neighboring each other in the first direction DR1 and at least one third subpixel SP3 neighboring at least one of the first subpixel SP1 and the second subpixel SP2 in the second direction DR2.

FIGS. 2 and 3 illustrate a case where the subpixels SP1 through SP3 of the display device 10 include the first subpixel SP1, the second subpixel SP2, and the third subpixel SP3, and each of the pixels PX includes the first subpixel SP1, the second subpixel SP2, and the third subpixel SP3 adjacent to each other. However, this is only an example, and one or more embodiments are not limited to the illustration in FIGS. 2 and 3. For example, the display device 10 may also include subpixels SP1 through SP3, each displaying one of four or more different colors.

In addition, FIGS. 2 and 3 illustrate a case where the first subpixel SP1, the second subpixel SP2, and the third subpixel SP3 have the same area. However, this is only an example, and an embodiment is not limited to the illustration in FIGS. 2 and 3. That is, at least one of the area of the first subpixel SP1, the area of the second subpixel SP2, and the area of the third subpixel SP3 may not be the same as the other one.

FIG. 4 is a cross-sectional view of a plane cut along the line C-C' of FIG. 2.

Referring to FIG. 4, the display device 10 according to one or more embodiments includes the backplane substrate 101 and the light emitting elements LE. The backplane substrate 101 includes the pixel drivers PXD corresponding to the subpixels SP1 through SP3, respectively, and an anode AND and a cathode CTD corresponding to the emission area EA1, EA2, or EA3 of each of the subpixels SP1 through SP3. The light emitting elements LE correspond to the emission areas EA1 through EA3 of the subpixels SP1 through SP3, respectively, and are each mounted on the anode AND and the cathode CTD.

The emission areas EA1 through EA3 corresponding to the subpixels SP1 through SP3, respectively, may include a first emission area EA1 corresponding to the first color having a desired wavelength band (e.g., a predetermined wavelength band), a second emission area EA2 corresponding to the second color having a wavelength band lower than that of the first color, and a third emission area EA3 corresponding to the third color having a wavelength band lower than that of the second color. For example, the first color, the second color, and the third color may be red, green, and blue.

The light emitting elements LE may be flip chip-type micro-light emitting diodes.

That is, each of the light emitting elements LE may include a base substrate BSUB, an n-type semiconductor NSEM, an active layer MQW, a p-type semiconductor PSEM, a first contact electrode CTE1, and a second contact electrode CTE2.

The base substrate BSUB may be a sapphire substrate, but one or more embodiments are not limited thereto.

The n-type semiconductor NSEM may be disposed on a surface of the base substrate BSUB. For example, the n-type semiconductor NSEM may be disposed on a lower surface of the base substrate BSUB.

The n-type semiconductor NSEM may be made of GaN doped with an n conductivity type dopant such as Si, Ge, or Sn.

The active layer MQW may be disposed on a portion of the n-type semiconductor NSEM.

The active layer MQW may include a material having a single or multiple quantum well structure. When the active layer MQW includes a material having a multiple quantum well structure, it may have a structure in which a plurality of well layers and a plurality of barrier layers are alternately stacked. Here, the well layers may be made of InGaN, and the barrier layers may be made of GaN or AlGaN, but the present disclosure is not limited thereto.

Alternatively, the active layer MQW may have a structure in which a semiconductor material having a large band gap energy and a semiconductor material having a small band gap energy are alternately stacked or may include different Group III to V semiconductor materials depending on the wavelength band of light that it emits.

The p-type semiconductor PSEM may be disposed on the active layer MQW. The p-type semiconductor PSEM may be made of GaN doped with a p conductivity type dopant such as Mg, Zn, Ca, Se, or Ba.

The first contact electrode CTE1 may be disposed on the p-type semiconductor PSEM.

The second contact electrode CTE2 may be disposed on a portion of the n-type semiconductor NSEM other than the portion on which the active layer MQW is disposed. The portion of the n-type semiconductor NSEM on which the second contact electrode CTE2 is disposed may be spaced from the portion of the surface of the n-type semiconductor NSEM on which the active layer MQW is disposed.

The first contact electrode CTE1 may be electrically connected and bonded to the anode AND through an anode contact electrode ANDC.

The second contact electrode CTE2 may be electrically connected and bonded to the cathode CTD through a cathode contact electrode CTDC.

The backplane substrate 101 includes the support substrate 110, a circuit layer 120 disposed on a first surface of the support substrate 110 and including the pixel drivers PXD corresponding to the subpixels SP1 through SP3, respectively, an electrode layer disposed on the circuit layer 120 and including the anode AND and the cathode CTD corresponding to the emission area EA1, EA2, or EA3 of each of the subpixels SP1 through SP3, and a bank layer 131 and a bank insulating layer 132 disposed on the circuit layer 120 and corresponding to an area around the emission area EA1, EA2, or EA3 of each of the subpixels SP1 through SP3.

The support substrate 110 may be a rigid substrate made of glass.

Alternatively, the support substrate 110 may be a flexible substrate made of a plastic material that can be bent, folded, or rolled. In this case, the support substrate 110 may include an insulating material, for example, polymer resin such as polyimide (PI).

The electrode layer AND and CTD may be a single layer or a multilayer made of one or more of molybdenum (Mo), aluminum (Al), chromium (Cr), gold (Au), titanium (Ti), nickel (Ni), neodymium (Ne), copper (Cu), and/or alloys thereof. For example, the electrode layer AND and CTD may be a multilayer (Ti/Al or Mo/Ti) in which a first metal layer of titanium (Ti), a second metal layer of aluminum (Al) or molybdenum (Mo), and a third metal layer of titanium (Ti) are sequentially stacked. In other words, the electrode layer AND and/or CTD may be a multilayer of Ti/Al/Ti or Ti/Mo/Ti.

The bank layer 131 and the bank insulating layer 132 may include a bank planarization layer 131 disposed on the circuit layer 120 and the bank insulating layer 132 covering the bank planarization layer 131.

The bank planarization layer 131 may be disposed in a non-emission area NEA, which is an area between the emission areas EA1 through EA3, and may be spaced from the anode AND and the cathode CTD.

The bank planarization layer 131 may be made of an organic insulating material selected as at least one of acryl resin, epoxy resin, phenolic resin, polyamide resin, and polyimide resin.

The bank insulating layer 132 covers the bank planarization layer 131.

In addition, the bank insulating layer 132 extends to edges of each of the emission areas EA1 through EA3. Accordingly, the bank insulating layer 132 may cover a portion of edges of the anode AND and a portion of edges of the cathode CTD that correspond to the edges of each of the emission areas EA1 through EA3. In other words, the bank insulating layer 132 may not be disposed on a boundary area between the anode AND and the cathode CTD.

That is, the bank insulating layer 132 may cover the edges of the anode AND and the edges of the cathode CTD, except for their edges facing each other.

The bank insulating layer 132 may be made of an inorganic insulating material including at least one of silicon nitride, silicon oxynitride, silicon oxide, titanium oxide, and/or aluminum oxide.

As described above, the edges of the anode AND and the edges of the cathode CTD do not contact the bank planarization layer 131 made of an organic insulating material, but are covered with the bank insulating layer 132 made of an inorganic insulating material. Accordingly, damage to surfaces of the anode AND and the cathode CTD due to impurities such as moisture or ions may be reduced.

Figure 5:
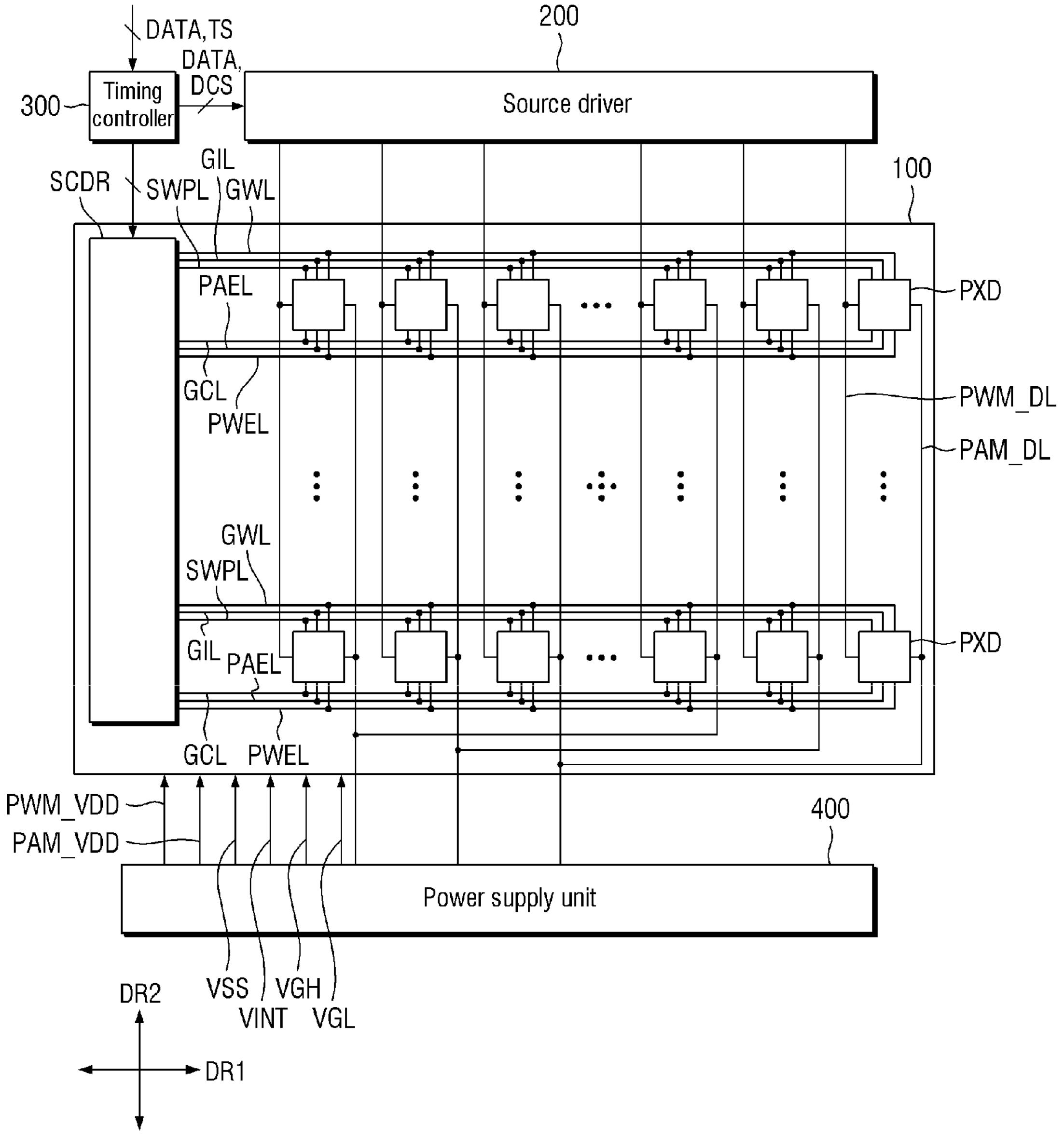
FIG. 5 is a block diagram of the display device according to one or more embodiments.

FIG. 5 is a block diagram of the display device 10 according to one or more embodiments.

Referring to FIG. 5, the display device 10 according to one or more embodiments may include a display panel 100, a scan driver SCDR, a source driver 200, a timing controller 300, and a power supply unit 400.

The display panel 100 includes the backplane substrate 101, and the backplane substrate 101 includes the pixel drivers PXD corresponding to the subpixels SP1 through SP3, respectively.

In addition, the backplane substrate 101 may further include wirings for transmitting signals or voltages received from the scan driver SCDR, the source driver 200, the timing controller 300, and the power supply unit 400 to the pixel drivers PXD.

The timing controller 300 receives digital video data DATA and timing signals TS. The timing controller 300 may generate a scan timing control signal for controlling the operation timing of the scan driver SCDR according to the timing signals TS. The scan timing control signal may include a first scan driving control signal, a second scan driving control signal, a first emission control signal, a second emission control signal, and a sweep control signal.

The timing controller 300 may further generate a source control signal DCS for controlling the operation timing of the source driver 200. The timing controller 300 may output the digital video data DATA and the source control signal DCS to the source driver 200.

Wirings electrically connected to the scan driver SCDR may extend in the first direction DR1 and may include scan write wirings GWL, scan initialization wirings GIL, scan control wirings GCL, sweep signal wirings SWPL, pulse width modulation (PWM) emission wirings PWEL, and pulse amplitude modulation (PAM) emission wirings PAEL.

Although the scan driver SCDR is disposed adjacent to an edge of the display panel 100 in the first direction DR1 in FIG. 5, this is only an example used for concise illustration. That is, the scan driver SCDR according to one or more embodiments may also be divided into a plurality of drivers disposed between the pixel drivers PXD.

The scan driver SCDR may output scan initialization signals to the scan initialization wirings GIL and output scan write signals to the scan write wirings GWL according to the first scan driving control signal received from the timing controller 300.

The scan driver SCDR may output scan control signals to the scan control wirings GCL according to the second scan driving control signal received from the timing controller 300.

The scan driver SCDR may output PWM emission signals to the PWM emission wirings PWEL according to the first emission control signal received from the timing controller 300.

The scan driver SCDR may output sweep signals to the sweep signal wirings SWPL according to the sweep control signal received from the timing controller 300.

The scan driver SCDR may output PAM emission signals to the PAM emission wirings PAEL according to the second emission control signal received from the timing controller 300.

Wirings extending in the second direction DR2 may include PWM data wirings PWM_DL and PAM data wirings PAM_DL.

The PWM data wirings PWM_DL may be electrically connected to the source driver 200.

The source driver 200 may convert the digital video data into analog PWM data voltages and output the analog PWM data voltages to the PWM data wirings PWM_DL.

The PAM data wirings PAM_DL may be electrically connected to the power supply unit 400.

The PAM data wirings PAM_DL may include first PAM data wirings connected to pixel drivers PXD of first subpixels SP1, second PAM data wirings connected to pixel drivers PXD of second subpixels SP2, and third PAM data wirings connected to pixel drivers PXD of third subpixels SP3.

The power supply unit 400 may output a first PAM data voltage to the first PAM data wirings, output a second PAM data voltage to the second PAM data wirings, and output a third PAM data voltage to the third PAM data wirings.

The power supply unit 400 may supply various voltages such as a first power voltage PWM_VDD, a second power voltage PAM_VDD, a third power voltage VSS, an initialization voltage VINT, and gate level voltages VGL and VGH to the display panel 100.

The first power voltage PWM_VDD may be a high potential driving voltage for generating a driving current of each of the light emitting elements LE.

The second power voltage PAM_VDD may be a high potential driving voltage for turning on a transistor that switches a period in which the driving current is supplied to each of the light emitting elements LE.

The third power voltage VSS may be a low potential driving voltage lower than the first power voltage PWM_VDD and the second power voltage PAM_VDD.

The initialization voltage VINT may be a voltage for initializing outputs of the pixel drivers PXD of the subpixels SP1 through SP3.

The gate level voltages VGL and VGH may be voltages for controlling driving of transistors and may be supplied to the scan driver SCDR or the pixel drivers PXD. For example, when a transistor is a P-type metal oxide semiconductor field effect transistor (MOSFET), a turn-on state of the transistor may correspond to a gate low-level voltage VGL, and a turn-off state of the transistor may correspond to a gate high-level voltage VGH. However, this is only an example, and driving of transistors corresponding to the gate level voltages VGL and VGH is not limited thereto.

Each of the source driver 200, the timing controller 300, and the power supply unit 400 may be provided as an integrated circuit.

These integrated circuits may be mounted on a flexible film disposed under a second surface of the support substrate 110.

Figure 6:
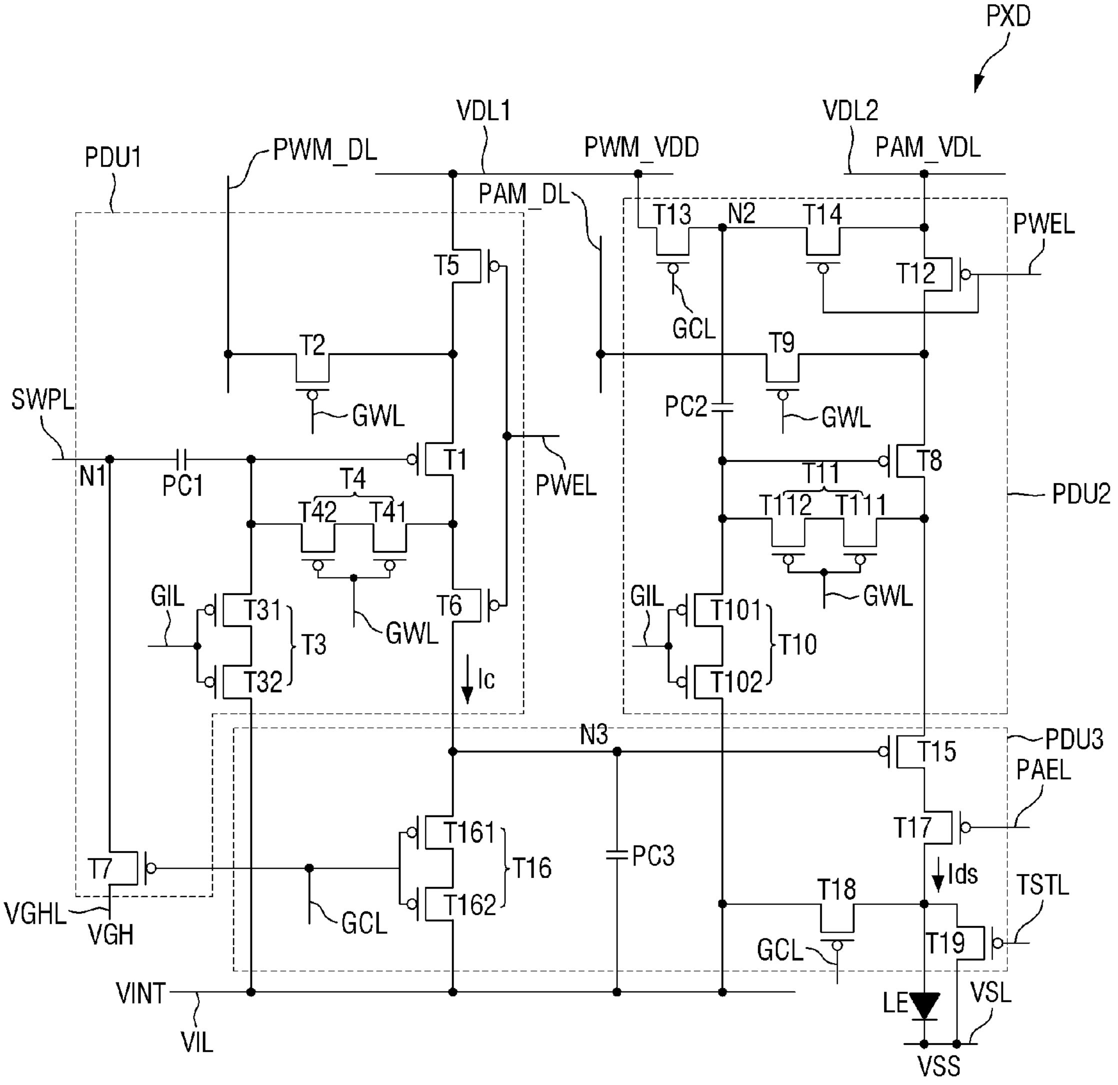
FIG. 6 is an equivalent circuit diagram of a pixel driver of FIG. 5.

FIG. 6 is an equivalent circuit diagram of a pixel driver PXD of FIG. 5.

Referring to FIG. 6, the pixel driver PXD may be electrically connected to a first power wiring VDL1 to which the first power voltage PWM_VDD is applied, a second power wiring VDL2 to which the second power voltage PAM_VDD is applied, a third power wiring VSL to which the third power voltage VSS is applied, an initialization voltage wiring VIL to which the initialization voltage VINT is applied, and a gate voltage wring VGHL to which the gate high-level voltage VGH corresponding to the turn-off state of a transistor is applied.

A light emitting element LE may be electrically connected between the pixel driver PXD and the third power wiring VSL and may emit light based on a driving current Ids supplied from the pixel driver PXD.

A first electrode of the light emitting element LE may be an anode (i.e., a pixel electrode) corresponding to the first contact electrode CTE1 (see FIG. 4) on the p-type semiconductor PSEM (see FIG. 4).

A second electrode of the light emitting element LE may be a cathode (i.e., a common electrode) corresponding to the second contact electrode CTE2 (see FIG. 4) on the n-type semiconductor NSEM (see FIG. 4).

The light emitting element LE may be an inorganic light emitting element including a first electrode, a second electrode, and an inorganic semiconductor disposed between the first electrode and the second electrode. For example, the light emitting element LE may be, but is not limited to, a micro-light emitting diode including an inorganic semiconductor.

The pixel driver PXD may include a first pixel driving circuit unit PDU1, a second pixel driving circuit unit PDU2, and a third pixel driving circuit unit PDU3.

The first pixel driving circuit unit PDU1 generates a control current Ic according to a PWM data voltage of a PWM data wiring PWM_DL and supplies the PWM data voltage to a third node N3 between the first pixel driving circuit unit PDU1 and the third pixel driving circuit unit PDU3.

A pulse width of the driving current Ids flowing through the light emitting element LE may be adjusted by the control current Ic of the first pixel driving circuit unit PDU1. Accordingly, the first pixel driving circuit unit PDU1 may be a PWM unit that performs pulse width modulation of the driving current Ids flowing through the light emitting element LE.

The first pixel driving circuit unit PDU1 may include first through seventh transistors T1 through T7 and a first capacitor PC1.

The first transistor T1 generates the control current Ic according to the PWM data voltage applied to a gate electrode.

The second transistor T2 may be electrically connected between the PWM data wiring PWM_DL and the gate electrode of the first transistor T1, and a gate electrode of the second transistor T2 may be electrically connected to a scan write wiring GWL. The second transistor T2 is turned on by a scan write signal of the scan write wiring GWL to supply the PWM data voltage of the PWM data wiring PWM_DL to a first electrode of the first transistor T1.

The third transistor T3 may be electrically connected between the initialization voltage wiring VIL and the gate electrode of the first transistor T1, and a gate electrode of the third transistor T3 may be electrically connected to a scan initialization wiring GIL. The third transistor T3 is turned on by a scan initialization signal of the scan initialization wiring GIL to electrically connect the initialization voltage wiring VIL to the gate electrode of the first transistor T1. Accordingly, during a period in which the third transistor T3 is turned on, the gate electrode of the first transistor T1 may be initialized to the initialization voltage VINT of the initialization voltage wiring VIL.

Here, the gate high-level voltage VGH of the gate voltage wiring VGHL may be different from the initialization voltage VINT of the initialization voltage wiring VIL. That is, because a difference voltage between the gate high-level voltage VGH and the initialization voltage VINT is greater than a threshold voltage of the third transistor T3, the third transistor T3 may be stably turned on even after the initialization voltage VINT is applied to the gate electrode of the first transistor T1. Therefore, when the third transistor T3 is turned on, the initialization voltage VINT may be stably applied to the gate electrode of the first transistor T1 regardless of the threshold voltage of the third transistor T3.

The third transistor T3 may include a plurality of transistors connected in series. For example, the third transistor T3 may include a first sub-transistor T31 and a second sub-transistor T32. Therefore, it is possible to prevent the voltage of the gate electrode of the first transistor T1 from leaking through the third transistor T3. A first electrode of the first sub-transistor T31 may be electrically connected to the gate electrode of the first transistor T1, and a second electrode of the first sub-transistor T31 may be electrically connected to a first electrode of the second sub-transistor T32. A second electrode of the second sub-transistor T32 may be electrically connected to the initialization voltage wiring VIL.

The fourth transistor T4 may be electrically connected between the gate electrode of the first transistor T1 and a second electrode of the first transistor T1, and a gate electrode of the fourth transistor T4 may be electrically connected to the scan write wiring GWL. The fourth transistor T4 is turned on by the scan write signal of the scan write wiring GWL to electrically connect the gate electrode of the first transistor T1 and the second electrode of the first transistor T1. Accordingly, during a period in which the fourth transistor T4 is turned on, the first transistor T1 may operate as a diode (e.g., the first transistor T1 may be diode-connected).

The fourth transistor T4 may include a plurality of transistors connected in series. For example, the fourth transistor T4 may include a third sub-transistor T41 and a fourth sub-transistor T42. Therefore, it is possible to prevent the voltage of the gate electrode of the first transistor T1 from leaking through the fourth transistor T4. A first electrode of the third sub-transistor T41 may be electrically connected to the second electrode of the first transistor T1, and a second electrode of the third sub-transistor T41 may be electrically connected to a first electrode of the fourth sub-transistor T42. A second electrode of the fourth sub-transistor T42 may be electrically connected to the gate electrode of the first transistor T1.

The fifth transistor T5 may be electrically connected between the first power wiring VDL1 and the first electrode of the first transistor T1, and a gate electrode of the fifth transistor T5 may be electrically connected to a PWM emission wiring PWEL.

The sixth transistor T6 may be electrically connected between the second electrode of the first transistor T1 and the third node N3, and a gate electrode of the sixth transistor T6 may be electrically connected to the PWM emission wiring PWEL.

The fifth transistor T5 and the sixth transistor T6 are turned on by a PWM emission signal of the PWM emission wiring PWEL to electrically connect the first power wiring VDL1 and the first transistor T1 and electrically connect the first transistor T1 and the third node N3. Accordingly, the control current Ic generated by the first transistor T1 is supplied to the third node N3.

The seventh transistor T7 may be electrically connected between the gate voltage wiring VGHL and a first node N1, and a gate electrode of the seventh transistor T7 may be electrically connected to a scan control wiring GCL. The first node N1 is a contact point between a sweep signal wiring SWPL and the first capacitor PC1. The seventh transistor T7 may be turned on by a scan control signal of the scan control wiring GCL to supply the gate high-level voltage VGH of the gate voltage wiring VGHL to the first node N1. Accordingly, during a period in which the initialization voltage VINT is applied to the gate electrode of the first transistor T1 and a period in which the PWM data voltage of the PWM data wiring PWM_DL and a threshold voltage Vth1 of the first transistor T1 are programmed, it is possible to prevent a voltage change of the gate electrode of the first transistor T1 from being reflected in a sweep signal of the sweep signal wiring SWPL by the first capacitor PC1.

The first capacitor PC1 may be disposed between the gate electrode of the first transistor T1 and the first node N1.

The second pixel driving circuit unit PDU2 generates the driving current Ids to be supplied to the light emitting element LE according to a PAM data voltage of a PAM data wiring PAM_DL. The second pixel driving circuit unit PDU2 may be a PAM unit that performs pulse amplitude modulation. The second pixel driving circuit unit PDU2 may be a constant current generating unit that generates a constant driving current Ids according to the PAM data voltage.

The second pixel driving circuit unit PDU2 of each of the subpixels SP1 through SP3 may receive a constant PAM data voltage regardless of the luminance of the subpixel SP1, SP2, or SP3 and may generate the same driving current Ids.

The second pixel driving circuit unit PDU2 may include eighth through fourteenth transistors T8 through T14 and a second capacitor PC2.

The eighth transistor T8 generates the driving current Ids to be supplied to the light emitting element LE.

The ninth transistor T9 may be electrically connected between the PAM data wiring PAM_DL and a first electrode of the eighth transistor T8, and a gate electrode of the ninth transistor T9 may be electrically connected to the scan write wiring GWL. The ninth transistor T9 is turned on by the scan write signal of the scan write wiring GWL to apply the PAM data voltage of the PAM data wiring PAM_DL to the first electrode of the eighth transistor T8.

The tenth transistor T10 may be electrically connected between the initialization voltage wiring VIL and a gate electrode of the eighth transistor T8, and a gate electrode of the tenth transistor T10 may be electrically connected to the scan initialization wiring GIL. The tenth transistor T10 is turned on by the scan initialization signal of the scan initialization wiring GIL to electrically connect the initialization voltage wiring VIL to the gate electrode of the eighth transistor T8. Accordingly, during a period in which the tenth transistor T10 is turned on, the gate electrode of the eighth transistor T8 may be initialized to the initialization voltage VINT of the initialization voltage wiring VIL. Here, the gate high-level voltage VGH of the scan initialization signal may be different from the initialization voltage VINT of the initialization voltage wiring VIL. In particular, because a difference voltage between the gate high-level voltage VGH and the initialization voltage VINT is greater than a threshold voltage of the tenth transistor T10, the tenth transistor T10 may be stably turned on even after the initialization voltage VINT is applied to the gate electrode of the eighth transistor T8. Therefore, when the tenth transistor T10 is turned on, the initialization voltage VINT may be stably applied to the gate electrode of the eighth transistor T8 regardless of the threshold voltage of the tenth transistor T10.

The tenth transistor T10 may include a plurality of transistors connected in series. For example, the tenth transistor T10 may include a fifth sub-transistor T101 and a sixth sub-transistor T102. Therefore, it is possible to prevent the voltage of the gate electrode of the eighth transistor T8 from leaking through the tenth transistor T10. A first electrode of the fifth sub-transistor T101 may be electrically connected to the gate electrode of the eighth transistor T8, and a second electrode of the fifth sub-transistor T101 may be electrically connected to a first electrode of the sixth sub-transistor T102. A second electrode of the sixth sub-transistor T102 may be electrically connected to the initialization voltage wiring VIL.

The eleventh transistor T11 may be electrically connected between the gate electrode of the eighth transistor T8 and a second electrode of the eighth transistor T8, and a gate electrode of the eleventh transistor T11 may be electrically connected to the scan write wiring GWL. The eleventh transistor T11 is turned on by the scan write signal of the scan write wiring GWL to electrically connect the gate electrode of the eighth transistor T8 and the second electrode of the eighth transistor T8. Accordingly, during a period in which the eleventh transistor T11 is turned on, the eighth transistor T8 may operate as a diode (e.g., the eighth transistor T8 may be diode-connected).

The eleventh transistor T11 may include a plurality of transistors connected in series. For example, the eleventh transistor T11 may include a seventh sub-transistor T111 and an eighth sub-transistor T112. Therefore, it is possible to prevent the voltage of the gate electrode of the eighth transistor T8 from leaking through the eleventh transistor T11. A first electrode of the seventh sub-transistor T111 may be electrically connected to the second electrode of the eighth transistor T8, and a second electrode of the seventh sub-transistor T111 may be electrically connected to a first electrode of the eighth sub-transistor T112. A second electrode of the eighth sub-transistor T112 may be electrically connected to the gate electrode of the eighth transistor T8.

The twelfth transistor T12 may be electrically connected between the second power wiring VDL2 and the first electrode of the eighth transistor T8, and a gate electrode of the twelfth transistor T12 may be electrically connected to the PWM emission wiring PWEL. The twelfth transistor T12 is turned on by the PWM emission signal of the PWM emission wiring PWEL to electrically connect the first electrode of the eighth transistor T8 to the second power wiring VDL2.

The thirteenth transistor T13 may be electrically connected between the first power wiring VDL1 and a second node N2, and a gate electrode of the thirteenth transistor T13 may be electrically connected to the scan control wiring GCL. The thirteenth transistor T13 is turned on by the scan control signal of the scan control wiring GCL to electrically connect the first power wiring VDL1 to the second node N2.

The fourteenth transistor T14 may be electrically connected between the second power wiring VDL2 and the second node N2, and a gate electrode of the fourteenth transistor T14 may be electrically connected to the PWM emission wiring PWEL. The fourteenth transistor T14 is turned on by the PWM emission signal of the PWM emission wiring PWEL to electrically connect the second power wiring VDL2 to the second node N2. Therefore, when the fourteenth transistor T14 is turned on, the second power voltage PAM_VDD of the second power wiring VDL2 may be applied to the second node N2.

The second node N2 is a contact point to which a second electrode of the thirteenth transistor T13, a second electrode of the fourteenth transistor T14, and the second capacitor PC2 are connected.

The second capacitor PC2 may be electrically connected between the gate electrode of the eighth transistor T8 and the second node N2.

The third pixel driving circuit unit PDU3 adjusts a period during which the driving current Ids generated by the second pixel driving circuit unit PDU2 is supplied to the light emitting element LE according to the control current Ic that is supplied to the third node N3 and generated by the first pixel driving circuit unit PDU1.

The third pixel driving circuit unit PDU3 may include fifteenth through nineteenth transistors T15 through T19 and a third capacitor PC3.

The fifteenth transistor T15 may be electrically connected between the second electrode of the eighth transistor T8 of the second pixel driving circuit unit PDU2 and the seventeenth transistor T17, and a gate electrode of the fifteenth transistor T15 may be electrically connected to the third node N3. The fifteenth transistor T15 is turned on or turned off according to the voltage of the third node N3. When the fifteenth transistor T15 is turned on, the driving current Ids of the eighth transistor T8 may be supplied to the light emitting element LE through the seventeenth transistor T17. That is, when the fifteenth transistor T15 is turned off, the driving current Ids of the eighth transistor T8 may not be supplied to the light emitting element LE. Therefore, a turn-on period of the fifteenth transistor T15 may be substantially the same as a light emission period of the light emitting element LE.

The sixteenth transistor T16 may be electrically connected between the initialization voltage wiring VIL and the third node N3, and a gate electrode of the sixteenth transistor T16 may be electrically connected to the scan control wiring GCL. The sixteenth transistor T16 is turned on by the scan control signal of the scan control wiring GCL to electrically connect the initialization voltage wiring VIL to the third node N3. Accordingly, during a period in which the sixteenth transistor T16 is turned on, the third node N3 may be initialized to the initialization voltage VINT of the initialization voltage wiring VIL.

The sixteenth transistor T16 may include a plurality of transistors connected in series. For example, the sixteenth transistor T16 may include a ninth sub-transistor T161 and a tenth sub-transistor T162. Therefore, it is possible to prevent the voltage of the third node N3 from leaking through the sixteenth transistor T16. A first electrode of the ninth sub-transistor T161 may be electrically connected to the third node N3, and a second electrode of the ninth sub-transistor T161 may be electrically connected to a first electrode of the tenth sub-transistor T162. A second electrode of the tenth sub-transistor T162 may be electrically connected to the initialization voltage wiring VIL.

The seventeenth transistor T17 may be electrically connected between a second electrode of the fifteenth transistor T15 and the first electrode of the light emitting element LE, and a gate electrode of the seventeenth transistor T17 may be electrically connected to the PAM emission wiring PAEL. The first electrode of the light emitting element LE corresponds to the anode AND. The seventeenth transistor T17 is turned on by the PAM emission signal of the PAM emission wiring PAEL to electrically connect the second electrode of the fifteenth transistor T15 to the first electrode of the light emitting element LE.

The eighteenth transistor T18 may be electrically connected between the initialization voltage wiring VIL and the first electrode of the light emitting element LE, and a gate electrode of the eighteenth transistor T18 may be electrically connected to the scan control wiring GCL. The eighteenth transistor T18 is turned on by the scan control signal of the scan control wiring GCL to electrically connect the initialization voltage wiring VIL to the first electrode of the light emitting element LE. Accordingly, during a period in which the eighteenth transistor T18 is turned on, the first electrode of the light emitting element LE may be initialized to the initialization voltage VINT of the initialization voltage wiring VIL.

The nineteenth transistor T19 may be electrically connected between the third power wiring VSL and the first electrode of the light emitting element LE, and a gate electrode of the nineteenth transistor T19 may be electrically connected to a test signal wiring TSTL. The nineteenth transistor T19 is turned on by a test signal of the test signal wiring TSTL to electrically connect the first electrode of the light emitting element EL to the third power wiring VSL. Accordingly, during a period in which the nineteenth transistor T19 is turned on, the third power wiring VSL is electrically connected to the first electrode of the light emitting element LE.

The third capacitor PC3 may be electrically connected between the third node N3 and the initialization voltage wiring VIL.

The third node N3 may be a contact point to which a second electrode of the sixth transistor T6, the gate electrode of the fifteenth transistor T15, the first electrode of the ninth sub-transistor T161, and the third capacitor PC3 are connected.

Any one of the first and second electrodes of each of the first through nineteenth transistors T1 through T19 may be a source electrode, and the other may be a drain electrode. A channel of each of the first through nineteenth transistors T1 through T19 may be made of any one of polysilicon, amorphous silicon, and an oxide semiconductor. When the channel of each of the first through nineteenth transistors T1 through T19 is made of polysilicon, it may be formed by a low temperature polysilicon (LTPS) process.

Although a case where each of the first through nineteenth transistors T1 through T19 is formed as a P-type MOSFET has been mainly described in FIG. 6, an embodiment is not limited thereto. For example, at least one of the first through nineteenth transistors T1 through T19 may also be formed as an N-type MOSFET.

For example, in order to increase the black expressing capability of the light emitting element LE by blocking a leakage current, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed as N-type MOSFETs.

In this case, a gate electrode of the third sub-transistor T41 and a gate electrode of the fourth sub-transistor T42 of the fourth transistor T4 and a gate electrode of the seventh sub-transistor T111 and a gate electrode of the eighth sub-transistor T112 of the eleventh transistor T11 may be electrically connected to a control signal. The scan initialization signal GIL and the control signal may have pulses generated as the gate high-level voltage VGH.

In addition, channels of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be made of an oxide semiconductor, and channels of the other transistors may be made of polysilicon.

Alternatively, any one of the first sub-transistor T31 and the second sub-transistor T32 of the third transistor T3 may be formed as an N-type MOSFET and the other may be formed as a P-type MOSFET. In this case, a channel of a transistor formed as an N-type MOSFET from among the first sub-transistor T31 and the second sub-transistor T32 of the third transistor T3 may be made of an oxide semiconductor, and a channel of a transistor formed as a P-type MOSFET may be made of polysilicon.

Alternatively, any one of the third sub-transistor T41 and the fourth sub-transistor T42 of the fourth transistor T4 may be formed as an N-type MOSFET, and the other may be formed as a P-type MOSFET. In this case, a channel of a transistor formed as an N-type MOSFET from among the third sub-transistor T41 and the fourth sub-transistor T42 of the fourth transistor T4 may be made of an oxide semiconductor, and a channel of a transistor formed as a P-type MOSFET may be made of polysilicon.

Alternatively, any one of the fifth sub-transistor T101 and the sixth sub-transistor T102 of the tenth transistor T10 may be formed as an N-type MOSFET, and the other may be formed as a P-type MOSFET. In this case, a channel of a transistor formed as an N-type MOSFET from among the fifth sub-transistor T101 and the sixth sub-transistor T102 of the tenth transistor T10 may be made of an oxide semiconductor, and a channel of a transistor formed as a P-type MOSFET may be made of polysilicon.

Alternatively, any one of the seventh sub-transistor T111 and the eighth sub-transistor T112 of the eleventh transistor T11 may be formed as an N-type MOSFET, and the other may be formed as a P-type MOSFET. In this case, a channel of a transistor formed as an N-type MOSFET from among the seventh sub-transistor T111 and the eighth sub-transistor T112 of the eleventh transistor T11 may be made of an oxide semiconductor, and a channel of a transistor formed as a P-type MOSFET may be made of polysilicon.

Figure 7:
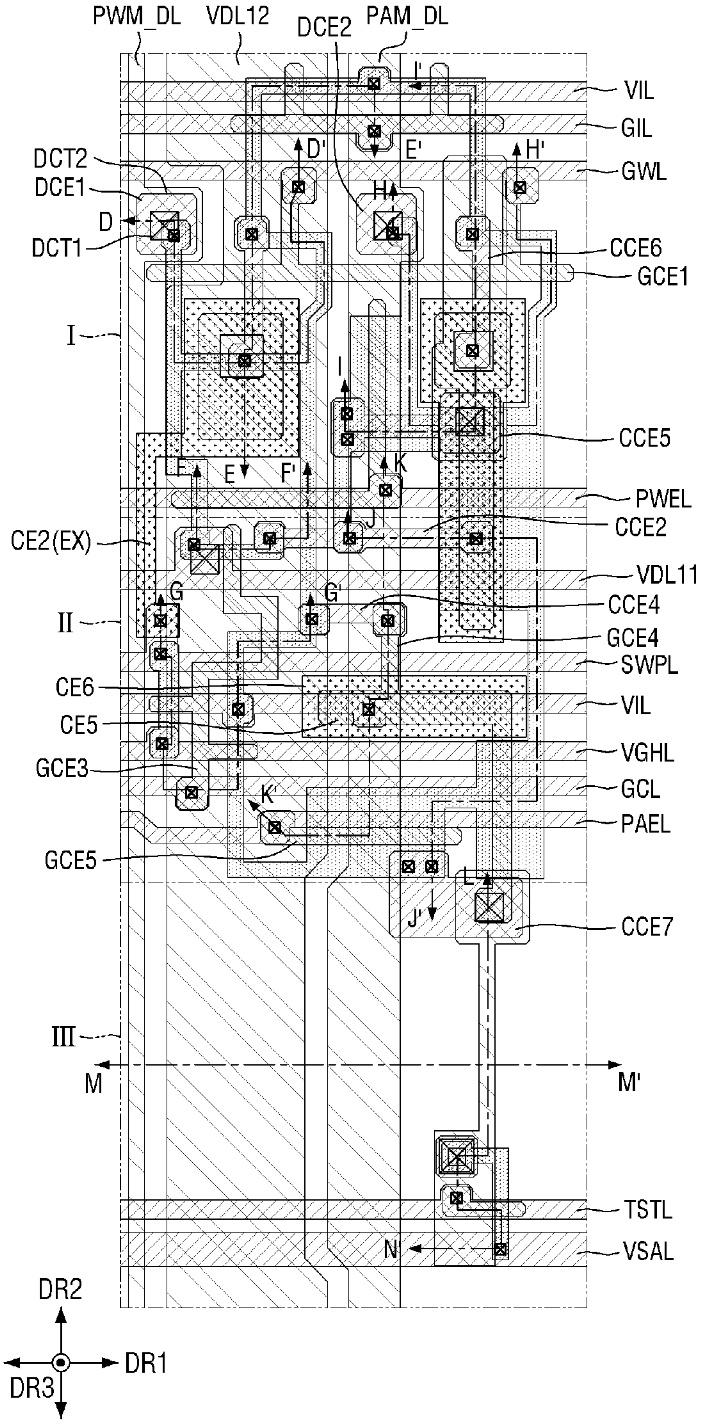
FIG. 7 is a plan view illustrating a semiconductor layer, a first conductive layer, a second conductive layer, a third conductive layer and a fourth conductive layer of a portion of a circuit layer corresponding to a subpixel.
Figure 8:
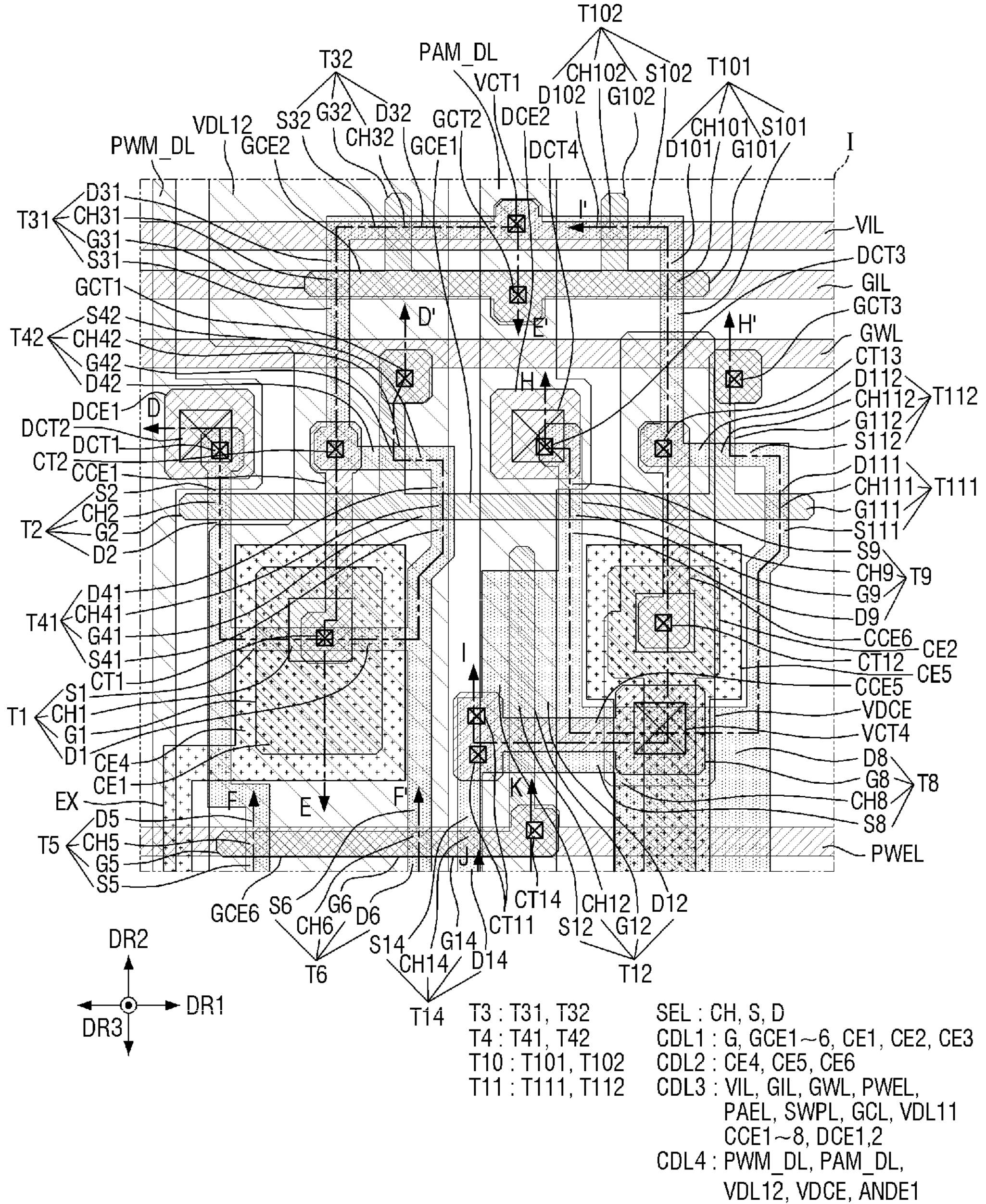
FIG. 8 is an enlarged plan view illustrating a portion I of FIG. 7 in detail.
Figure 9:
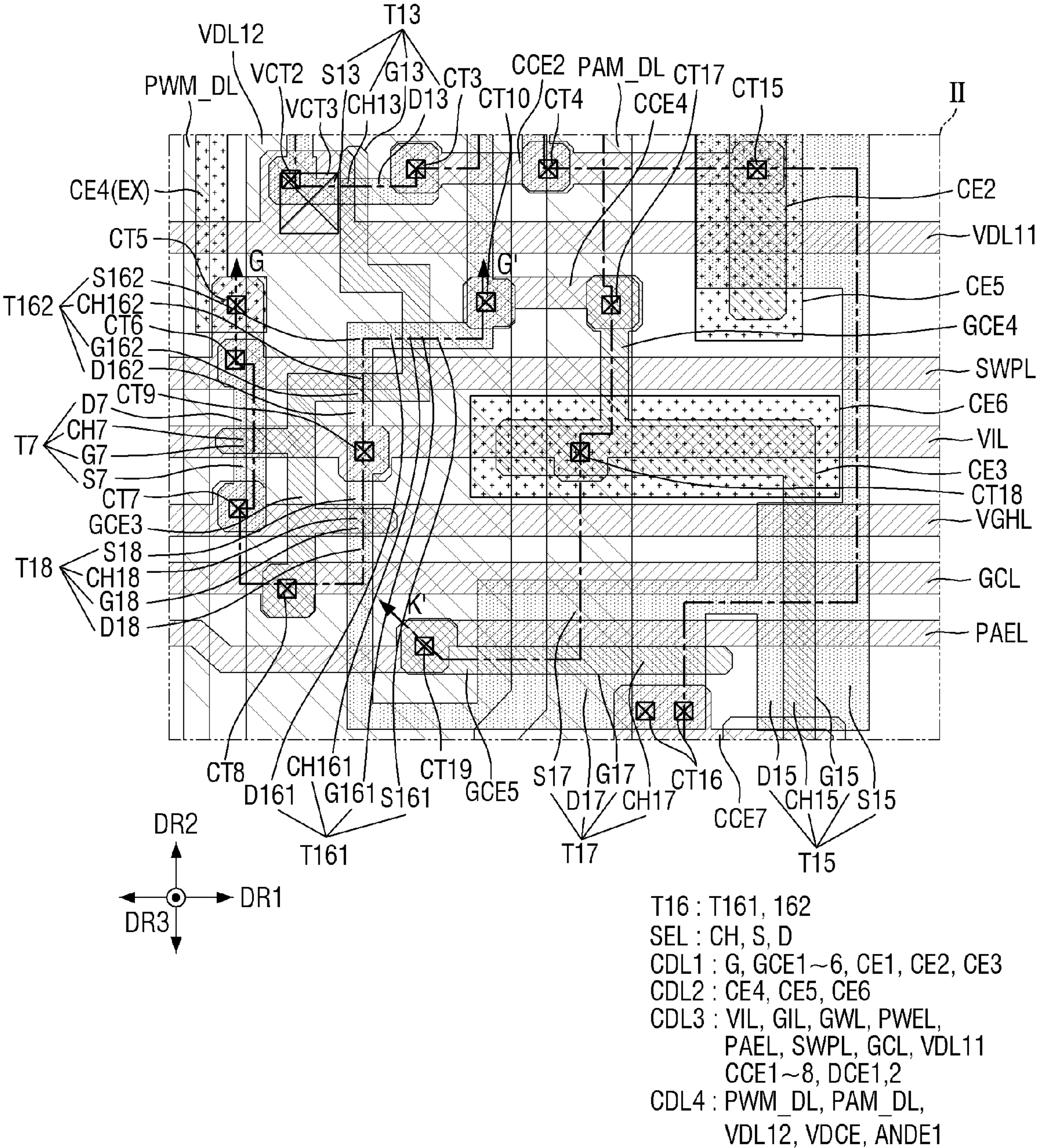
FIG. 9 is an enlarged plan view illustrating a portion II of FIG. 7 in detail.
Figure 10:
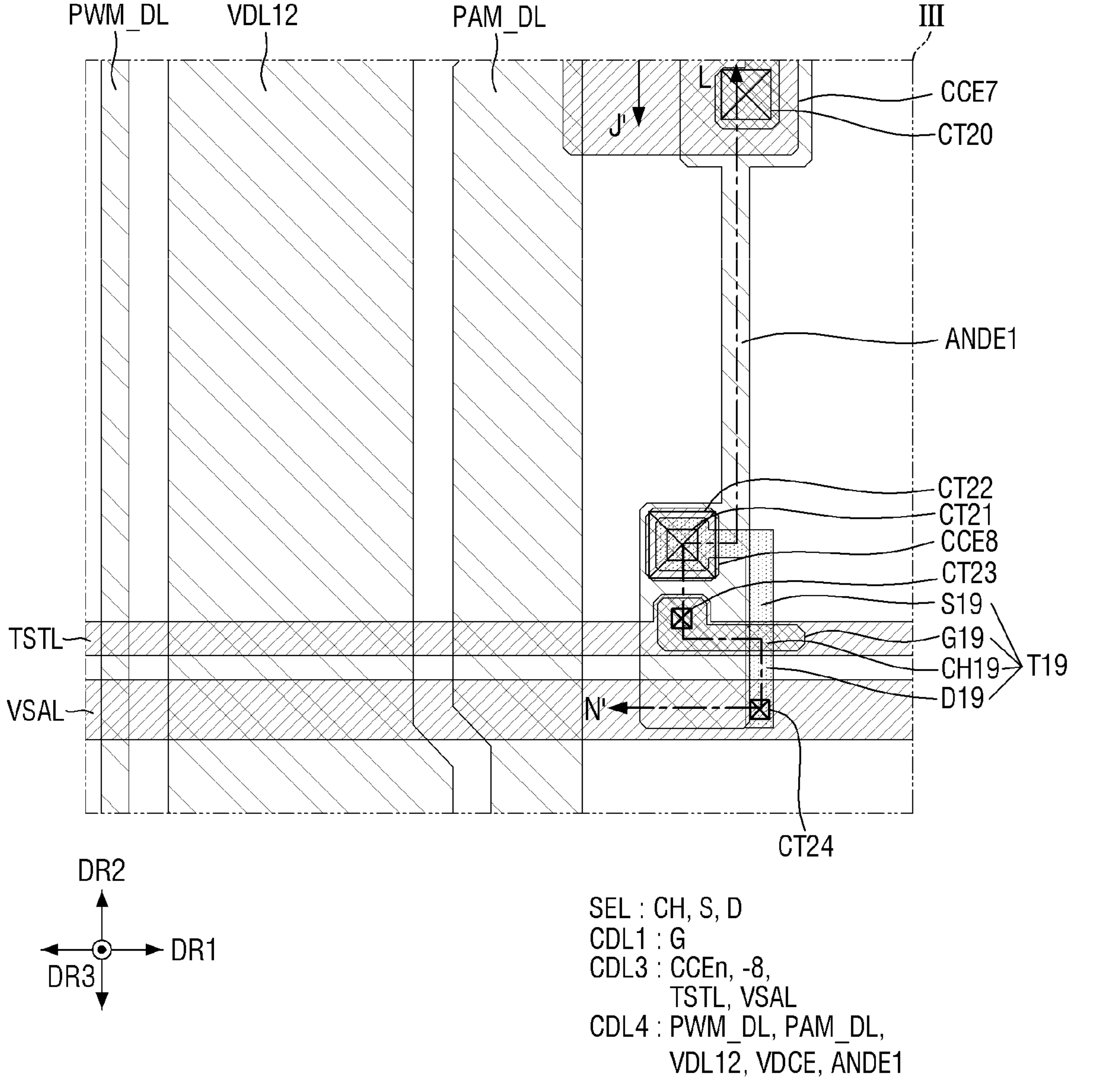
FIG. 10 is an enlarged plan view illustrating a portion III of FIG. 7 in detail.
Figure 11:
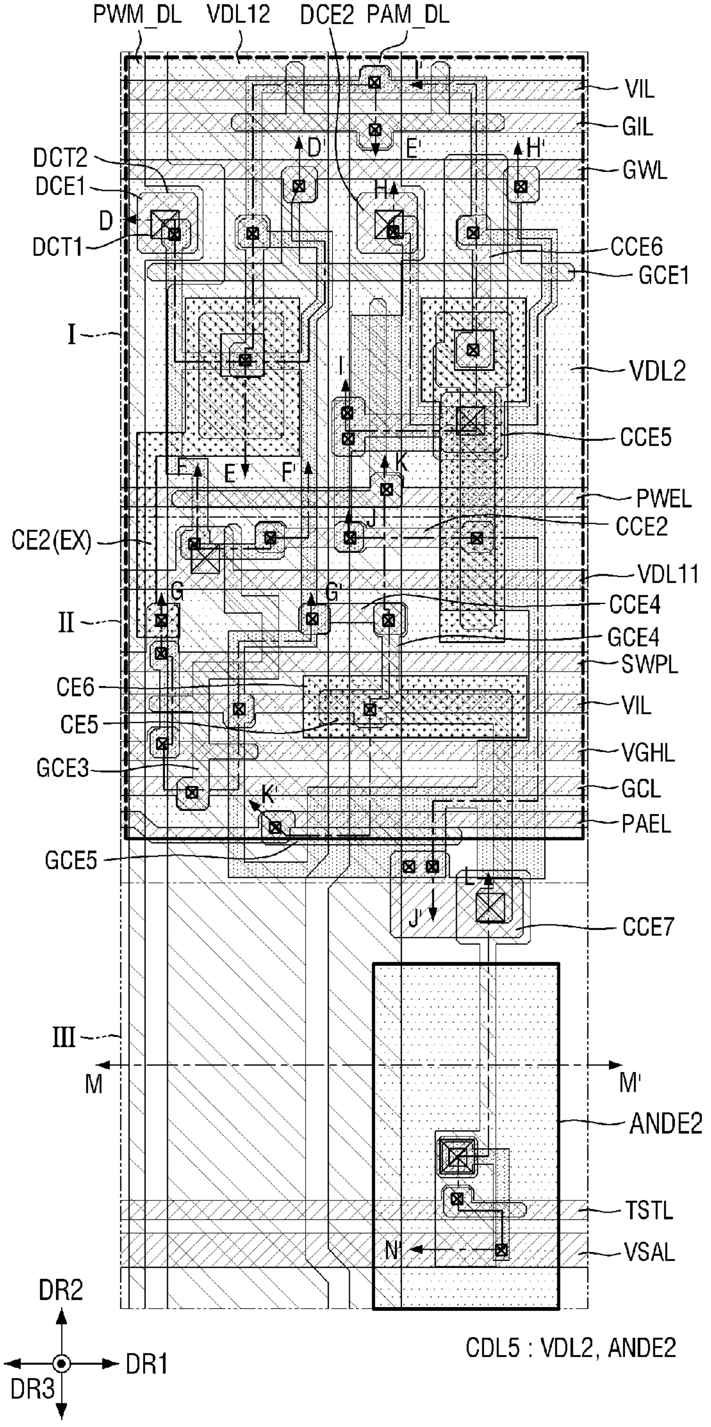
FIG. 11 is a plan view illustrating a fifth conductive layer of the portion of a circuit layer corresponding to the subpixel, along with the illustration of FIG. 7.
Figure 12:
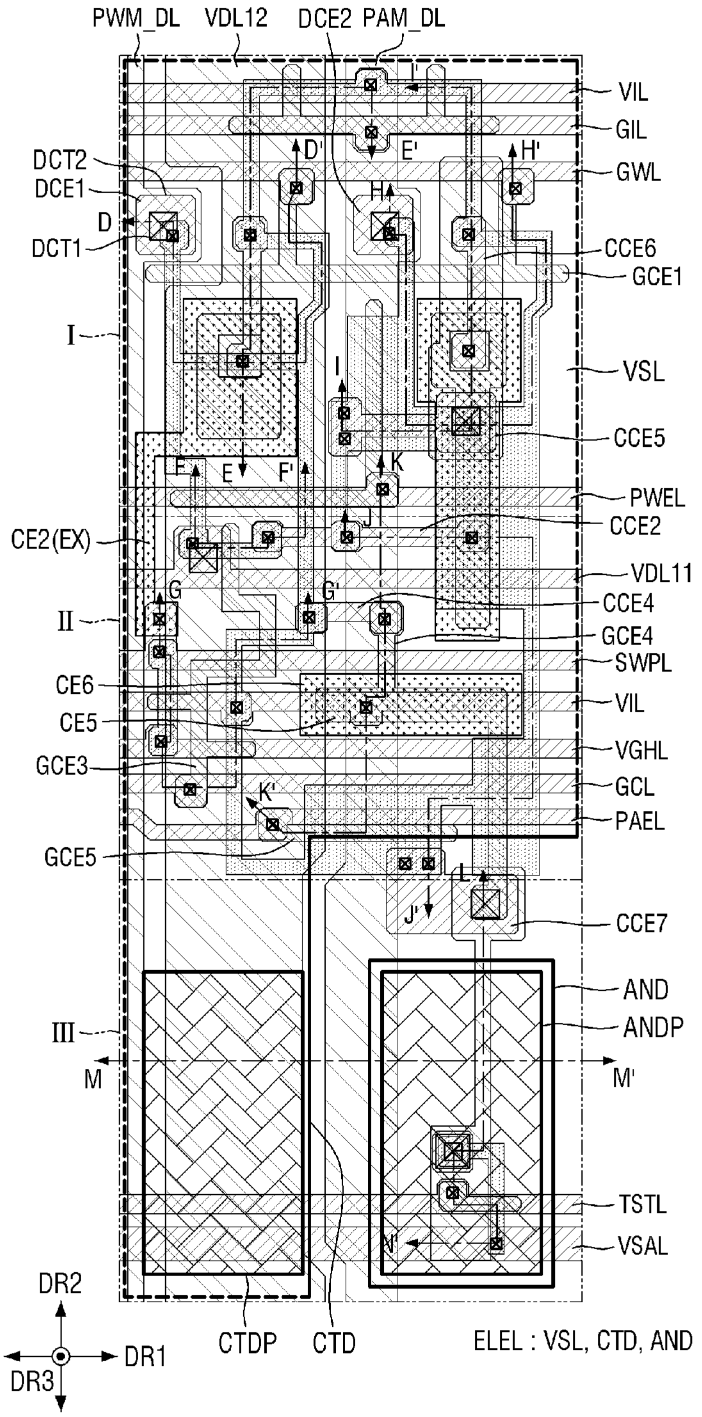
FIG. 12 is a plan view illustrating an electrode layer overlapping the pixel driver corresponding to the subpixel, along with the illustration of FIG. 7.

FIG. 7 is a plan view illustrating a semiconductor layer SEL, a first conductive layer CDL1, a second conductive layer CDL2, a third conductive layer CDL3 and a fourth conductive layer CDL4 of a portion of a circuit layer 120 corresponding to a subpixel. FIG. 8 is an enlarged plan view illustrating a portion I of FIG. 7 in detail. FIG. 9 is an enlarged plan view illustrating a portion II of FIG. 7 in detail. FIG. 10 is an enlarged plan view illustrating a portion III of FIG. 7 in detail. FIG. 11 is a plan view illustrating a fifth conductive layer CDL5 the portion of the circuit layer 120 corresponding to the subpixel, along with the illustration of FIG. 7. FIG. 12 is a plan view illustrating an electrode layer ELEL overlapping the pixel driver PXD corresponding to the subpixel, along with the illustration of FIG. 7.

Referring to FIGS. 7, 8, 9, 10 and 11, the circuit layer 120 according to an embodiment includes the semiconductor layer SEL, the first conductive layer CDL1, the second conductive layer CDL2, the third conductive layer CDL3, the fourth conductive layer CDL4, and the fifth conductive layer CDL5.

The semiconductor layer SEL may include channels CH (CH1, CH2, CH31, CH32, CH41, CH42, CH5, CH6, CH7, CH8, CH9, CH101, CH102, CH111, CH112, CH12, CH13, CH14, CH15, CH161, CH162, CH17, CH18 and CH19), source electrodes S (S1, S2, S31, S32, S41, S42, S5, S6, S7, S8, S9, S101, S102, S111, S112, S12, S13, S14, S15, S161, S162, S17, S18 and S19), and drain electrodes D (D1, D2, D31, D32, D41, D42, D5, D6, D7, D8, D9, D101, D102, D111, D112, D12, D13, D14, D15, D161, D162, D17, D18 and D19) of the first through nineteenth transistors T1 through T19 included in the pixel driver PXD.

A side of each of the channels CH may be connected to a source electrode S, and the other side of each of the channels CH may be connected to a drain electrode D.

The first conductive layer CDL1 may include gate electrodes G (G1, G2, G31, G32, G41, G42, G5, G6, G7, G8, G9, G101, G102, G111, G112, G12, G13, G14, G15, G161, G162, G17, G18, and G19) of the first through nineteenth transistors T1 through T19 included in the pixel driver PXD.

A first gate electrode G1 may be integrally formed with a first capacitor electrode CE1.

An eighth gate electrode G8 may be integrally formed with a second capacitor electrode CE2.

A fifteenth gate electrode G15 may be integrally formed with a third capacitor electrode CE3.

A second gate electrode G2, a third sub-gate electrode G41, a fourth sub-gate electrode G42, a ninth gate electrode G9, a seventh sub-gate electrode G111, and an eighth sub-gate electrode G112 may be made of different portions of a first gate connection electrode GCE1, respectively. The first gate connection electrode GCE1 may be electrically connected to a scan write wiring GWL through a first gate contact hole GCT1.

A first sub-gate electrode G31, a second sub-gate electrode G32, a fifth sub-gate electrode G101, and a sixth sub-gate electrode G102 may be made of different portions of a second gate connection electrode GCE2, respectively. The second gate connection electrode GCE2 may be electrically connected to a scan initialization wiring GIL through a second gate contact hole GCT2.

A seventh gate electrode G7, a thirteenth gate electrode G13, a ninth sub-gate electrode G161, a tenth sub-gate electrode G162, and an eighteenth gate electrode G18 may be made of different portions of a third gate connection electrode GCE3, respectively. The third gate connection electrode GCE3 may be electrically connected to a scan control wiring GCL through an eighth contact hole CT8.

The fifteenth gate electrode G15 and the third capacitor electrode CE3 may be made of a fourth gate connection electrode GCE4. The fourth gate connection electrode GCE4 may be electrically connected to a fourth connection electrode CCE4 through a seventeenth contact hole CT17.

A seventeenth gate electrode G17 may be integrally formed with a fifth gate connection electrode GCE5. The fifth gate connection electrode GCE5 may be electrically connected to a PAM emission wiring PAEL through a nineteenth contact hole CT19.

A fifth gate electrode G5, a sixth gate electrode G6, a twelfth gate electrode G12, and a fourteenth gate electrode G14 may be made of different portions of a sixth gate connection electrode GCE6, respectively. The sixth gate connection electrode GCE6 may be electrically connected to a PWM emission wiring PWEL through a fourteenth contact hole CT14.

A first data connection electrode DCE1 may be electrically connected to a second source electrode S2 through a first data contact hole DCT1 and may be electrically connected to a PWM data wiring PWM_DL through a second data contact hole DCT2.

A second data connection electrode DCE2 may be electrically connected to a ninth source electrode S9 through a third data contact hole DCT3 and may be electrically connected to a PAM data wiring PAM_DL through a fourth data contact hole DCT4.

The first transistor T1 may include a first channel CH1, the first gate electrode G1, a first source electrode S1, and a first drain electrode D1.

The first channel CH1 may be connected between the first source electrode S1 and the first drain electrode D1.

The first gate electrode G1 may overlap the first channel CH1 in a third direction DR3. The first gate electrode G1 may be integrally formed with the first capacitor electrode CE1.

The first gate electrode G1 may be electrically connected to a first connection electrode CCE1 through a first contact hole CT1.

The first source electrode S1 may be connected to a second drain electrode D2 and a fifth drain electrode D5.

The first drain electrode D1 may be connected to a third sub-source electrode S41 and a sixth source electrode S6.

The second transistor T2 includes a second channel CH2, the second gate electrode G2, the second source electrode S2, and the second drain electrode D2.

The second channel CH2 may be connected between the second source electrode S2 and the second drain electrode D2.

The second gate electrode G2 may overlap the second channel CH2 in the third direction DR3. The second gate electrode G2 may be made of a portion of the first gate connection electrode GCE1.

The second source electrode S2 may be electrically connected to the first data connection electrode DCE1 through the first data contact hole DCT1.

The second drain electrode D2 may be connected to the first source electrode S1.

The third transistor T3 may include the first sub-transistor T31 and the second sub-transistor T32.

The first sub-transistor T31 of the third transistor T3 includes a first sub-channel CH31, the first sub-gate electrode G31, a first sub-source electrode S31, and a first sub-drain electrode D31.

The first sub-channel CH31 may be connected between the first sub-source electrode S31 and the first sub-drain electrode D31.

The first sub-channel CH31 may overlap the first sub-gate electrode G31 in the third direction DR3.

The first sub-gate electrode G31 may be made of a portion of the second gate connection electrode GCE2.

The first sub-source electrode S31 may be connected to a fourth sub-drain electrode D42.

The first sub-drain electrode D31 may be connected to a second sub-source electrode S32.

The second sub-transistor T32 includes a second sub-channel CH32, the second sub-gate electrode G32, the second sub-source electrode S32, and a second sub-drain electrode D32.

The second sub-channel CH32 may be connected between the second sub-source electrode S32 and the second sub-drain electrode D32.

The second sub-channel CH32 may overlap the second sub-gate electrode G32 in the third direction DR3.

The second sub-gate electrode G32 may be made of a portion of the second gate connection electrode GCE2.

The second sub-drain electrode D32 may be electrically connected to an initialization voltage wiring VIL through a first power contact hole VCT1.

The fourth transistor T4 may include the third sub-transistor T41 and the fourth sub-transistor T42.

The third sub-transistor T41 of the fourth transistor T4 includes a third sub-channel CH41, the third sub-gate electrode G41, the third sub-source electrode S41, and a third sub-drain electrode D41.

The third sub-channel CH41 may be connected between the third sub-source electrode S41 and the third sub-drain electrode D41.

The third sub-channel CH41 may overlap the third sub-gate electrode G41 in the third direction DR3.

The third sub-gate electrode G41 may be made of a portion of the first gate connection electrode GCE1.

The third sub-source electrode S41 may be connected to the first drain electrode D1.

The third sub-drain electrode D41 may be connected to the fourth sub-source electrode S42.

The fourth sub-transistor T42 of the fourth transistor T4 includes a fourth sub-channel CH42, the fourth sub-gate electrode G42, the fourth sub-source electrode S42, and the fourth sub-drain electrode D42.

The fourth sub-channel CH42 may be connected between the fourth sub-source electrode S42 and the fourth sub-drain electrode D42.

The fourth sub-channel CH42 may overlap the fourth sub-gate electrode G42 in the third direction DR3.

The fourth sub-gate electrode G42 may be made of a portion of the first gate connection electrode GCE1.

The fourth sub-source electrode S42 may be connected to the third sub-drain electrode D32.

The fourth sub-drain electrode D42 may be connected to the first sub-source electrode S31.

The fifth transistor T5 includes a fifth channel CH5, the fifth gate electrode G5, a fifth source electrode S5, and the fifth drain electrode D5.

The fifth channel CH5 may be connected between the fifth source electrode S5 and the fifth drain electrode D5.

The fifth channel CH5 may overlap the fifth gate electrode G5 in the third direction DR3.

The fifth gate electrode G5 may be made of a portion of the sixth gate connection electrode GCE6.

The fifth source electrode S5 may be electrically connected to a first power main wiring VDL11 through a second power contact hole VCT2.

The fifth drain electrode D5 may be connected to the first source electrode S1.

The sixth transistor T6 includes a sixth channel CH6, the sixth gate electrode G6, the sixth source electrode S6, and a sixth drain electrode D6.

The sixth channel CH6 may be connected between the sixth source electrode S6 and the sixth drain electrode D6.

The sixth channel CH6 may overlap the sixth gate electrode G6 in the third direction DR3.

The sixth gate electrode G6 may be made of a portion of the sixth gate connection electrode GCE6.

The sixth source electrode S6 may be connected to the first drain electrode D1.

The sixth drain electrode D6 may be electrically connected to the fourth connection electrode CCE4 through a tenth contact hole CT10.

The seventh transistor T7 includes a seventh channel CH7, the seventh gate electrode G7, a seventh source electrode S7, and a seventh drain electrode D7.

The seventh channel CH7 may be connected between the seventh source electrode S7 and the seventh drain electrode D7.

The seventh channel CH7 may overlap the seventh gate electrode G7 in the third direction DR3.

The seventh gate electrode G7 may be made of a portion of the third gate connection electrode GCE3.

The seventh source electrode S7 may be electrically connected to a gate voltage wiring VGHL through a seventh contact hole CT7.

The seventh drain electrode D7 may be electrically connected to a sweep signal wiring SWPL through a sixth contact hole CT6.

The eighth transistor T8 includes an eighth channel CH8, the eighth gate electrode G8, an eighth source electrode S8, and an eighth drain electrode D8.

The eighth channel CH8 may be connected between the eighth source electrode S8 and the eighth drain electrode D8.

The eighth channel CH8 may overlap the eighth gate electrode G8 in the third direction DR3.

The eighth gate electrode G8 may be integrally formed with a second capacitor electrode CE2.

The eighth source electrode S8 may be connected to a ninth drain electrode D9 and a twelfth drain electrode D12.

The eighth drain electrode D8 may be connected to a seventh sub-source electrode S111.

The ninth transistor T9 includes a ninth channel CH9, the ninth gate electrode G9, the ninth source electrode S9, and the ninth drain electrode D9.

The ninth channel CH9 may be connected between the ninth source electrode S9 and the ninth drain electrode D9.

The ninth channel CH9 may overlap the ninth gate electrode G9 in the third direction DR3.

The ninth gate electrode G9 may be made of a portion of the first gate connection electrode GCE1.

The ninth source electrode S9 may be electrically connected to the second data connection electrode DCE2 through the third data contact hole DCT3.

The ninth drain electrode D9 may be connected to the eighth source electrode D8.

The tenth transistor T10 may include the fifth sub-transistor T101 and the sixth sub-transistor T102.

The fifth sub-transistor T101 includes a fifth sub-channel CH101, the fifth sub-gate electrode G101, a fifth sub-source electrode S101, and a fifth sub-drain electrode D101.

The fifth sub-channel CH101 may be connected between the fifth sub-source electrode S101 and the fifth sub-drain electrode D101.

The fifth sub-channel CH101 may overlap the fifth sub-gate electrode G101 in the third direction DR3.

The fifth sub-gate electrode G101 may be made of a portion of the second gate connection electrode GCE2.

The fifth sub-source electrode S101 may be connected to an eighth sub-drain electrode D112.

The fifth sub-drain electrode D101 may be connected to the sixth sub-source electrode S102.

The sixth sub-transistor T102 includes the sixth sub-channel CH102, the sixth sub-gate electrode G102, the sixth sub-source electrode S102, and the sixth sub-drain electrode D102.

The sixth sub-channel CH102 may be connected between the sixth sub-source electrode S102 and the sixth sub-drain electrode D102.

The sixth sub-channel CH102 may overlap the sixth sub-gate electrode G102 in the third direction DR3.

The sixth sub-gate electrode G102 may be made of a portion of the second gate connection electrode GCE2.

The sixth sub-source electrode S102 may be connected to the fifth sub-drain electrode D101.

The sixth sub-drain electrode D102 may be electrically connected to the initialization voltage wiring VIL through the first power contact hole VCT1.

The eleventh transistor T11 may include the seventh sub-transistor T111 and the eighth sub-transistor T112.

The seventh sub-transistor T111 includes a seventh sub-channel CH111, the seventh sub-gate electrode G111, the seventh sub-source electrode S111, and a seventh sub-drain electrode D111.

The seventh sub-channel CH111 may be connected between the seventh sub-source electrode S111 and the seventh sub-drain electrode D111.

The seventh sub-channel CH111 may overlap the seventh sub-gate electrode G111 in the third direction DR3.

The seventh sub-gate electrode G111 may be made of a portion of the first gate connection electrode GCE1.

The seventh sub-source electrode S111 may be connected to the eighth drain electrode D8.

The seventh sub-drain electrode D111 may be connected to an eighth sub-source electrode S112.

The eighth sub-transistor T112 includes an eighth sub-channel CH112, the eighth sub-gate electrode G112, the eighth sub-source electrode S112, and the eighth sub-drain electrode D112.

The eighth sub-channel CH112 may be connected between the eighth sub-source electrode S112 and the eighth sub-drain electrode D112.

The eighth sub-channel CH112 may overlap the eighth sub-gate electrode G112 in the third direction DR3.

The eighth sub-gate electrode G112 may be made of a portion of the first gate connection electrode GCE1.

The eighth sub-source electrode S112 may be connected to the seventh sub-drain electrode D111.

The eighth sub-drain electrode D112 may be connected to the fifth sub-source electrode S101.

The twelfth transistor T12 includes a twelfth channel CH12, the twelfth gate electrode G12, a twelfth source electrode S12, and the twelfth drain electrode D12.

The twelfth channel CH12 may be connected between the twelfth source electrode S12 and the twelfth drain electrode D12.

The twelfth channel CH12 may overlap the twelfth gate electrode G12 in the third direction DR3.

The twelfth gate electrode G12 may be made of a portion of a sixth gate connection electrode GCE6.

The twelfth source electrode S12 may be electrically connected to a fifth connection electrode CCE5 through eleventh contact holes CT11.

The thirteenth transistor T13 includes a thirteenth channel CH13, the thirteenth gate electrode G13, a thirteenth source electrode S13, and a thirteenth drain electrode D13.

The thirteenth channel CH13 may be connected between the thirteenth source electrode S13 and the thirteenth drain electrode D13.

The thirteenth channel CH13 may overlap the thirteenth gate electrode G13 in the third direction DR3.

The thirteenth gate electrode G13 may be made of a portion of the third gate connection electrode GCE3.

The thirteenth source electrode S13 may be electrically connected to the first power main wiring VDL11 through the second power contact hole VCT2.

The fourteenth transistor T14 includes a fourteenth channel CH14, the fourteenth gate electrode G14, a fourteenth source electrode S14, and a fourteenth drain electrode D14.

The fourteenth channel CH14 may be connected between the fourteenth source electrode S14 and the fourteenth drain electrode D14.

The fourteenth channel CH14 may overlap the fourteenth gate electrode G14 in the third direction DR3.

The fourteenth gate electrode G14 may be integrally formed with the sixth gate connection electrode GCE6.

The fourteenth source electrode S14 may be electrically connected to the fifth connection electrode CCE5 through the eleventh contact holes CT11.

The fourteenth drain electrode D14 may be electrically connected to a second connection electrode CCE2 through a fourth contact hole CT4.

The fifteenth transistor T15 includes a fifteenth channel CH15, the fifteenth gate electrode G15, a fifteenth source electrode S15, and a fifteenth drain electrode D15.

The fifteenth channel CH15 may be connected between the fifteenth source electrode S15 and the fifteenth drain electrode D15.

The fifteenth channel CH15 may overlap the fifteenth gate electrode G15 in the third direction DR3.

The fifteenth gate electrode G15 may be integrally formed with a third capacitor electrode CE3.

The fifteenth source electrode S15 may be electrically connected to the ninth drain electrode D9.

The fifteenth drain electrode D15 may be electrically connected to a seventeenth source electrode S17.

The sixteenth transistor T16 may include the ninth sub-transistor T161 and the tenth sub-transistor T162.

The ninth sub-transistor T161 includes a ninth sub-channel CH161, the ninth sub-gate electrode G161, a ninth sub-source electrode S161, and a ninth sub-drain electrode D161.

The ninth sub-channel CH161 may be connected between the ninth sub-source electrode S161 and the ninth sub-drain electrode D161.

The ninth sub-channel CH161 may overlap the ninth sub-gate electrode G161 in the third direction DR3.

The ninth sub-gate electrode G161 may be integrally formed with the third gate connection electrode GCE3.

The ninth sub-source electrode S161 may be connected to the fourth connection electrode CCE4 through the tenth contact hole CT10.

The ninth sub-drain electrode D161 may be connected to a tenth sub-source electrode S162.

The tenth sub-transistor T162 includes a tenth sub-channel CH162, the tenth sub-gate electrode G162, the tenth sub-source electrode S162, and a tenth sub-drain electrode D162.

The tenth sub-channel CH162 may be connected between the tenth sub-source electrode S162 and the tenth sub-drain electrode D162.

The tenth sub-channel CH162 may overlap the tenth sub-gate electrode G162 in the third direction DR3.

The tenth sub-gate electrode G162 may be integrally formed with the third gate connection electrode GCE3.

The tenth sub-source electrode S162 may be electrically connected to the ninth sub-drain electrode D161.

The tenth sub-drain electrode D162 may be electrically connected to an initialization voltage wiring VIL through a ninth contact hole CT9.

The seventeenth transistor T17 includes a seventeenth channel CH17, the seventeenth gate electrode G17, the seventeenth source electrode S17, and a seventeenth drain electrode D17.

The seventeenth channel CH17 may be connected between the seventeenth source electrode S17 and the seventeenth drain electrode D17.

The seventeenth channel CH17 may overlap the seventeenth gate electrode G17 in the third direction DR3.

The seventeenth gate electrode G17 may be integrally formed with the fifth gate connection electrode GCE5.

The seventeenth source electrode S17 may be electrically connected to the fifteenth drain electrode D15.

The seventeenth drain electrode D17 may be electrically connected to a seventh connection electrode CCE7 through sixteenth contact holes CT16.

The eighteenth transistor T18 includes an eighteenth channel CH18, the eighteenth gate electrode G18, an eighteenth source electrode S18, and an eighteenth drain electrode D18.

The eighteenth channel CH18 may be connected between the eighteenth source electrode S18 and the eighteenth drain electrode D18.

The eighteenth channel CH18 may overlap the eighteenth gate electrode G18 in the third direction DR3.

The eighteenth gate electrode G18 may be integrally formed with the third gate connection electrode GCE3.

The eighteenth source electrode S18 may be electrically connected to the initialization voltage wiring VIL through the ninth contact hole CT9.

The eighteenth drain electrode D18 may be electrically connected to the seventh connection electrode CCE7 through the sixteenth contact holes CT16.

The nineteenth transistor T19 includes a nineteenth channel CH19, a nineteenth gate electrode G19, a nineteenth source electrode S19, and a nineteenth drain electrode D19.

The nineteenth channel CH19 may be connected between the nineteenth source electrode S19 and the nineteenth drain electrode D19.

The nineteenth channel CH19 may overlap the nineteenth gate electrode G19 in the third direction DR3.

The nineteenth gate electrode G19 may be electrically connected to a test signal wiring TSTL through a twenty-third contact hole CT23.

The nineteenth source electrode S19 may be connected to an eighth connection electrode CCE8 through a twenty-first contact hole CT21.

The nineteenth drain electrode D19 may be connected to a third power auxiliary wiring VSAL through a twenty-fourth contact hole CT24.

The second conductive layer CDL2 may include a fourth capacitor electrode CE4 overlapping the first capacitor electrode CE1, a fifth capacitor electrode CE5 overlapping the second capacitor electrode CE2, and a sixth capacitor electrode CE6 overlapping the third capacitor electrode CE3.

The fourth capacitor electrode CE4 may overlap the first capacitor electrode CE1 in the third direction DR3. The first capacitor electrode CE1 may be integrally formed with the first gate electrode G1.

The fourth capacitor electrode CE4 may include an extension portion EX extending in the second direction DR2. The extension portion EX of the fourth capacitor electrode CE4 may cross the PWM emission wiring PWEL and the first power main wiring VDL11.

The extension portion EX of the fourth capacitor electrode CE4 may be electrically connected to the sweep signal wiring SWPL through a fifth contact hole CT5.

Accordingly, the first capacitor PC1 (see FIG. 6) connected between the first gate electrode G1 of the first transistor T1 and the first power wiring VDL1 may be provided by an overlap area between the first capacitor electrode CE1 and the fourth capacitor electrode CE4.

The fifth capacitor electrode CE5 may overlap the second capacitor electrode CE2 in the third direction DR3. The second capacitor electrode CE2 may be integrally formed with the eighth gate electrode G8.

The fifth capacitor electrode CE5 may be electrically connected to the thirteenth drain electrode D13 and the fourteenth drain electrode D14 through a third contact hole CT3, the fourth contact hole CT4, and the second connection electrode CCE2.

Accordingly, the second capacitor PC2 (see FIG. 6) connected between the second node N2 and the eighth gate electrode G8 of the eighth transistor T8 may be provided by an overlap area between the second capacitor electrode CE2 and the fifth capacitor electrode CE5.

The sixth capacitor electrode CE6 may overlap the third capacitor electrode CE3 in the third direction DR3. The third capacitor electrode CE3 may be integrally formed with the fifteenth gate electrode G15.

The sixth capacitor electrode CE6 may be electrically connected to the initialization voltage wiring VIL through an eighteenth contact hole CT18.

Accordingly, the third capacitor PC3 (see FIG. 6) connected between the third node N3 and the initialization voltage wiring VIL may be provided by an overlap area between the third capacitor electrode CE3 and the sixth capacitor electrode CE6.

The third conductive layer CDL3 may include wirings extending in the first direction DR1. That is, the third conductive layer CDL3 may include the initialization voltage wiring VIL, the scan initialization wiring GIL, the scan write wiring GWL, the PWM emission wiring PWEL, the sweep signal wiring SWPL, the scan control wiring GCL, the PAM emission wiring PAEL, the gate voltage wiring VGHL, and the test signal wiring TSTL.

The third conductive layer CDL3 may further include the third power auxiliary wiring VSAL that transmits the third power voltage VSS.

The third conductive layer CDL3 may further include the first and second data connection electrodes DCE1 and DCE2 and the first through eighth connection electrodes CCE1 through CCE8.

The fourth conductive layer CDL4 may include wirings extending in the second direction DR2. That is, the fourth conductive layer CDL4 may include the PWM data wiring PWM_DL, a first power sub-wiring VDL12, and the PAM data wiring PAM_DL.

The fourth conductive layer CDL4 may further include a first anode connection electrode ANDE1.

The fourth conductive layer CDL4 may further include a second power connection electrode VDCE.

Referring to FIG. 11, the fifth conductive layer CDL5 may include a second power wiring VDL2 transmitting the second power voltage PAM_VDD and a second anode connection electrode ANDE2 spaced from the second power wiring VDL2 and overlapping the first anode connection electrode ANDE1.

The second power wiring VDL2 may extend in the first direction DR1 and the second direction DR2 and may be disposed in a mesh shape surrounding the second anode connection electrode ANDE2.

Referring to FIG. 12, the electrode layer ELEL may include a third power wiring VSL transmitting the third power voltage VSS, a cathode CTD connected to the third power wiring VSL, and an anode AND spaced apart from the third power wiring VSL and the cathode CTD and overlapping the second anode connection electrode ANDE2.

The third power wiring VSL may be disposed in a mesh shape extending in the first direction DR1 and the second direction DR2.

Figure 13:
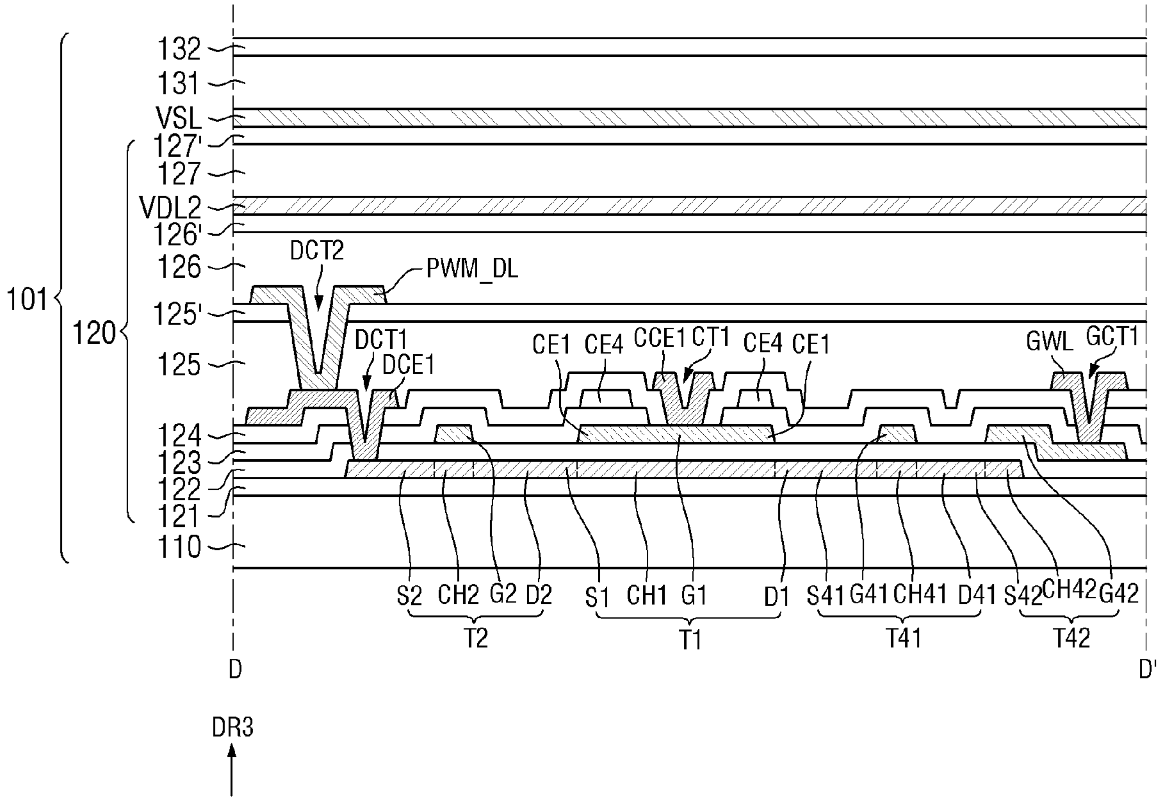
FIG. 13 is a cross-sectional view of a plane cut along the line D-D' of FIG. 7 from among the plan views illustrated in FIGS. 7, 11, and 12.
Figure 14:
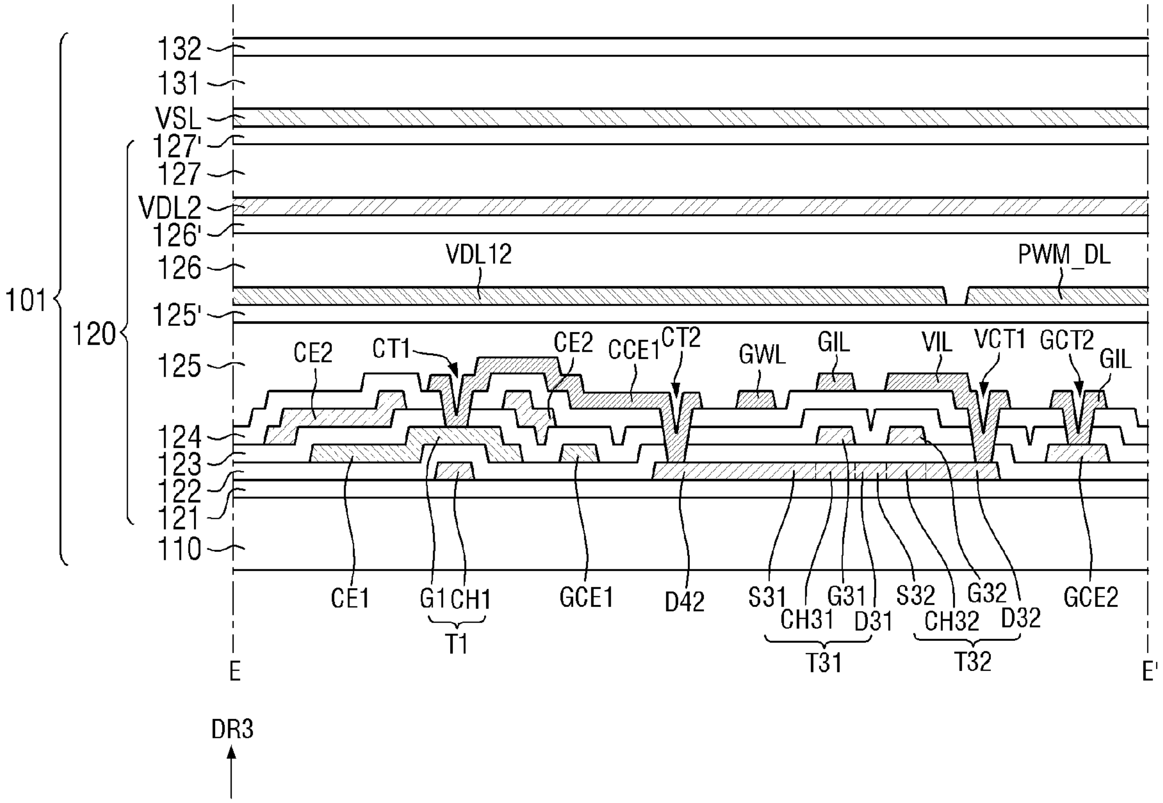
FIG. 14 is a cross-sectional view of a plane cut along the line E-E' of FIG. 7 from among the plan views illustrated in FIGS. 7, 11, and 12.
Figure 15:
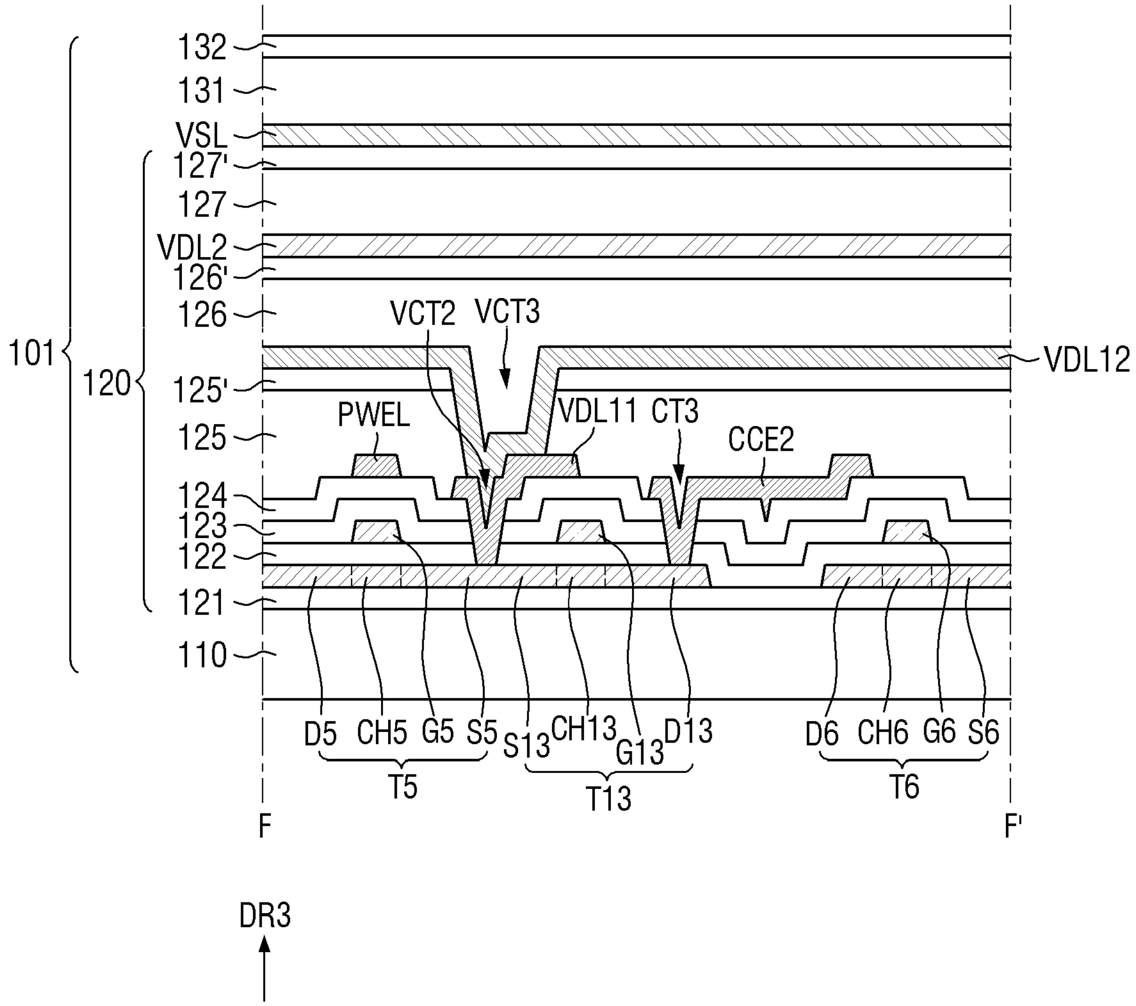
FIG. 15 is a cross-sectional view of a plane cut along the line F-F' of FIG. 7 from among the plan views illustrated in FIGS. 7, 11 and 12.
Figure 16:
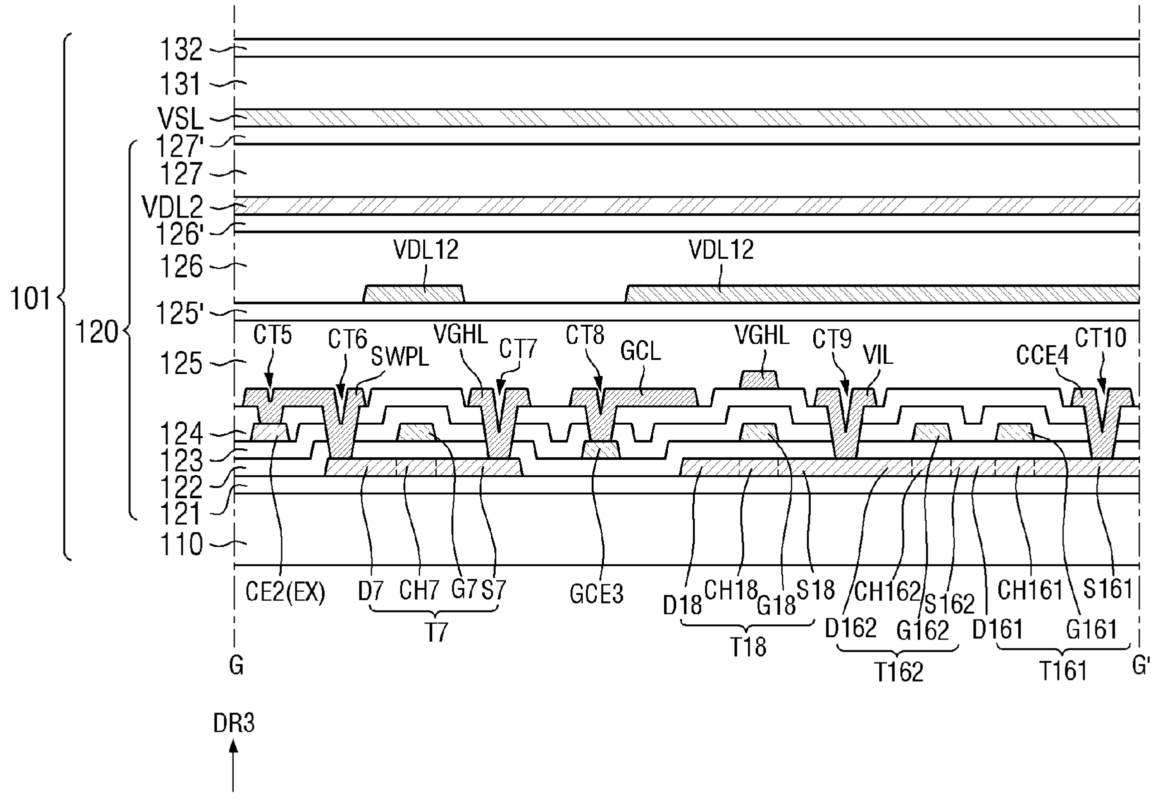
FIG. 16 is a cross-sectional view of a plane cut along the line G-G' of FIG. 7 from among the plan views illustrated in FIGS. 7, 11, and 12.
Figure 17:
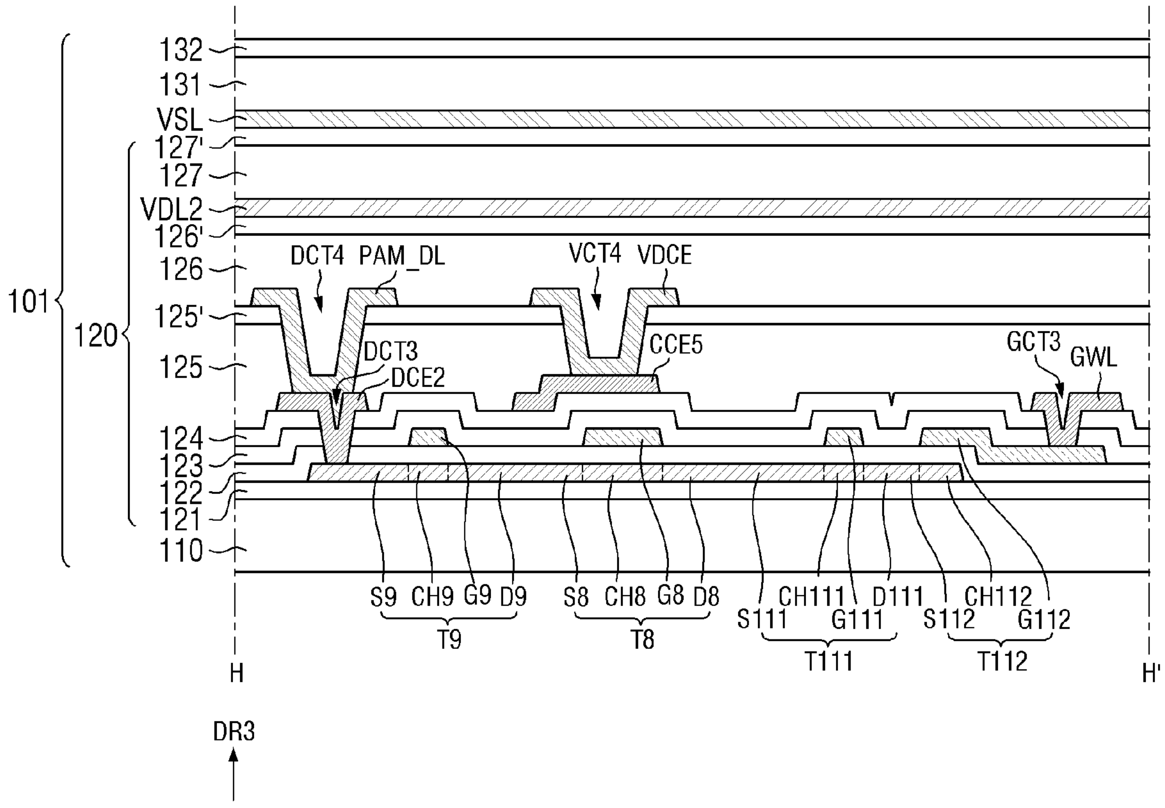
FIG. 17 is a cross-sectional view of a plane cut along the line H-H' of FIG. 7 from among the plan views illustrated in FIGS. 7, 11, and 12.
Figure 18:
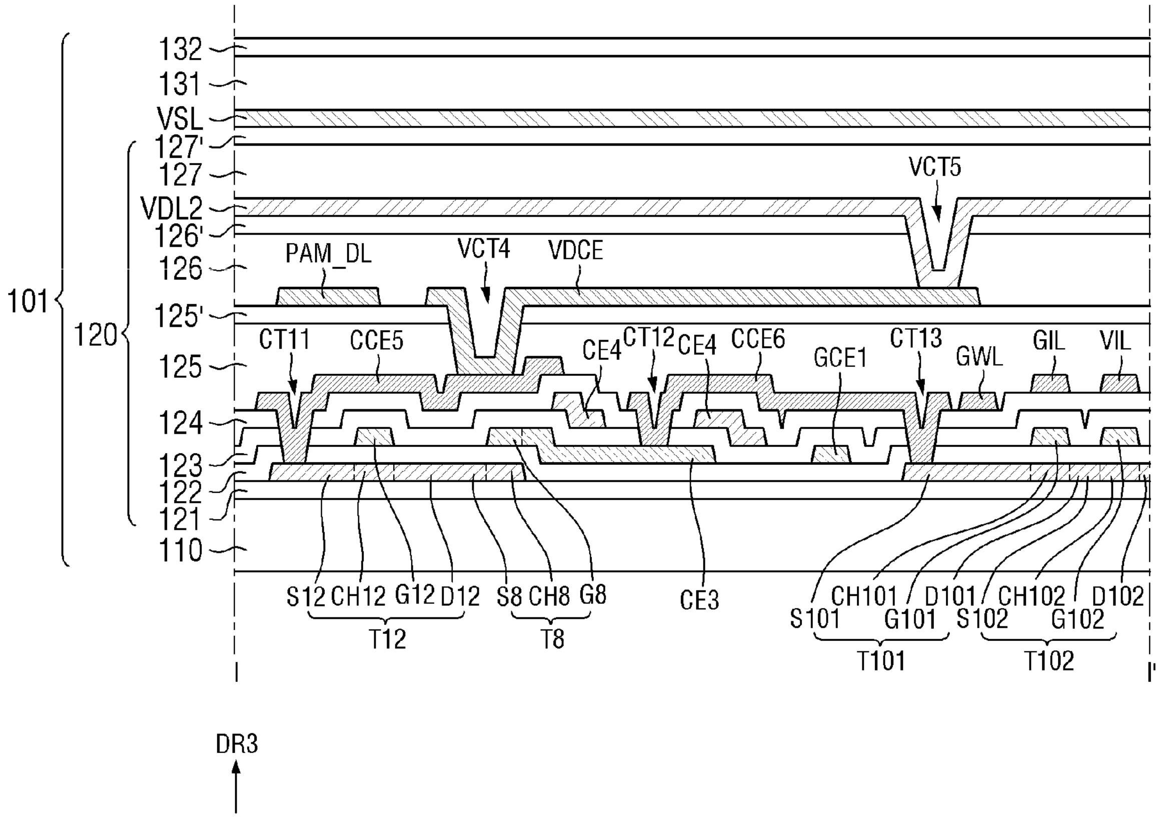
FIG. 18 is a cross-sectional view of a plane cut along the line I-I' of FIG. 7 from among the plan views illustrated in FIGS. 7, 11, and 12.
Figure 19:
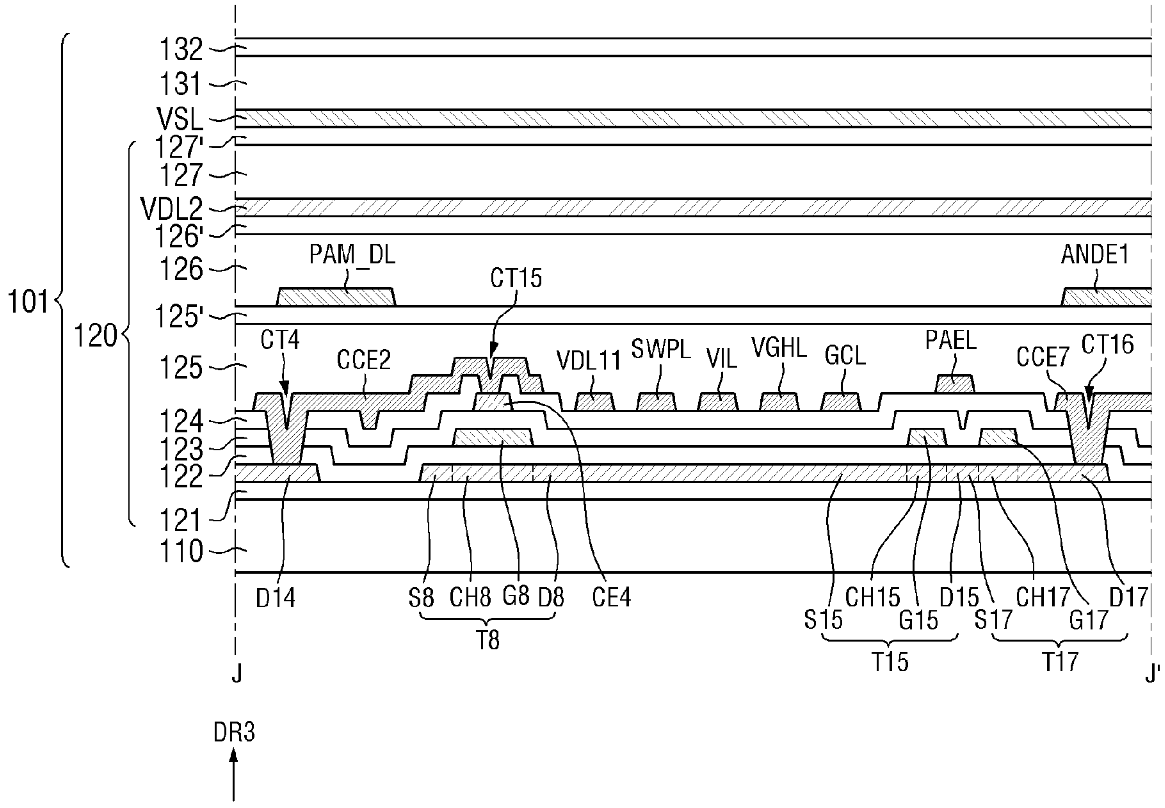
FIG. 19 is a cross-sectional view of a plane cut along the line J-J' of FIG. 7 from among the plan views illustrated in FIGS. 7, 11, and 12.
Figure 20:
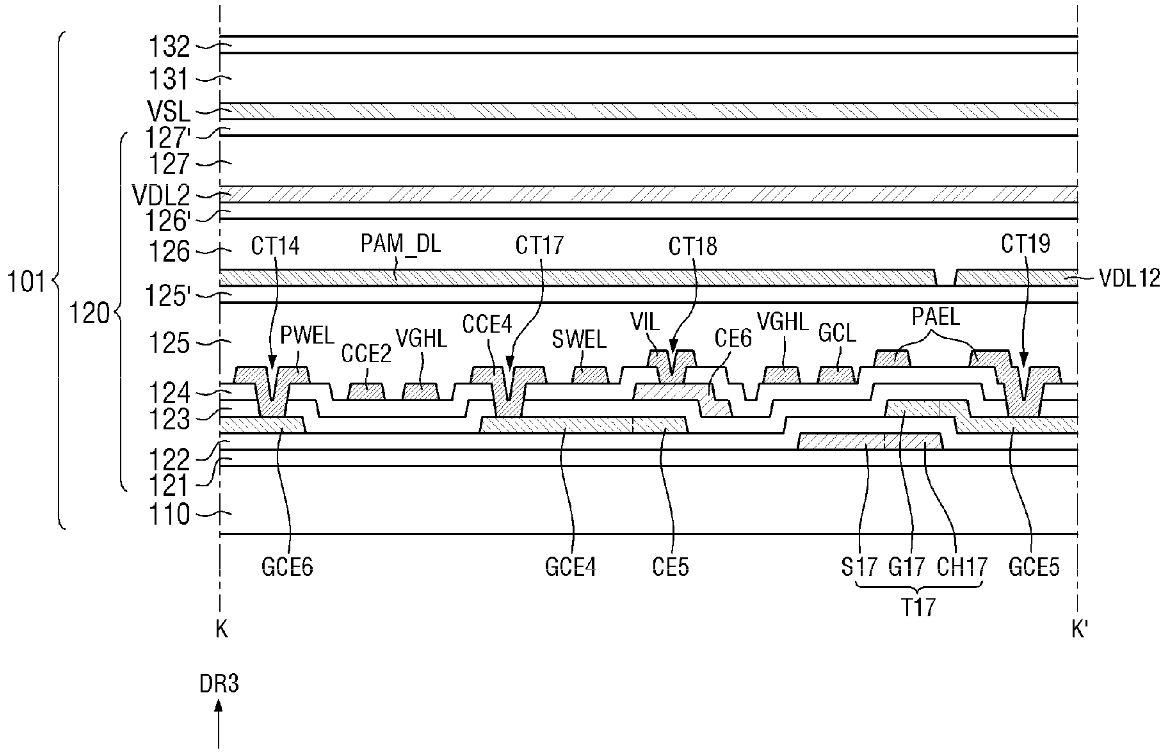
FIG. 20 is a cross-sectional view of a plane cut along the line K-K' of FIG. 7 from among the plan views illustrated in FIGS. 7, 11, and 12.
Figure 21:
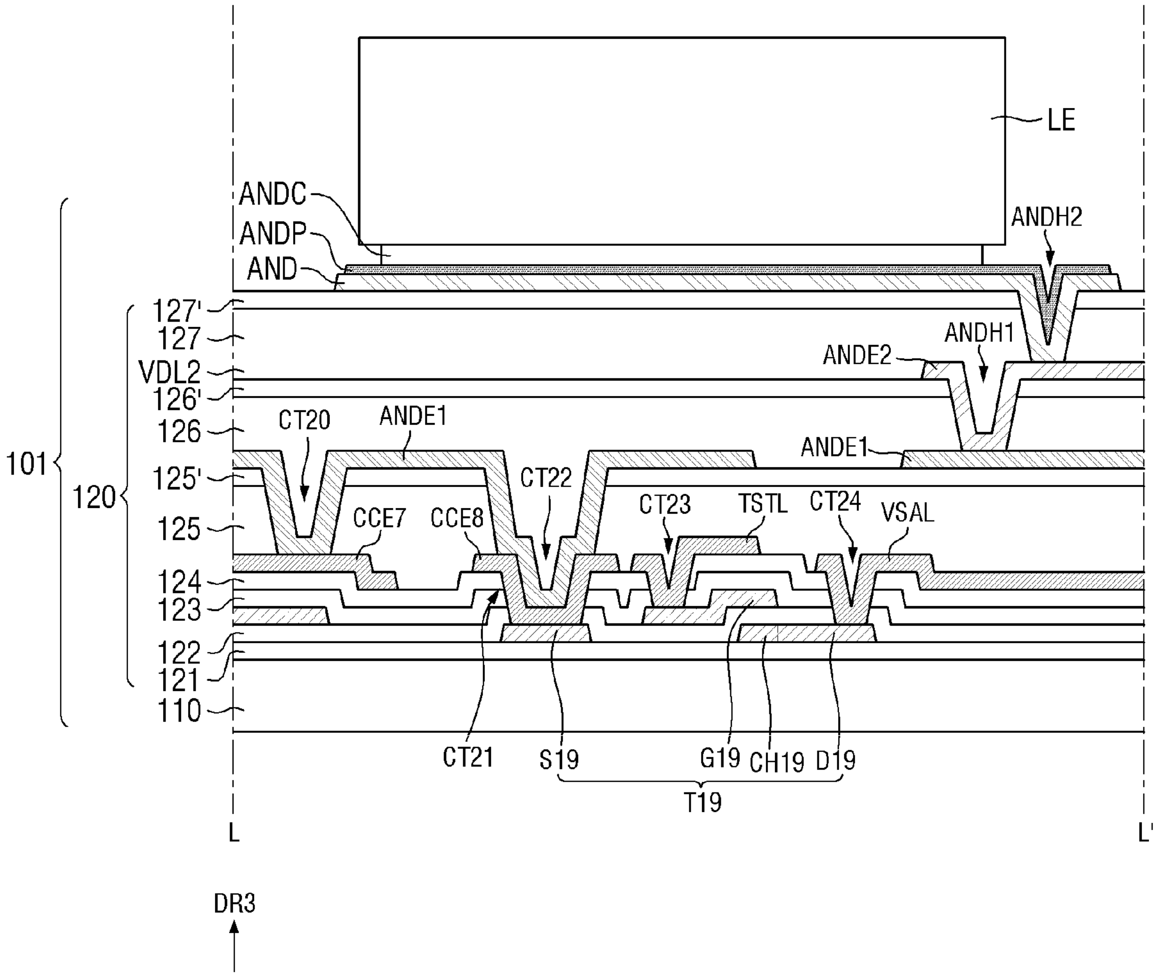
FIG. 21 is a cross-sectional view of a plane cut along the line L-L' of FIG. 7 from among the plan views illustrated in FIGS. 7, 11, and 12.

FIG. 13 is a cross-sectional view of a plane cut along the line D-D' of FIG. 7 from among the plan views illustrated in FIGS. 7, 11, and 12. FIG. 14 is a cross-sectional view of a plane cut along the line E-E' of FIG. 7 from among the plan views illustrated in FIGS. 7, 11, and 12. FIG. 15 is a cross-sectional view of a plane cut along the line F-F' of FIG. 7 from among the plan views illustrated in FIGS. 7, 11, and 12. FIG. 16 is a cross-sectional view of a plane cut along the line G-G' of FIG. 7 from among the plan views illustrated in FIGS. 7, 11, and 12. FIG. 17 is a cross-sectional view of a plane cut along the line H-H' of FIG. 7 from among the plan views illustrated in FIGS. 7, 11, and 12. FIG. 18 is a cross-sectional view of a plane cut along the line I-I' of FIG. 7 from among the plan views illustrated in FIGS. 7, 11, and 12. FIG. 19 is a cross-sectional view of a plane cut along the line J-J' of FIG. 7 from among the plan views illustrated in FIGS. 7, 11, and 12. FIG. 20 is a cross-sectional view of a plane cut along the line K-K' of FIG. 7 from among the plan views illustrated in FIGS. 7, 11, and 12. FIG. 21 is a cross-sectional view of a plane cut along the line L-L' of FIG. 7 from among the plan views illustrated in FIGS. 7, 11, and 12.

The display device 10 according to the one or more embodiments may include the backplane substrate 101, and the backplane substrate 101 may include the support substrate 110, the circuit layer 120 disposed on the support substrate 110, and the electrode layer ELEL (VSL, CTD, and AND).

Referring to FIG. 21, the display device 10 may further include the light emitting elements LE mounted on the backplane substrate 101 and corresponding to the subpixels SP1 through SP3, respectively.

The circuit layer 120 may include the pixel drivers PXD corresponding to the subpixels SP1 through SP3, respectively.

The support substrate 110 may be made of polymer resin such as polyimide. The support substrate 110 may be a flexible substrate that can be bent, folded, or rolled.

As illustrated in FIGS. 13 through 21, the circuit layer 120 may include the semiconductor layer SEL (CH, S, and D) disposed on the first surface of the support substrate 110, a first gate insulating layer 122 covering the semiconductor layer SEL, the first conductive layer CDL1 (G, CE1, CE2, CE3, and GCE1 through GCE6) disposed on the first gate insulating layer 122, a second gate insulating layer 123 covering the first conductive layer CDL1 (G, CE1, CE2, CE3, and GCE1 through GCE6), the second conductive layer CDL2 (CE4, CE5, and CE6) disposed on the second gate insulating layer 123, an interlayer insulating layer 124 covering the second conductive layer CDL2 (CE4, CE5, and CE6), the third conductive layer CDL3 (VIL, GIL, GWL, PWEL, VDL11, VGHL, SWPL, GCL, PAEL, TSTL, VSAL, DCE1, DCE2, and CCE1 through CCE8) disposed on the interlayer insulating layer 124, a first planarization layer 125 covering the third conductive layer CDL3 (VIL, GIL, GWL, PWEL, VDL11, VGHL, SWPL, GCL, PAEL, TSTL, VSAL, DCE1, DCE2, and CCE1 through CCE8), the fourth conductive layer CDL4 (PWM_DL, VDL12, PAM_DL, ANDE1, and VDCE) disposed on the first planarization layer 125, a second planarization layer 126 covering the fourth conductive layer CDL4 (PWM_DL, VDL12, PAM_DL, ANDE1, and VDCE), the fifth conductive layer CDL5 (VDL2 and ANDE2) disposed on the second planarization layer 126, and a third planarization layer 127 covering the fifth conductive layer CDL5 (VDL2 and ANDE2).

In addition, the circuit layer 120 may further include a first auxiliary insulating layer 125' disposed between the first planarization layer 125 and the fourth conductive layer CDL4 and made of an inorganic insulating material, a second auxiliary insulating layer 126' disposed between the second planarization layer 126 and the fifth conductive layer CDL5 and made of an inorganic insulating material, and a third auxiliary insulating layer 127' disposed between the third planarization layer 127 and the electrode layer ELEL and made of an inorganic insulating material.

In this case, a hole (e.g., a second anode contact hole ANDH2) penetrating the third planarization layer 127 may further penetrate the third auxiliary insulating layer 127'.

A hole (e.g., a first anode contact hole ANDH1) penetrating the second planarization layer 126 may further penetrate the second auxiliary insulating layer 126'.

Holes (e.g., a twentieth contact hole CT20, a twenty-second contact hole CT22, a third power contact hole VCT3, a fourth power contact hole VCT4, the second data contact hole DCT2, and the fourth data contact hole DCT4) penetrating the first planarization layer 125 may further penetrate the first auxiliary insulating layer 125'.

However, this is only an example. According to one or more embodiments, at least one of the first auxiliary insulating layer 125', the second auxiliary insulating layer 126', and the third auxiliary insulating layer 127' may be selectively disposed in consideration of lifting defects of the conductive layers CDL4, CDL5, and ELEL from the first, second, and third planarization layers 125, 126, and 127.

The circuit layer 120 may further include a buffer layer 121 covering the first surface of the support substrate 110. In this case, the semiconductor layer SEL (CH, S and D) and the first gate insulating layer 122 may be disposed on the buffer layer 121.

The buffer layer 121 may be composed of a plurality of inorganic layers stacked alternately. For example, the buffer layer 121 may be a multilayer in which one or more inorganic layers selected from a silicon nitride layer, a silicon oxynitride layer, a silicon oxide layer, a titanium oxide layer, and an aluminum oxide layer are alternately stacked.

The semiconductor layer SEL (CH, S and D) on the buffer layer 121 may include the channels CH1, CH2, CH31, CH32, CH41, CH42, CH5 through CH9, CH101, CH102, CH111, CH112, CH12 through CH15, CH161, CH162, and CH17 through CH19, the source electrodes S1, S2, S31, S32, S41, S42, S5 through S9, S101, S102, S111, S112, S12 through S15, S161, S162, and S17 through S19 and the drain electrodes D1, D2, D31, D32, D41, D42, D5 through D9, D101, D102, D111, D112, D12 through D15, D161, D162, and D17 through D19 included in the transistors T1 through T19 of the pixel driver PXD.

The semiconductor layer SEL (CH, S, and D) may include polycrystalline silicon, monocrystalline silicon, low-temperature polycrystalline silicon, amorphous silicon, or an oxide semiconductor.

The semiconductor layer SEL excluding the channels CH1, CH2, CH31, CH32, CH41, CH42, CH5 through CH9, CH101, CH102, CH111, CH112, CH12 through CH15, CH161, CH162, and CH17 through CH19 of the transistors T1 through T19 may be made of a silicon semiconductor or an oxide semiconductor doped with ions or impurities to have conductivity.

The first gate insulating layer 122 covering the semiconductor layer SEL (CH, S and D) may be made of an inorganic layer, for example, a silicon nitride layer, a silicon oxynitride layer, a silicon oxide layer, a titanium oxide layer, or an aluminum oxide layer. The first gate insulating layer 122 may be referred to as a first insulating layer.

The first conductive layer CDL1 (G, CE1, CE2, CE3, and GCE1 through GCE5) disposed on the first gate insulating layer 122 may include the respective gate electrodes G1, G2, G31, G32, G41, G42, G5 through G9, G101, G102, G111, G112, G12 through G15, G161, G162, and G17 through G19 of the transistors T1 through T19 included in the pixel driver PXD, the first through fifth gate connection electrodes GCE1 through GCE5, and the first through third capacitor electrodes CE1 through CE3.

The first conductive layer CDL1 (G, CE1, CE2, CE3, and GCE1 through CGE5) may be a single layer or a multilayer made of one or more selected from among molybdenum (Mo), aluminum (Al), chromium (Cr), gold (Au), titanium (Ti), nickel (Ni), neodymium (Nd), copper (Cu), and alloys thereof.

The second gate insulating layer 123 covering the first conductive layer CDL1 (G, CE1, CE2, CE3, and GCE1 through GCE5) may be made of an inorganic layer, for example, a silicon nitride layer, a silicon oxynitride layer, a silicon oxide layer, a titanium oxide layer, or an aluminum oxide layer. The second gate insulating layer 123 may be referred to as a second insulating layer.

The second conductive layer CDL2 (CE4, CE5, and CE6) disposed on the second gate insulating layer 123 may include the fourth capacitor electrode CE4, the fifth capacitor electrode CE5, and the sixth capacitor electrode CE6.

The fourth capacitor electrode CE4 may overlap the first capacitor electrode CE1 in the third direction DR3 with the second gate insulating layer 123 interposed between them. Accordingly, the first capacitor PC1 may be provided.

The fifth capacitor electrode CE5 may overlap the second capacitor electrode CE2 in the third direction DR3 with the second gate insulating layer 123 interposed between them. Accordingly, the second capacitor PC2 may be provided.

The sixth capacitor electrode CE6 may overlap the third capacitor electrode CE3 in the third direction DR3 with the second gate insulating layer 123 interposed between them. Accordingly, the third capacitor PC3 may be provided.

The second conductive layer CDL2 (CE4, CE5, and CE6) may be a single layer or a multilayer made of one or more selected from among molybdenum (Mo), aluminum (Al), chromium (Cr), gold (Au), titanium (Ti), nickel (Ni), neodymium (Nd), copper (Cu), and alloys thereof.

The interlayer insulating layer 124 covering the second conductive layer CDL2 (CE4, CE5, and CE6) may be made of an inorganic layer, for example, a silicon nitride layer, a silicon oxynitride layer, a silicon oxide layer, a titanium oxide layer, or an aluminum oxide layer. The second interlayer insulating layer 141 may be referred to as a third insulating layer.

The third conductive layer CDL3 (VIL, GIL, GWL, PWEL, VDL11, VGHL, SWPL, GCL, PAEL, TSTL, VSAL, DCE1, DCE2, and CCE1 through CCE8) disposed on the interlayer insulating layer 124 may include wirings extending in the direction DR1, the first and second data connection electrodes DCE1 and DCE2, and the first through eighth connection electrodes CCE1 through CCE8.

The wirings extending in the first direction DR1 may include the initialization voltage wiring VIL, the scan initialization wiring GIL, the scan write wiring GWL, the PWM emission wiring PWEL, the sweep signal wiring SWPL, the scan control wiring GCL, and the PAM emission wiring PAEL electrically connected to the scan driver SCDR.

In addition, the wirings extending in the first direction DR1 may further include the gate voltage wiring VGHL, the first power main wiring VDL11, the test signal wiring TSTL, and the third power auxiliary wiring VSAL.

The third conductive layer CDL3 (VIL, GIL, GWL, PWEL, VDL11, VGHL, SWPL, GCL, PAEL, TSTL, VSAL, DCE1, DCE2, and CCE1 through CCE8) may be a single layer or a multilayer made of one or more selected from among molybdenum (Mo), aluminum (Al), chromium (Cr), gold (Au), titanium (Ti), nickel (Ni), neodymium (Nd), copper (Cu), and alloys thereof.

As illustrated in FIG. 13, the scan write wiring GWL may be electrically connected to the fourth sub-gate electrode G42 through the first gate contact hole GCT1 penetrating the second gate insulating layer 123 and the interlayer insulating layer 124.

As illustrated in FIG. 17, the scan write wiring GWL may be electrically connected to the eighth sub-gate electrode G112 through a third gate contact hole GCT3 penetrating the second gate insulating layer 123 and the interlayer insulating layer 124.

The second gate electrode G2, the third sub-gate electrode G41, the fourth sub-gate electrode G42, the ninth gate electrode G9, the seventh sub-gate electrode G111, and the eighth sub-gate electrode G112 are integrally formed with the first gate connection electrode GCE1. In addition, the first gate connection electrode GCE1 may be electrically connected to the scan write wiring GWL through the first gate contact hole GCT1 and the third gate contact hole GCT3. Accordingly, the second transistor T2, the third and fourth sub-transistors T41 and T42 of the fourth transistor T4, the ninth transistor T9, and the seventh and eighth sub-transistors T111 and T112 of the eleventh transistor T11 may be turned on based on a scan write signal of the scan write wiring GWL.

As illustrated in FIG. 14, the scan initialization wiring GIL may be electrically connected to the second gate connection electrode GCE2 through the second gate contact hole GCT2 penetrating the second gate insulating layer 123 and the interlayer insulating layer 124.

The first sub-gate electrode G31, the second sub-gate electrode G32, the fifth sub-gate electrode G101, and the sixth sub-gate electrode G102 are integrally formed with the second gate connection electrode GCE2. In addition, the second gate connection electrode GCE2 may be electrically connected to the scan initialization wiring GIL through the second gate contact hole GCT2. Accordingly, the first and second sub-transistors T31 and T32 of the third transistor T3 and the fifth and sixth sub-transistors T101 and T102 of the tenth transistor T10 may be turned on based on a scan initialization signal of the scan initialization wiring GIL.

As illustrated in FIG. 20, the PWM emission wiring PWEL may be electrically connected to the sixth gate connection electrode GCE6 through the fourteenth contact hole CT14 penetrating the second gate insulating layer 123 and the interlayer insulating layer 124.

The sixth gate connection electrode GCE6 is integrally formed with the fifth gate electrode G5, the sixth gate electrode G6, the twelfth gate electrode G12, and the fourteenth gate electrode G14. Accordingly, the fifth transistor T5, the sixth transistor T6, the twelfth transistor T12, and the fourteenth transistor T14 may be turned on based on a PWM emission signal of the PWM emission wiring PWEL.

As illustrated in FIG. 16, the scan control wiring GCL may be electrically connected to the third gate connection electrode GCE3 through the eighth contact hole CT8 penetrating the second gate insulating layer 123 and the interlayer insulating layer 124.

The third gate connection electrode GCE3 is integrally formed with the seventh gate electrode G7, the thirteenth gate electrode G13, the ninth sub-gate electrode G161, the tenth sub-gate electrode G162, and the eighteenth gate electrode G18. Accordingly, the seventh transistor T7, the thirteenth transistor T13, the ninth and tenth sub-transistors T161 and T162 of the sixteenth transistor T16, and the eighteenth transistor T18 may be turned on based on a scan control signal of the scan control wiring GCL.

As illustrated in FIG. 20, the PAM emission wiring PAEL may be electrically connected to the fifth gate connection electrode GCE5 through the nineteenth contact hole CT19 penetrating the second gate insulating layer 123 and the interlayer insulating layer 124.

The fifth gate connection electrode GCE5 is integrally formed with the seventeenth gate electrode G17. Accordingly, the seventeenth transistor T17 may be turned on based on a PAM emission signal of the PAM emission wiring PAEL.

As illustrated in FIG. 14, the initialization voltage wiring VIL may be electrically connected to the second sub-drain electrode D32 through the first power contact hole VCT1 penetrating the first gate insulating layer 122, the second gate insulating layer 123, and the interlayer insulating layer 124.

The second sub-drain electrode D32 is connected to the sixth sub-drain electrode D102.

As illustrated in FIG. 16, the initialization voltage wiring VIL may be electrically connected to the tenth sub-drain electrode D162 and the eighteenth source electrode S18 through the ninth contact hole CT9 penetrating the first gate insulating layer 122, the second gate insulating layer 123, and the interlayer insulating layer 124.

As illustrated in FIG. 20, the initialization voltage wiring VIL may be electrically connected to the sixth capacitor electrode CE6 through the eighteenth contact hole CT18 penetrating the interlayer insulating layer 124.

Accordingly, the third transistor T3, the sixteenth transistor T16, the third capacitor PC3, and the eighteenth transistor T18 may be electrically connected to the initialization voltage wiring VIL that supplies an initialization voltage.

As illustrated in FIG. 15, the first power main wiring VDL11 may be electrically connected to the fifth source electrode S5 and the thirteenth source electrode S13 through the second power contact hole VCT2 penetrating the first gate insulating layer 122, the second gate insulating layer 123, and the interlayer insulating layer 124.

The first power sub-wiring VDL12 may be electrically connected to the first power main wiring VDL11 through the third power contact hole VCT3 penetrating the first planarization layer 125 and the first auxiliary insulating layer 125'. That is, the first power wiring VDL1 that supplies the first power voltage PWM_VDD may include the first power main wiring VDL11 and the first power sub-wiring VDL12.

Accordingly, the fifth transistor T5 and the thirteenth transistor T13 may be electrically connected to the first power wiring VDL1.

As illustrated in FIG. 16, the gate voltage wiring VGHL may be electrically connected to the seventh source electrode S7 through the seventh contact hole CT7 penetrating the first gate insulating layer 122, the second gate insulating layer 123, and the interlayer insulating layer 124.

As illustrated in FIG. 21, the test signal wiring TSTL may be electrically connected to the nineteenth gate electrode G19 through the twenty-third contact hole CT23 penetrating the second gate insulating layer 123 and the interlayer insulating layer 124.

The third power auxiliary wiring VSAL that supplies the third power voltage VSS may be electrically connected to the nineteenth drain electrode D19 through the twenty-fourth contact hole CT24 penetrating the first gate insulating layer 122, the second gate insulating layer 123, and the interlayer insulating layer 124.

As illustrated in FIG. 13, the first data connection electrode DCE1 may be electrically connected to the second source electrode S2 through the first data contact hole DCT1 penetrating the first gate insulating layer 122, the second gate insulating layer 123, and the interlayer insulating layer 124.

The PWM data wiring PWM_DL may be electrically connected to the first data connection electrode DCE1 through the second data contact hole DCT2 penetrating the first planarization layer 125 and the first auxiliary insulating layer 125'.

As illustrated in FIG. 17, the second data connection electrode DCE2 may be electrically connected to the ninth source electrode S9 through the third data contact hole DCT3 penetrating the first gate insulating layer 122, the second gate insulating layer 123, and the interlayer insulating layer 124.

The PAM data wiring PAM_DL may be electrically connected to the second data connection electrode DCE2 through the fourth data contact hole DCT4 penetrating the first planarization layer 125 and the first auxiliary insulating layer 125'.

As illustrated in FIG. 14, the first connection electrode CCE1 may be electrically connected to the first gate electrode G1 through the first contact hole CT1 penetrating the second gate insulating layer 123 and the interlayer insulating layer 124.

In addition, the first connection electrode CCE1 may be electrically connected to the fourth sub-drain electrode D42 through a second contact hole CT2 penetrating the first gate insulating layer 122, the second gate insulating layer 123, and the interlayer insulating layer 124. The fourth sub-drain electrode D42 is connected to the first sub-source electrode S31. Accordingly, the gate electrode G1 of the first transistor T1 may be electrically connected to the third transistor T3 and the fourth transistor T4.

As illustrated in FIG. 15, the second connection electrode CCE2 may be electrically connected to the thirteenth drain electrode D13 through the third contact hole CT3 penetrating the first gate insulating layer 122, the second gate insulating layer 123, and the interlayer insulating layer 124.

As illustrated in FIG. 19, the second connection electrode CCE2 may be electrically connected to the fourteenth drain electrode D14 through the fourth contact hole CT4 penetrating the first gate insulating layer 122, the second gate insulating layer 123, and the interlayer insulating layer 124.

In addition, the second connection electrode CCE2 may be electrically connected to the fourth capacitor electrode CE4 through a fifteenth contact hole CT15 penetrating the interlayer insulating layer 124.

Accordingly, the second node N2 to which the thirteenth transistor T13, the fourteenth transistor T14, and the second capacitor PC2 are connected may be provided.

As illustrated in FIG. 16, the fourth connection electrode CCE4 may be electrically connected to the sixteenth source electrode S161 through the tenth contact hole CT10 penetrating the first gate insulating layer 122, the second gate insulating layer 123, and the interlayer insulating layer 124.

As illustrated in FIG. 20, the fourth connection electrode CCE4 may be electrically connected to the fourth gate connection electrode GCE4 through the seventeenth contact hole CT17 penetrating the second gate insulating layer 123 and the interlayer insulating layer 124.

The fourth gate connection electrode GCE4 is integrally formed with the fifth capacitor electrode CE5 and the fifteenth gate electrode G15.

Accordingly, the third node N3 to which the sixteenth transistor T16, the third capacitor PC3, and the fifteenth transistor T15 are connected may be provided.

As illustrated in FIGS. 17 and 18, the fifth connection electrode CCE5 may be electrically connected to the twelfth source electrode S12 through the eleventh contact holes CT11 penetrating the first gate insulating layer 122, the second gate insulating layer 123, and the interlayer insulating layer 124.

The twelfth source electrode S12 is connected to the fourteenth source electrode S14.

As illustrated in FIG. 18, the sixth connection electrode CCE6 may be electrically connected to the third capacitor electrode CE3 through a twelfth contact hole CT12 penetrating the second gate insulating layer 123 and the interlayer insulating layer 124.

The third capacitor electrode CE3 is integrally formed with the eighth gate electrode G8.

The sixth connection electrode CCE6 may be electrically connected to the fifth sub-source electrode S101 and the eighth sub-drain electrode D112 through a thirteenth contact hole CT13 penetrating the first gate insulating layer 122, the second gate insulating layer 123, and the interlayer insulating layer 124.

The fifth sub-source electrode S101 is connected to the eighth sub-drain electrode D112.

Accordingly, the second capacitor PC2, the gate electrode G8 of the eighth transistor T8, the tenth transistor T10, and the eleventh transistor T11 may be connected to each other.

As illustrated in FIG. 19, the seventh connection electrode CCE7 may be electrically connected to the seventeenth drain electrode D17 through the sixteenth contact holes CT16 penetrating the first gate insulating layer 122, the second gate insulating layer 123, and the interlayer insulating layer 124.

The seventeenth drain electrode D17 is connected to the eighteenth drain electrode D18.

As illustrated in FIG. 21, the eighth connection electrode CCE8 may be electrically connected to the nineteenth source electrode S19 through the twenty-first contact hole CT21 penetrating the first gate insulating layer 122, the second gate insulating layer 123, and the interlayer insulating layer 124.

The first planarization layer 125 covering the third conductive layer CDL3 (VIL, GIL, GWL, PWEL, VDL11, VGHL, SWPL, GCL, PAEL, TSTL, VSAL, DCE1, DCE2, and CCE1 through CCE8) may be made of an organic layer such as acryl resin, epoxy resin, phenolic resin, polyamide resin, or polyimide resin.

The first planarization layer 125 may be covered with the first auxiliary insulating layer 125'. The first auxiliary insulating layer 125' may be made of a silicon nitride layer, a silicon oxynitride layer, a silicon oxide layer, a titanium oxide layer, or an aluminum oxide layer.

The first planarization layer 125 or the first planarization layer 125 and the first auxiliary insulating layer 125' may be referred to as a fourth insulating layer.

The fourth conductive layer CDL4 (PWM_DL, VDL12, PAM_DL, ANDE1 and VDCE) disposed on the first planarization layer 125 may include wirings extending in the second direction DR2, the first anode connection electrode ANDE1, and the second power connection electrode VDCE.

The wirings extending in the second direction DR2 may include the PWM data wiring PWM_DL, the first power sub-wiring VDL12, and the PAM data wiring PAM_DL.

The fourth conductive layer CDL4 (PWM_DL, VDL12, PAM_DL, ANDE1, and VDCE) may be a single layer or a multilayer made of one or more selected from among molybdenum (Mo), aluminum (Al), chromium (Cr), gold (Au), titanium (Ti), nickel (Ni), neodymium (Nd), copper (Cu), and alloys thereof.

As illustrated in FIG. 13, the PWM data wiring PWM_DL may be electrically connected to the first data connection electrode DCE1 through the second data contact hole DCT2 penetrating the first planarization layer 125 and the first auxiliary insulating layer 125'. The first data connection electrode DCE1 may be electrically connected to the second source electrode S2 through the first data contact hole DCT1. Accordingly, the second transistor T2 may be electrically connected to the PWM data wiring PWM_DL.

As illustrated in FIG. 17, the PAM data wiring PAM_DL may be electrically connected to the second data connection electrode DCE2 through the fourth data contact hole DCT4 penetrating the first planarization layer 125 and the first auxiliary insulating layer 125'. The second data connection electrode DCE2 may be electrically connected to the ninth source electrode S9 through the third data contact hole DCT3. Accordingly, the ninth transistor T9 may be electrically connected to the PAM data wiring PAM_DL.

As illustrated in FIG. 15, the first power sub-wiring VDL12 may be electrically connected to the first power main wiring VDL11 through the third power contact hole VCT3 penetrating the first planarization layer 125 and the first auxiliary insulating layer 125'.

Here, the third power contact hole VCT3 may overlap the second power contact hole VCT2 in the third direction DR3. For example, the area of the third power contact hole VCT3 may be larger than the area of the second power contact hole VCT2.

As illustrated in FIG. 21, the first anode connection electrode ANDE1 may be electrically connected to the seventh connection electrode CCE7 through the twentieth contact hole CT20 penetrating the first planarization layer 125 and the first auxiliary insulating layer 125'. The seventh connection electrode CCE7 may be electrically connected to the seventeenth drain electrode D17 through the sixteenth contact holes CT16. The seventeenth drain electrode D17 is connected to the eighteenth drain electrode D18.

In addition, the first anode connection electrode ANDE1 may be electrically connected to the eighth connection electrode CCE8 through the twenty-second contact hole CT22 penetrating the first planarization layer 125 and the first auxiliary insulating layer 125'. The eighth connection electrode CCE8 may be electrically connected to the nineteenth source electrode S19 through the twenty-first contact hole CT21.

Accordingly, the first anode connection electrode ANDE1 may be electrically connected to the seventeenth transistor T17, the eighteenth transistor T18, and the nineteenth transistor T19.

As illustrated in FIG. 17, the second power connection electrode VDCE may be electrically connected to the fifth connection electrode CCE5 through the fourth power contact hole VCT4 penetrating the first planarization layer 125 and the first auxiliary insulating layer 125'. The fifth connection electrode CCE5 may be electrically connected to the twelfth source electrode S12 and the fourteenth source electrode S14 through the eleventh contact holes CT11.

The second power connection electrode VDCE may be electrically connected to the second power wiring VDL2 through a fifth power contact hole VCT5 penetrating the second planarization layer 126.

Accordingly, the twelfth transistor T12 and the fourteenth transistor T14 may be electrically connected to the second power wiring VDL2.

The second planarization layer 126 covering the fourth conductive layer CDL4 (PWM_DL, VDL12, PAM_DL, ANDE1 and VDCE) may be made of an organic layer such as acryl resin, epoxy resin, phenolic resin, polyamide resin, or polyimide resin.

The second planarization layer 126 may be covered with the second auxiliary insulating layer 126'. The second auxiliary insulating layer 126' may be made of a silicon nitride layer, a silicon oxynitride layer, a silicon oxide layer, a titanium oxide layer, or an aluminum oxide layer.

The second planarization layer 126 or the second planarization layer 126 and the second auxiliary insulating layer 126' may be referred to as a fifth insulating layer.

The fifth conductive layer CDL5 (VDL2 and ANDE2) disposed on the second planarization layer 126 may include the second power wiring VDL2 transmitting the second power voltage PAM_VDD and the second anode connection electrode ANDE2 overlapping the first anode connection electrode ANDE1.

As illustrated in FIG. 18, the second power wiring VDL2 may be connected to the second power connection electrode VDCE through the fifth power contact hole VCT5 penetrating the second planarization layer 126 and the second auxiliary insulating layer 126'. The second power connection electrode VDCE may be electrically connected to the fifth connection electrode CCE5 through the fourth power contact hole VCT4, and the fifth connection electrode CCE5 may be electrically connected to the twelfth source electrode S12 and the fourteenth source electrode S14 through the eleventh contact holes CT11.

Accordingly, the twelfth transistor T12 and the fourteenth transistor T14 may be electrically connected to the second power wiring VDL2.

As illustrated in FIG. 21, the second anode connection electrode ANDE2 may be electrically connected to the first anode connection electrode ANDE1 through the first anode connection hole ANDH1 penetrating the second planarization layer 126 and the second auxiliary insulating layer 126'.

The fifth conductive layer CDL5 (VDL2 and ANDE2) may be a single layer or a multilayer made of one or more selected from among molybdenum (Mo), aluminum (Al), chromium (Cr), gold (Au), titanium (Ti), nickel (Ni), neodymium (Nd), copper (Cu), and alloys thereof.

The third planarization layer 127 covering the fifth conductive layer CDL5 (VDL2 and ANDE2) may be made of an organic layer such as acryl resin, epoxy resin, phenolic resin, polyamide resin, or polyimide resin.

The third planarization layer 127 may be covered with the third auxiliary insulating layer 127'. The third auxiliary insulating layer 127' may be made of a silicon nitride layer, a silicon oxynitride layer, a silicon oxide layer, a titanium oxide layer, and/or an aluminum oxide layer.

The third planarization layer 127 or the third planarization layer 127 and the third auxiliary insulating layer 127' may be referred to as a sixth insulating layer.

As illustrated in FIG. 12, the electrode layer ELEL disposed on the circuit layer 120 may include the anode AND and the cathode CTD disposed in the emission area EA1, EA2, or EA3 of each of the subpixels SP1 through SP3 and the third power wiring VSL connected to the cathode CTD.

The third power wiring VSL may be disposed in a mesh shape extending in the first direction DR1 and the second direction DR2.

As illustrated in FIG. 21, the anode AND may be electrically connected to the second anode connection electrode ANDE2 through the second anode contact hole ANDH2 penetrating the third planarization layer 127 and the third auxiliary insulating layer 127'.

The second anode connection electrode ANDE2 may be electrically connected to the first anode connection electrode ANDE1 through the first anode contact hole ANDH1, and the first anode connection electrode ANDE1 may be electrically connected to the seventh connection electrode CCE7 through the twentieth contact hole CT20.

The seventh connection electrode CCE7 may be electrically connected to the seventeenth drain electrode D17 and the eighteenth drain electrode D18 through the sixteenth contact holes CT16 and may be electrically connected to the nineteenth source electrode S19 through the twenty-second contact hole CT22.

Accordingly, the anode AND may be electrically connected to the seventeenth transistor T17, the eighteenth transistor T18, and the nineteenth transistor T19.

The electrode layer ELEL (VSL, CTD, and AND) may be a single layer or a multilayer made of one or more selected from among molybdenum (Mo), aluminum (Al), chromium (Cr), gold (Au), titanium (Ti), nickel (Ni), neodymium (Nd), copper (Cu), and alloys thereof.

For example, the electrode layer ELEL (VSL, CTD, and AND) may include a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. As another example, the electrode layer ELEL (VSL, CTD and AND) may have a double layer structure of Al/Ti.

The backplane substrate 101 may further include an anode pad ANDP disposed on the anode AND and a cathode pad CTDP disposed on the cathode CTD.

The anode pad ANDP and the cathode pad CTDP may be made of a transparent conductive material (TCO) such as ITO or IZO.

The anode pad ANDP and the cathode pad CTDP may fix a light emitting element LE more securely and reduce corrosion of or damage to the anode AND and the cathode CTD.

As illustrated in FIGS. 4 and 13 through 20, the backplane substrate 101 may further include the bank layer 131 and 132 corresponding to the area around the emission area EA1, EA2 or EA3 of each of the subpixels SP1 through SP3.

The bank layers 131 and 132 may include the bank planarization layer 131 and the bank insulating layer 132 covering the bank planarization layer 131.

The anode pad ANDP may be electrically connected and bonded to the first contact electrode CTE1 of the light emitting element LE through the anode contact electrode ANDC.

The cathode pad CTDP may be electrically connected and bonded to the second contact electrode CTE2 of the light emitting element LE through the cathode contact electrode CTDC.

The anode contact electrode ANDC and the cathode contact electrode CTDC may be made of a conductive adhesive material.

Because the light emitting element LE has been described above with reference to FIG. 4, a redundant description thereof will be omitted.

Figure 22:
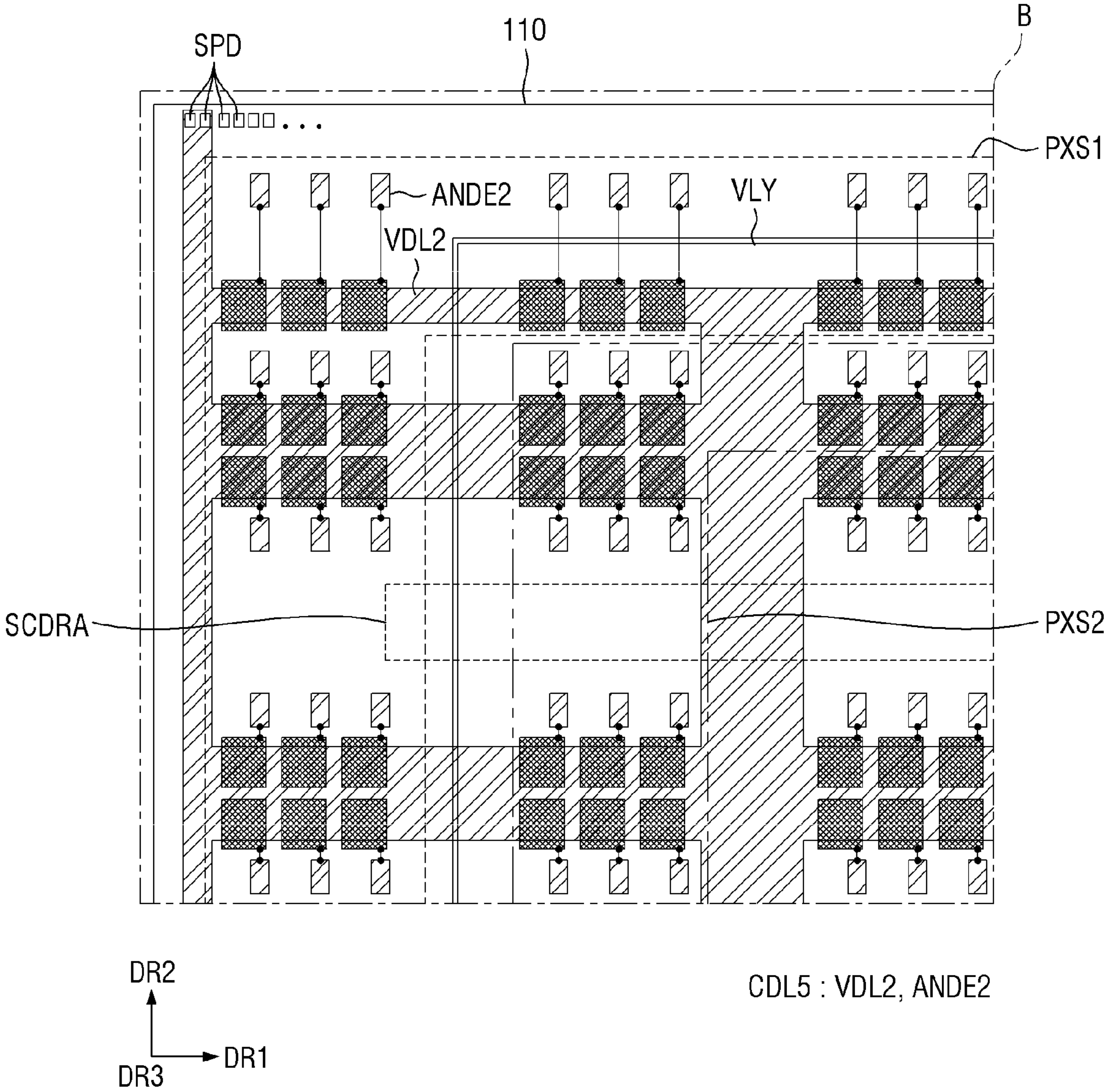
FIG. 22 is a plan view illustrating the fifth conductive layer and a valley in a portion B of FIG. 1.
Figure 23:
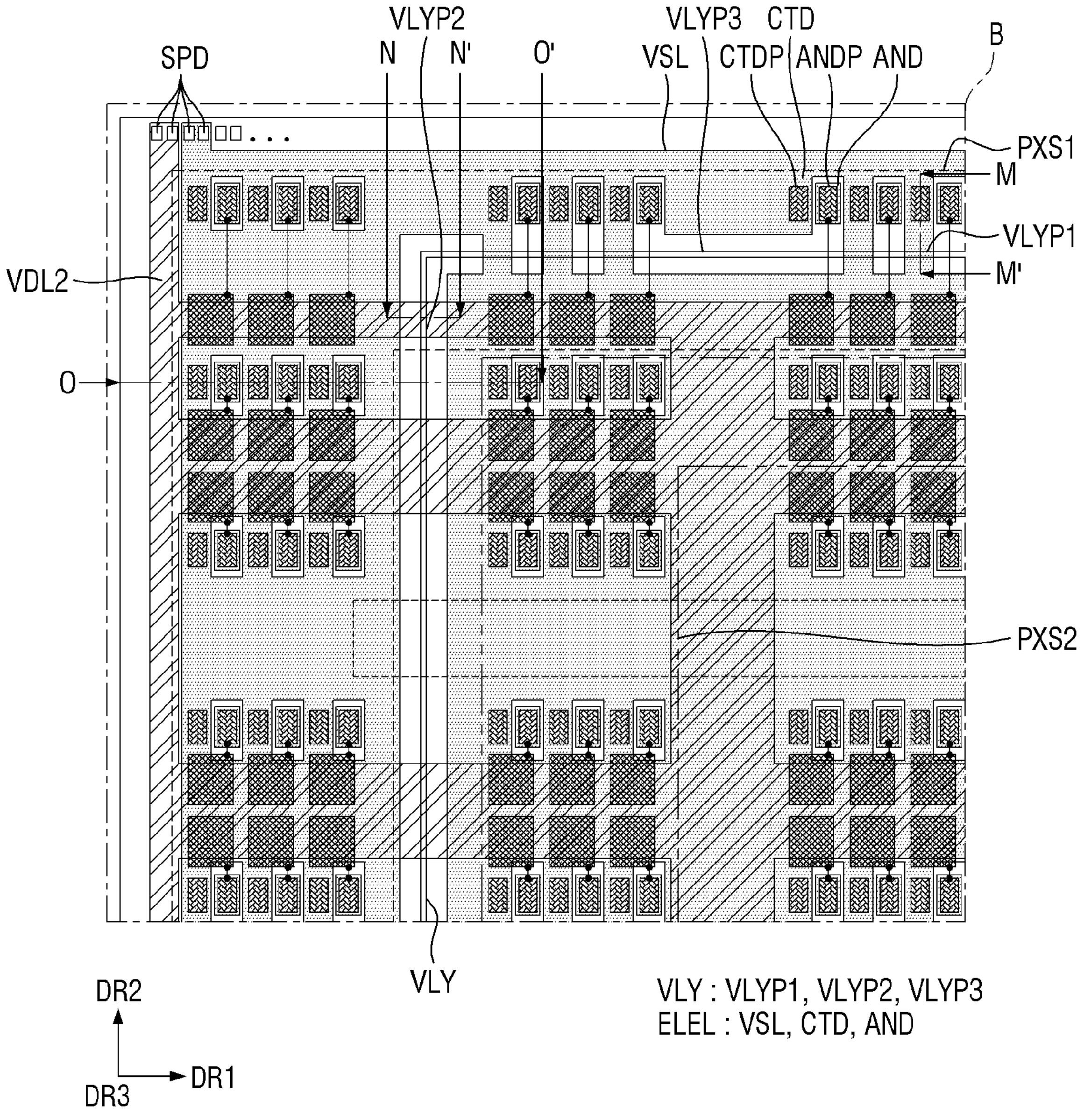
FIG. 23 is a plan view of the portion B of FIG. 1.

FIG. 22 is a plan view illustrating the fifth conductive layer CDL5 and the valley VLY in portion B of FIG. 1. FIG. 23 is a plan view of portion B of FIG. 1.

Referring to FIG. 22, the fifth conductive layer CDL5 may include the second power wiring VDL2 and the second anode connection electrodes ANDE2.

The second power wiring VDL2 is designed to transmit the second power voltage PAM_VDD to the pixel drivers PXD and may be disposed in a mesh shape extending in the first direction DR1 and the second direction DR2.

The second power wiring VDL2 may overlap the pixel drivers PXD corresponding to the subpixels SP1 through SP3, respectively.

A portion of the second power wiring VDL2 may extend toward an edge of the support substrate 110 and may be electrically connected to at least one of signal pads SPD disposed adjacent to the edge of the support substrate 110.

The second anode connection electrode ANDE2 may be disposed in the emission area EA1, EA2, or EA3 of each of the subpixels SP1 through SP3.

In each of the subpixels SP1 through SP3, the second anode connection electrode ANDE2 may be electrically connected to the pixel driver PXD.

According to one or more embodiments, the backplane substrate 101 includes the valley VLY shaped similarly to the edges of the support substrate 110.

As described above with reference to FIG. 1, the display device 10 according to the one or more embodiments includes the pixels PX, and each of the pixels PX includes two or more adjacent subpixels SP1 through SP3 from among the subpixels SP1 through SP3.

The pixels PX may include the first pixels PXS1 (see FIG. 1) closest to the edges of the support substrate 110 and the second pixels PXS2 (see FIG. 1) adjacent to the first pixels PXS1.

The second pixels PXS2 are adjacent to the edges of the support substrate 110 and are surrounded by the first pixels PXS1. That is, the first pixels PXS1 are disposed between the second pixels PXS2 and the edges of the support substrate 110.

The valley VLY may be disposed at the boundary between the emission areas of the first pixels PXS1 and the emission areas of the second pixels PXS2.

For example, as illustrated in FIG. 22, the second anode connection electrodes ANDE2 respectively corresponding to the emission areas EA1 through EA3 may be arranged side by side along the first direction DR1 and may be spaced from each other in the second direction DR2 with at least one pixel driver PXD interposed between them.

In this case, some edges of the valley VLY that are disposed between the first pixels PXS1 and the second pixels PXS2 in the second direction DR2 may cross between the second anode connection electrodes ANDE2 of the first pixels PXS1 and the pixel drivers PXD of the first pixels PXS1.

In this case, under the arrangement conditions of the subpixels SP1 through SP3 illustrated in FIG. 22, some edges of the valley VLY that are disposed between the first pixels PXS1 and the second pixels PXS2 in the second direction DR2 may be more adjacent to the edges of the support substrate 110. Accordingly, the placement range of the first protective layer PTL1 may be widened by the valley VLY. In addition, while the emission areas EA1 through EA3 of the first pixels PXS1 are adjacent to the edges of the support substrate 110, the pixel drivers PXD of the first pixels PXS1 may be protected by the first protective layer PTL1.

However, this is only an example, and some edges of the valley VLY that are disposed between the first pixels PXS1 and the second pixels PXS2 in the second direction DR2 may also cross between the pixel drivers PXD of the first pixels PXS1 and the second anode connection electrodes ANDE2 of the second pixels PXS2 depending on the arrangement conditions of the subpixels SP1 through SP3.

A portion of the second power wiring VDL2 disposed between the first pixels PXS1 and the second pixels PXS2 may overlap the valley VLY.

Further, according to one or more embodiments, the scan driver SCDR (see FIG. 5) supplying gate signals to some of the transistors T1 through T9 of the pixel drivers PXD may be divided into a plurality of drivers disposed in an area SCDRA between the pixel drivers PXD of the subpixels SP1 through SP3.

That is, because the scan driver SCDR is not disposed as a whole in an area between the emission areas EA1 through EA3 of the first pixels PXS1 and the edges of the support substrate 110, a distance between the emission areas EA1 through EA3 of the first pixels PXS1 and the edges of the support substrate 110 may be reduced to less than a distance between the pixels PX. Accordingly, this may make it easy to implement a tiled display device TD (see FIG. 36) composed of display devices assembled in tiles.

Referring to FIG. 23, the electrode layer ELEL may include the third power wiring VSL, the cathodes CTD, and the anodes AND.

The third power wiring VSL is designed to transmit the third power voltage VSS to the cathodes CTD and may be disposed in a mesh shape extending in the first direction DR1 and the second direction DR2.

The third power wiring VSL may overlap the pixel drivers PXD corresponding to the subpixels SP1 through SP3, respectively.

A portion of the third power wiring VSL may extend toward an edge of the support substrate 110 and may be electrically connected to at least one of the signal pads SPD disposed adjacent to the edge of the support substrate 110.

The cathode CTD is disposed in the emission area EA1, EA2, or EA3 of each of the subpixels SP1 through SP3 and is connected to the third power wiring VSL. That is, the cathode CTD may be made of a portion of the third power wiring VSL that extends to the emission area EA1, EA2, or EA3 of one of the subpixels SP1 through SP3.

The anode AND is disposed in the emission area EA1, EA2, or EA3 of each of the subpixels SP1 through SP3 and is insulated from the third power wiring VSL. That is, the anode AND may be disposed in an island shape in the emission area EA1, EA2, or EA3 of each of the subpixels SP1 through SP3 and may be spaced from the cathode CTD and the third power wiring VSL.

The anodes AND may overlap the second anode connection electrodes ANDE2.

The valley VLY may be disposed at the boundary between the emission areas of the first pixels PXS1 and the emission areas of the second pixels PXS2.

Accordingly, a portion of the third power wiring VSL disposed between the first pixels PXS1 and the second pixels PXS2 may overlap the valley VLY.

That is, the valley VLY may include a first valley portion VLYP1 overlapping the third power wiring VSL, a second valley portion VLYP2 overlapping the second power wiring VDL2, and a third valley portion VLYP3 other than the first valley portion VLYP1 and the second valley portion VLYP2.

The first valley portion VLYP1 may overlap the third power wiring VSL and/or the second power wiring VDL2 in the third direction DR3.

The second valley portion VLYP2 may not overlap the third power wiring VSL but may overlap the second power wiring VDL2 in the third direction DR3.

The third valley portion VLYP3 does not overlap the third power wiring VSL and the second power wiring VDL2 in the third direction DR3.

In addition, in one or more embodiments, the valley VLY may overlap some wirings disposed between the first pixels PXS1 and the second pixels PXS2 in the third direction DR3 from among the wirings VIL, GIL, GWL, PWEL, VDL11, VGHL, SWPL, GCL, PAEL, TSTL, and VSAL made of the third conductive layer CDL3 and extending in the first direction DR1.

In addition, the valley VLY may overlap some wirings disposed between the first pixels PXS1 and the second pixels PXS2 in the third direction DR3 from among the wirings PWM_DL, VDL12 and PAM_DL made of the fourth conductive layer CDL4 and extending in the second direction DR2.

Figure 24:
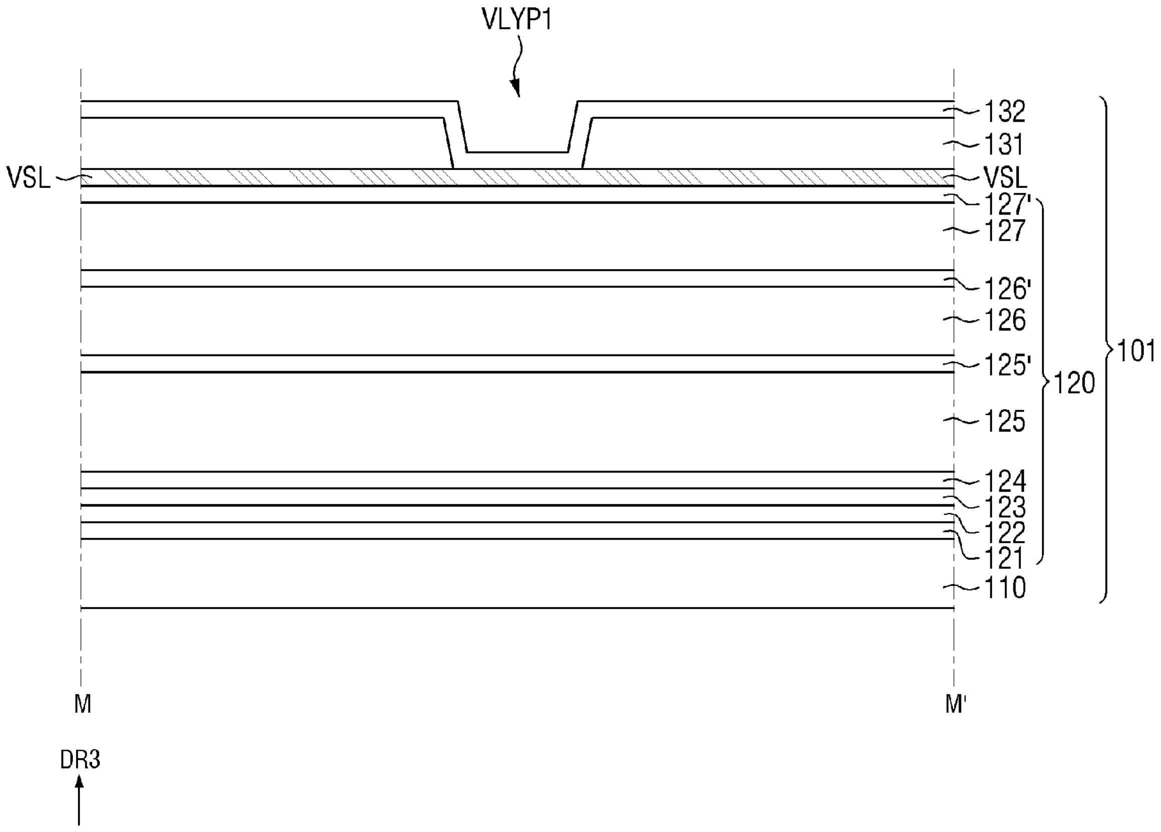
FIG. 24 is a cross-sectional view taken along the line M-M' of FIG. 23 according to one or more embodiments (e.g., a first embodiment)
Figure 25:
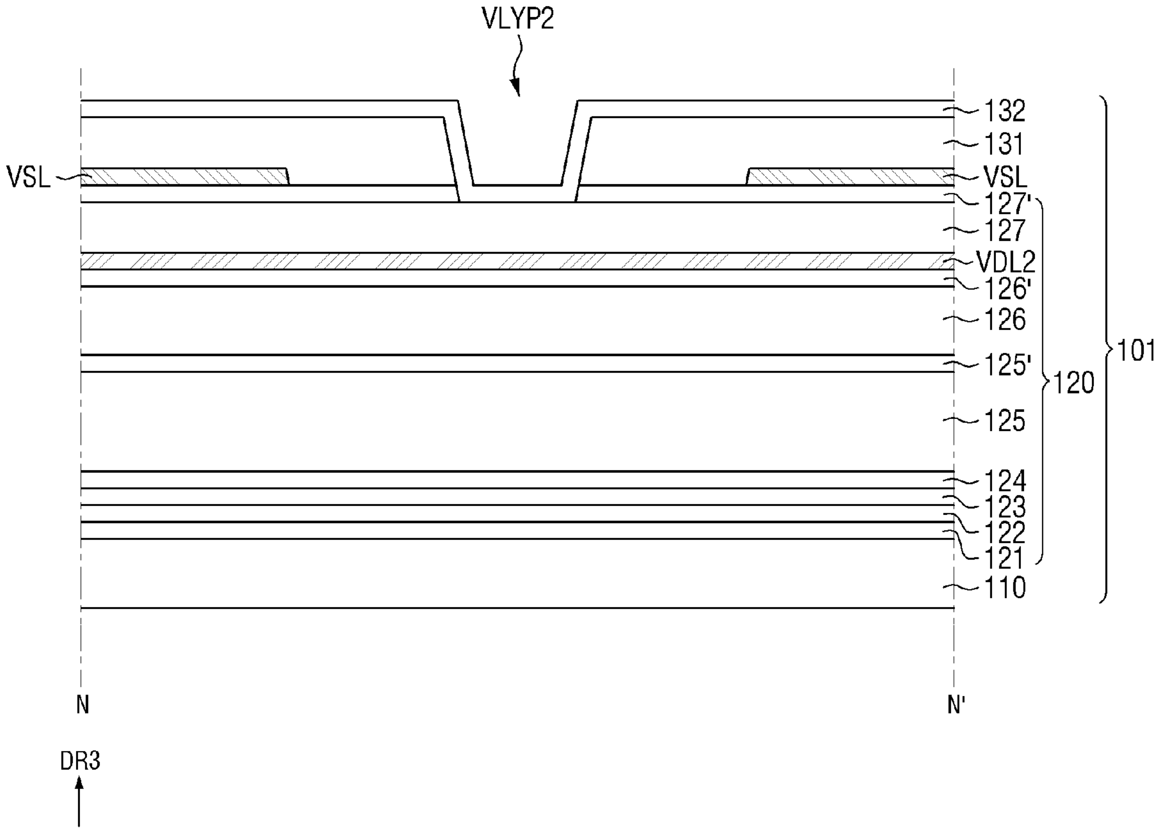
FIG. 25 is a cross-sectional view taken along the line N-N' of FIG. 23 according to one or more embodiments (e.g., the first embodiment)
Figure 26:
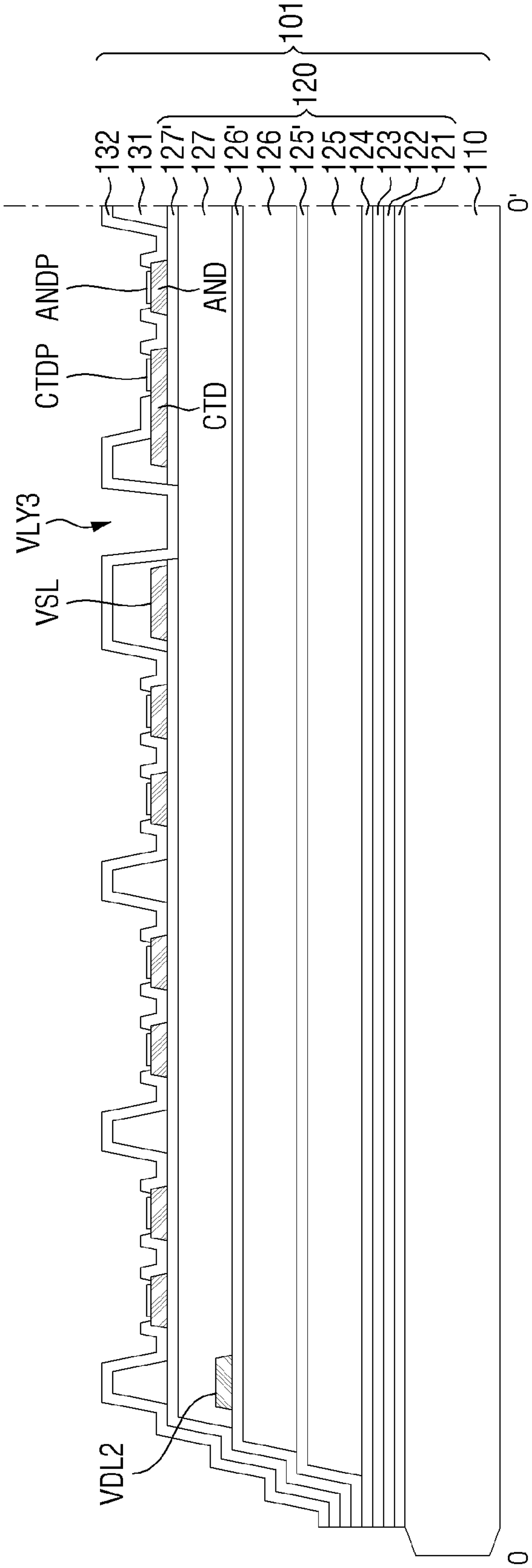
FIG. 26 is a cross-sectional view taken along the line O-O' of FIG. 23 according to one or more embodiments (e.g., the first embodiment)

FIG. 24 is a cross-sectional view taken along the line M-M' of FIG. 23 according to a first embodiment. FIG. 25 is a cross-sectional view taken along the line N-N' of FIG. 23 according to the first embodiment. FIG. 26 is a cross-sectional view taken along the line O-O' of FIG. 23 according to the first embodiment.

Referring to FIGS. 24, 25 and 26, a backplane substrate 101 of a display device 10 according to a first embodiment may include a support substrate 110, a circuit layer 120, an electrode layer ELEL, a bank layer 131 and 132, and a valley VLY.

The bank layer 131 and 132 is disposed on the circuit layer 120 and corresponds to an area around an emission area EA1, EA2, or EA3 of each of subpixels SP1 through SP3.

That is, the bank layer 131 and 132 includes a bank planarization layer 131 disposed around the emission area EA1, EA2, or EA3 of each of the subpixels SP1 through SP3 and a bank insulating layer 132 covering the bank planarization layer 131.

The bank insulating layer 132 may extend to edges of the emission area EA1, EA2, or EA3 of each of the subpixels SP1 through SP3. Accordingly, the bank insulating layer 132 may cover a portion of edges of an anode AND and a portion of edges of a cathode CTD overlapping the edges of each of the emission areas EA1 through EA3.

According to the first embodiment, the valley VLY may penetrate the bank planarization layer 131.

That is, as illustrated in FIG. 24, a first valley portion VLYP1 of the valley VLY that overlaps a third power wiring VSL may penetrate the bank planarization layer 131.

Accordingly, a portion of the third power wiring VSL that is disposed between first pixels PXS1 and second pixels PXS2 may contact the bank insulating layer 132 through the first valley portion VLYP1.

As illustrated in FIG. 25, a second valley portion VLYP2 of the valley VLY that overlaps a second power wiring VDL2 may penetrate the bank planarization layer 131.

As illustrated in FIG. 26, a third valley portion VLYP3 of the valley VLY other than the first valley portion VLYP1 and the second valley portion VLYP2 may penetrate the bank planarization layer 131.

The valley VLY is designed to limit the placement range of a first protective layer PTL1 (see FIG. 31) in the process of placing the first protective layer PTL1 using an inkjet coating method. Accordingly, as the depth of the valley VLY increases, the volume for accommodating the material of the first protective layer PTL1 may increase.

Second and third embodiments in which a portion of the valley VLY has a greater depth than the bank planarization layer 131 will now be described.

Figure 27:
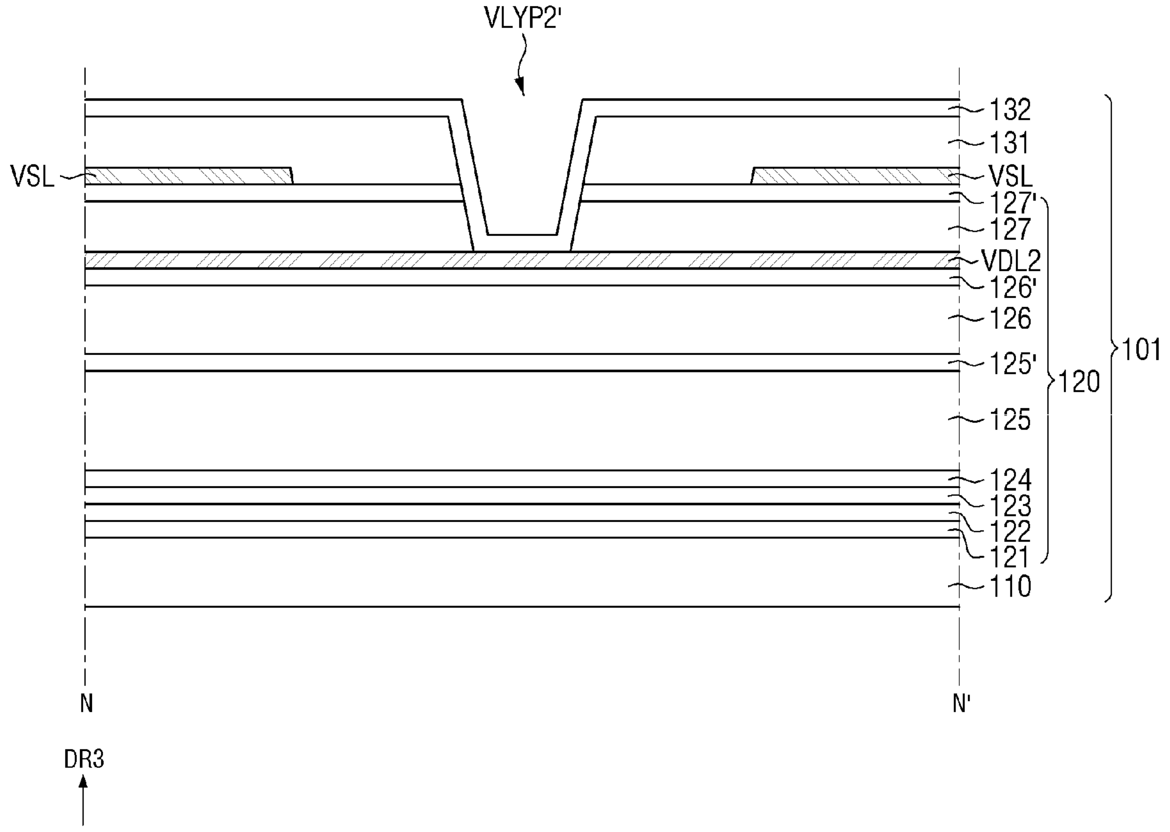
FIG. 27 is a cross-sectional view taken along the line N-N' of FIG. 23 according to one or more embodiments (e.g., a second embodiment)
Figure 28:
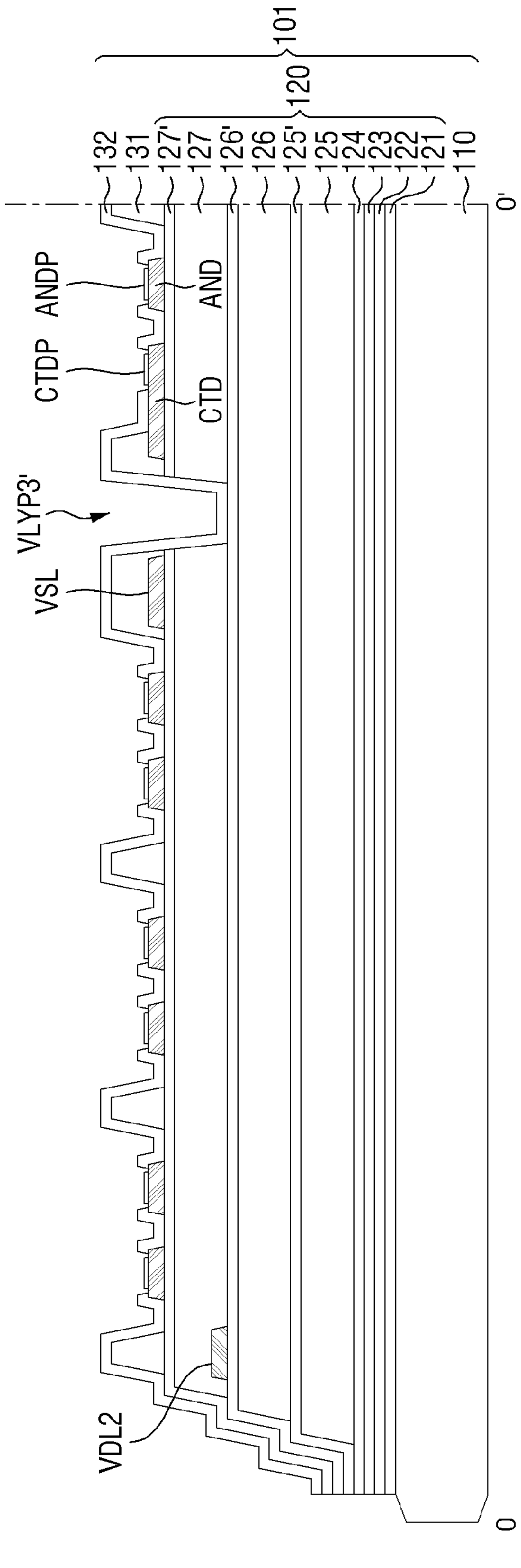
FIG. 28 is a cross-sectional view taken along the line O-O' of FIG. 23 according to one or more embodiments (e.g., the second embodiment)

FIG. 27 is a cross-sectional view taken along the line N-N' of FIG. 23 according to a second embodiment. FIG. 28 is a cross-sectional view taken along the line O-O' of FIG. 23 according to the second embodiment.

Referring to FIGS. 27 and 28, a backplane substrate 101 of a display device 10 according to the second embodiment is the same as that of the first embodiment except that a portion of a valley VLY penetrates a bank planarization layer 131 and a third planarization layer 127. Therefore, any redundant description will be omitted below.

According to the second embodiment, a second valley portion VLYP2' and a third valley portion VLYP3' of the valley VLY excluding a first valley portion VLYP1 that overlaps a third power wiring VSL made of an electrode layer ELEL may penetrate the bank planarization layer 131 and the third planarization layer 127.

As illustrated in FIG. 27, the second valley portion VLYP2' of the valley VLY which overlaps a second power wiring VDL2 may penetrate the bank planarization layer 131, the third auxiliary insulating layer 127', and the third planarization layer 127.

Accordingly, a portion of the second power wiring VDL2 that is disposed between first pixels PXS1 and second pixels PXS2 may contact a bank insulating layer 132 through the second valley portion VLYP2'.

As illustrated in FIG. 28, the third valley portion VLYP3' of the valley VLY excluding the first valley portion VLYP1 and the second valley portion VLYP2' may penetrate the bank planarization layer 131 and the third planarization layer 131.

Figure 29:
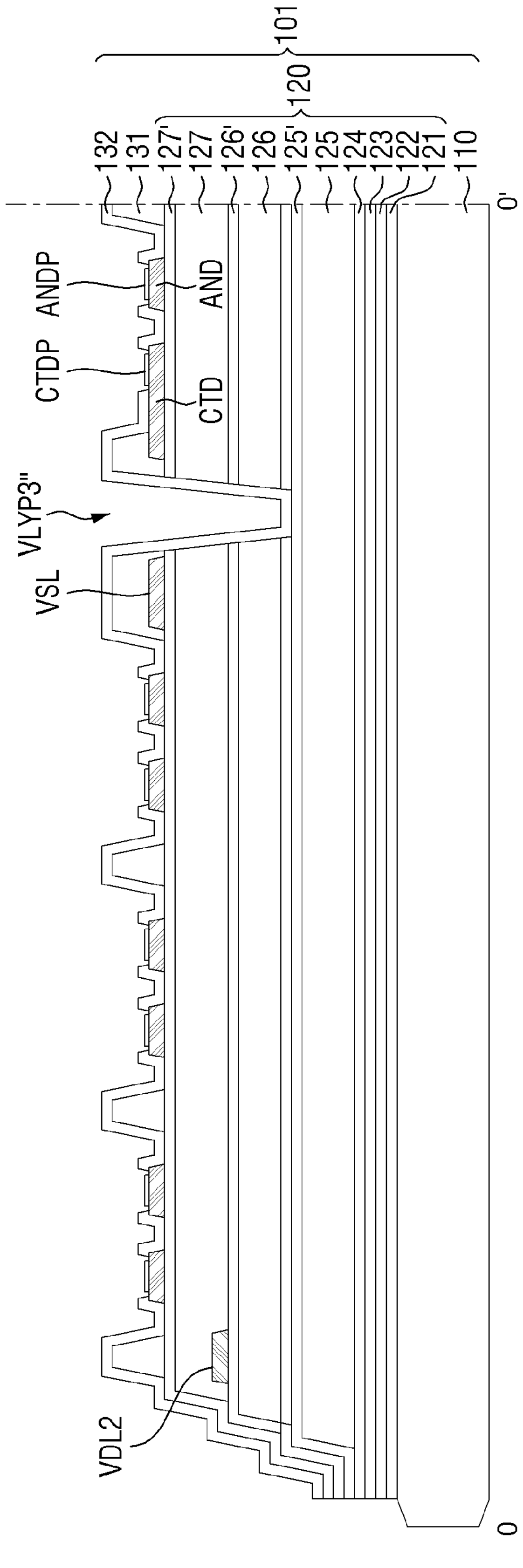
FIG. 29 is a cross-sectional view taken along the line O-O' of FIG. 23 according to one or more embodiments (e.g., a third embodiment)

FIG. 29 is a cross-sectional view taken along the line O-O' of FIG. 23 according to a third embodiment.

Referring to FIG. 29, a backplane substrate 101 of a display device 10 according to the third embodiment is the same as that of the first embodiment or the second embodiment except that a portion of a valley VLY penetrates a bank planarization layer 131, a third auxiliary insulating layer 127', a third planarization layer 127, a second auxiliary insulating layer 126', and a second planarization layer 126. Therefore, any redundant description will be omitted below.

According to the third embodiment, a third valley portion VLYP3" of the valley VLY that does not overlap a third power wiring VSL and a second power wiring VDL2 may penetrate the bank planarization layer 131, the third planarization layer 127, and the second planarization layer 126.

Figure 30:
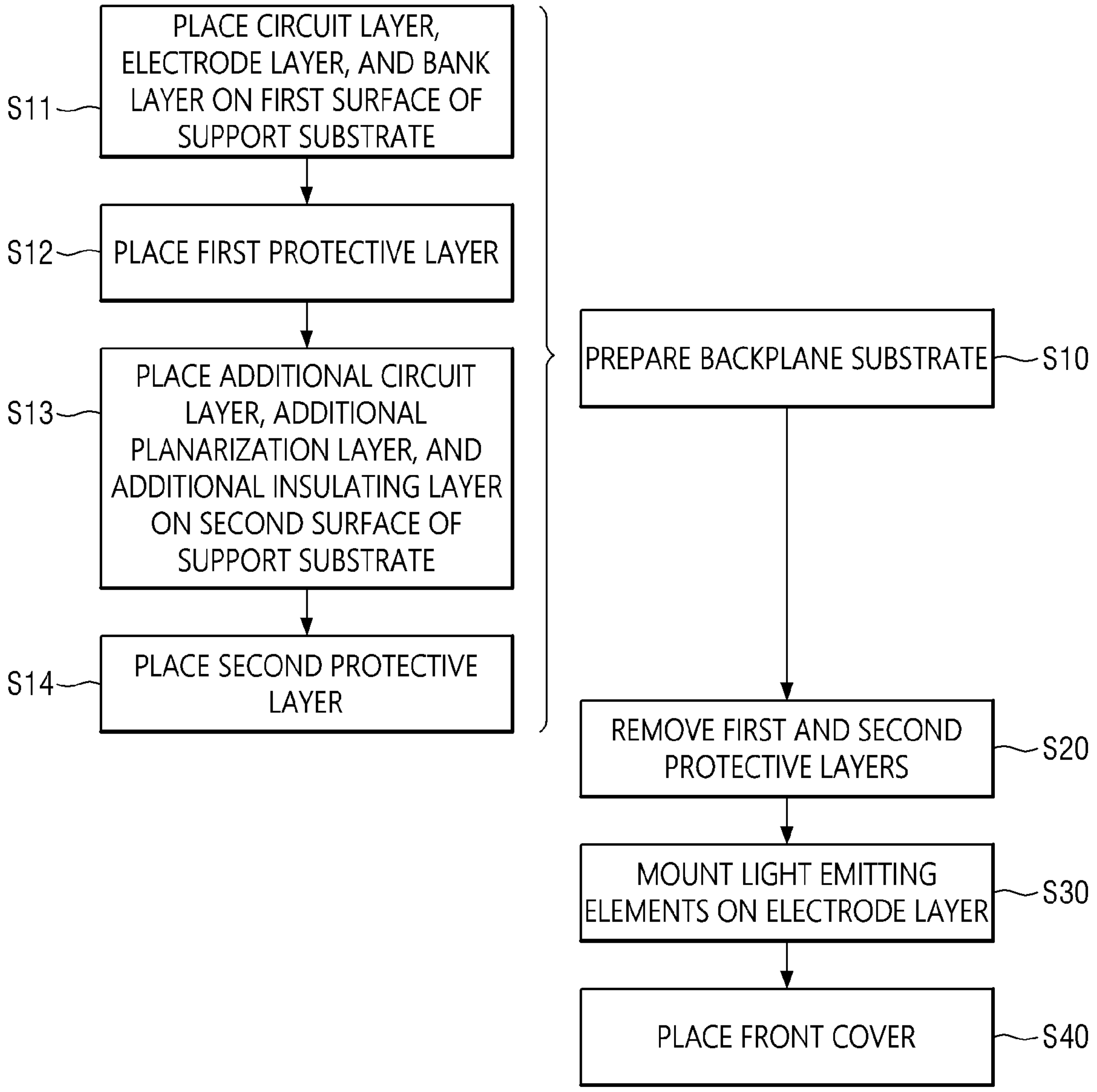
FIG. 30 is a flowchart illustrating a method of manufacturing a display device according to one or more embodiments.

FIG. 30 is a flowchart illustrating a method of manufacturing a display device according to one or more embodiments. FIGS. 31 through 35 are process diagrams illustrating operations of FIG. 30.

Referring to FIG. 30, the method of manufacturing the display device according to the described embodiment may include preparing a backplane substrate 101 having a first protective layer PTL1 and a second protective layer PTL2 on both surfaces thereof (operation S10), removing the first protective layer PTL1 and the second protective layer PTL2 from the backplane substrate 101 (operation S20), mounting light emitting elements LE on an electrode layer ELEL of the backplane substrate 101 (operation S30), and placing a front cover 102 (see FIG. 35) covering the light emitting elements LE (operation S40).

The preparing of the backplane substrate 101 (operation S10) may include placing a circuit layer 120, the electrode layer ELEL, and a bank layer 131 and 132 on a first surface of a support substrate 110 (operation S11), placing the first protective layer PTL1 on the bank layer 131 and 132 (operation S12), placing an additional circuit layer, an additional planarization layer, and an additional insulating layer on a second surface of the support substrate 110 (operation S13), and placing the second protective layer PTL2 on the additional insulating layer (operation S14).

Figure 31:
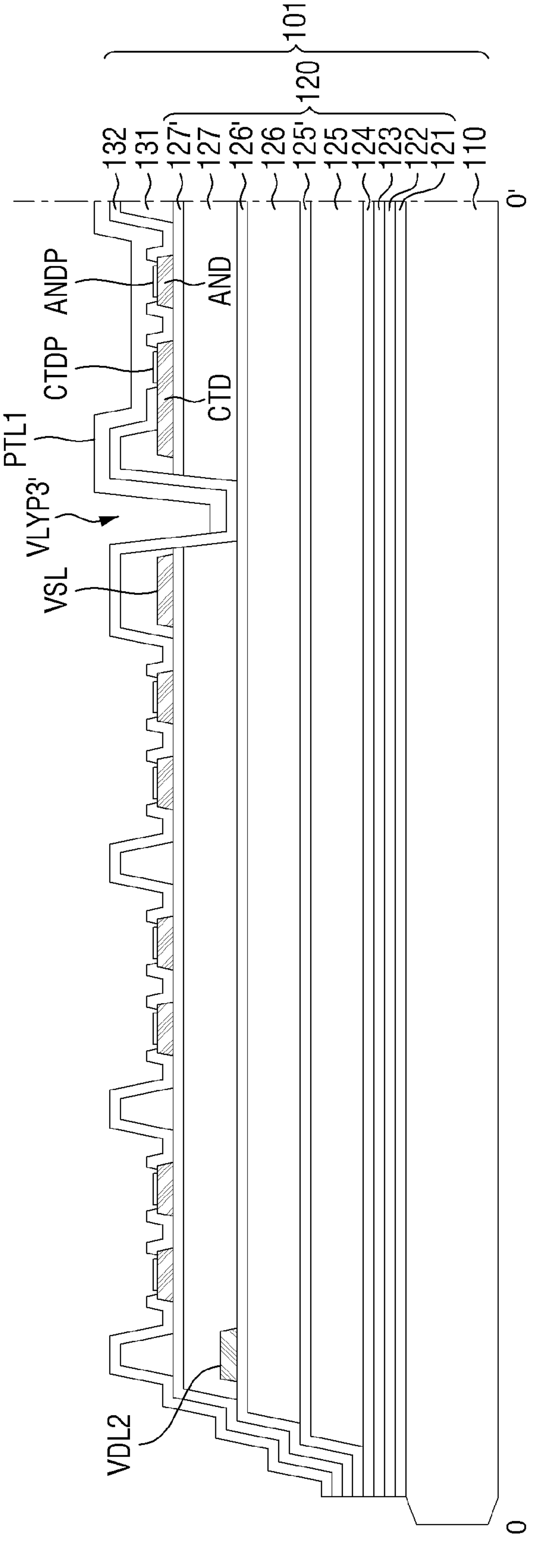
FIGS. 31 through 35 are process diagrams illustrating operations of FIG. 30.

Referring to FIG. 31, the circuit layer 120, the electrode layer ELEL, and the bank layers 131 and 132 are sequentially placed on the first surface of the support substrate 110 (operation S11).

The circuit layer 120 may include a buffer layer 121, a first gate insulating layer 122 covering a semiconductor layer SEL (CH, S, and D) on the buffer layer 121, a second gate insulating layer 123 covering a first conductive layer CDL1 (G, CE1, CE2, and CE3) on the first gate insulating layer 122, an interlayer insulating layer 124 covering a second conductive layer CDL2 (CE4, CE5, and CE6) on the second gate insulating layer 123, a first planarization layer 125 covering a third conductive layer CDL3 (VIL, GIL, GWL, PWEL, VDL11, VGHL, SWPL, GCL, PAEL, TSTL, VSAL, DCE1, DCE2, and CCE1 through CCE8) on the interlayer insulating layer 124, a second planarization layer 126 covering a fourth conductive layer CDL4 (PWM_DL, VDL12, PAM_DL, ANDE1, and VDCE) on the first planarization layer 125, and a third planarization layer 127 covering a fifth conductive layer CDL5 (VDL2 and ANDE2) on the second planarization layer 126.

The electrode layer ELEL (VSL, CTD, and AND) may be placed on the third planarization layer 127.

The electrode layer ELEL may include a third power wiring VSL transmitting a third power voltage VSS, a cathode CTD disposed in an emission area EA1, EA2, or EA3 of each of subpixels SP1 through SP3 and connected to the third power wiring VSL, and an anode AND disposed in the emission area EA1, EA2, or EA3 of each of the subpixels SP1 through SP3 and formed in an island shape spaced from the third power supply wiring VSL and the cathode CTD.

The anode AND may be electrically connected to a seventeenth transistor T17, an eighteenth transistor T18, and a nineteenth transistor T19 through a seventh connection electrode CCE7, a first anode connection electrode ANDE1, and a second anode connection electrode ANDE2.

In addition, an anode pad ANDP may be placed on the anode AND, and a cathode pad CTDP may be placed on the cathode CTD.

The anode pad ANDP and the cathode pad CTDP may be thinner than the electrode layer ELEL and may be made of a transparent conductive material such as ITO.

The bank layer 131 and 132 may be placed on the third planarization layer 127 and may include a bank planarization layer 131 corresponding to an area around the emission area EA1, EA2, or EA3 of each of the subpixels SP1 through SP3 and a bank insulating layer 132 disposed on the bank planarization layer 131. The bank insulating layer 132 may be placed around the emission area EA1, EA2, or EA3 of each of the subpixels SP1 through SP3 and may cover a portion of edges of the anode AND and a portion of edges of the cathode CTD.

In the placing of the circuit layer 120, the electrode layer ELEL, and the bank layer 131 and 132 (operation S11), a valley VLY may also be placed between the emission areas EA1 through EA3 of first pixels PXS1 and the emission areas EA1 through EA3 of second pixels PXS2. The valley VLY may penetrate at least the bank planarization layer 131.

As illustrated in FIG. 24, a first valley portion VLYP1 of the valley VLY that crosses the third power wiring VSL may penetrate the bank planarization layer 131.

As illustrated in FIGS. 25 and 27, a second valley portion VLYP2 of the valley VLY that crosses only a second power wiring VDL2 may penetrate the bank planarization layer 131 or the bank planarization layer 131 and the third planarization layer 127.

As illustrated in FIGS. 26, 28, and 29, a third valley portion VLYP3 of the valley VLY excluding the first valley portion VLYP1 and the second valley portion VLYP2 may penetrate the bank planarization layer 131, the bank planarization layer 131, and the third planarization layer 127, or the bank planarization layer 131, the third planarization layer 127, and the second planarization layer 126.

After the placing of the circuit layer 120, the electrode layer ELEL, and the bank layer 131 and 132 (operation S11), the first protective layer PTL1 may be placed on the bank layer 131 and 132 (operation S12).

The first protective layer PTL1 may be made of a silicon nitride layer, a silicon oxynitride layer, a silicon oxide layer, a titanium oxide layer, or an aluminum oxide layer.

The placing of the first protective layer PTL1 (operation S12) may include a process of applying a liquid inorganic insulating material onto the bank layer 131 and 132 using an inkjet method and a process of curing the liquid inorganic insulating material.

Here, in the process of applying the liquid inorganic insulating material, the liquid inorganic insulating material dropped onto the bank layer 131 and 132 may be widely spread from a drop point. In addition, the liquid inorganic insulating material may be spread in an area surrounded by the valley VLY and then accommodated in the valley VLY.

Accordingly, the anode pads ANDP and the cathode pads CTDP may be covered with the first protective layer PTL1 in the area surrounded by the valley VLY. In addition, the anode pads ANDP and the cathode pads CTDP disposed in an area between edges of the support substrate 110 and the valley VLY, that is, in the emission areas EA1 through EA3 of the first pixels PXS1 may not be exposed to the first protective layer PTL1.

In addition, because the placement range of the first protective layer PTL1 is limited by the valley VLY, a defect in which the first protective layer PTL1 covers a portion of the anode pad ANDP and/or a portion of the cathode pad CTDP included in the emission area EA1, EA2, or EA3 of each of the first pixels PXS1 can be prevented.

Figure 32:
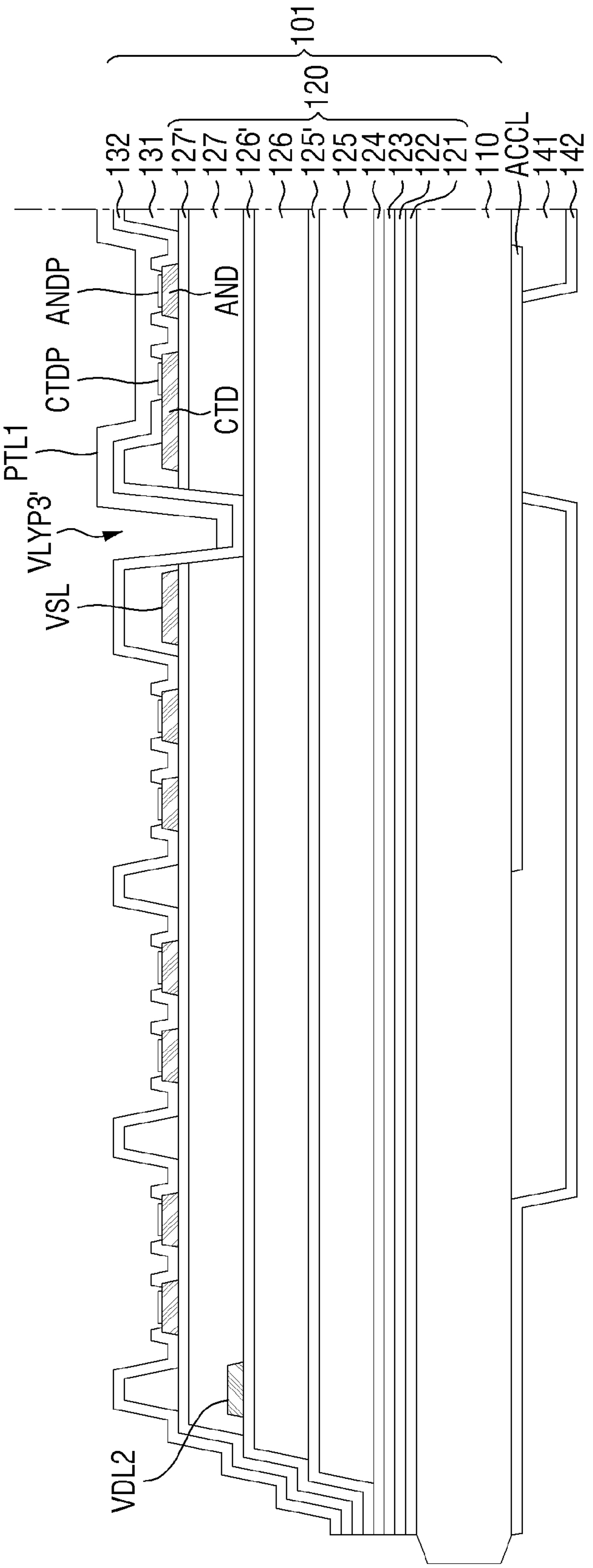

Next, referring to FIG. 32, in a state where the first protective layer PTL1 is placed, the support substrate 110 is rotated so that the second surface of the support substrate 110 is exposed. Then, an additional circuit layer ACCL, an additional planarization layer 141, and an additional insulating layer 142 may be placed on the second surface of the support substrate 110 (operation S13).

In one or more embodiments, the additional circuit layer ACCL may include rear pads BSPD (see FIG. 39) electrically connected to signal pads SPD of the circuit layer 120 through side wirings SSL (see FIG. 40), respectively, circuit board pads (not illustrated) to which an external circuit board FPCB (see FIG. 40) is connected, and rear wirings connecting the rear pads BSPD and the circuit board pads, respectively.

The additional planarization layer 141 may be placed on the second surface of the support substrate 110 and may cover a portion of the additional circuit layer ACCL. For example, the additional planarization layer 141 may cover the additional circuit layer ACCL except for the rear pads BSPD and the circuit board pads.

The additional planarization layer 141 may be made of an organic layer such as acryl resin, epoxy resin, phenolic resin, polyamide resin, or polyimide resin.

The additional insulating layer 142 may be placed on the second surface of the support substrate 110 and may cover the additional planarization layer 141. In addition, the additional insulating layer 142 may cover a portion of the additional circuit layer ACCL around the additional planarization layer 141.

The additional insulating layer 142 may be made of a silicon nitride layer, a silicon oxynitride layer, a silicon oxide layer, a titanium oxide layer, or an aluminum oxide layer.

In addition, the backplane substrate 101 may further include the side wirings SSL (see FIG. 40) disposed on a side surface of the support substrate 110 and electrically connecting the signal pads SPD of the circuit layer 120 to the rear pads BSPD of the additional circuit layer ACCL, respectively.

Figure 33:
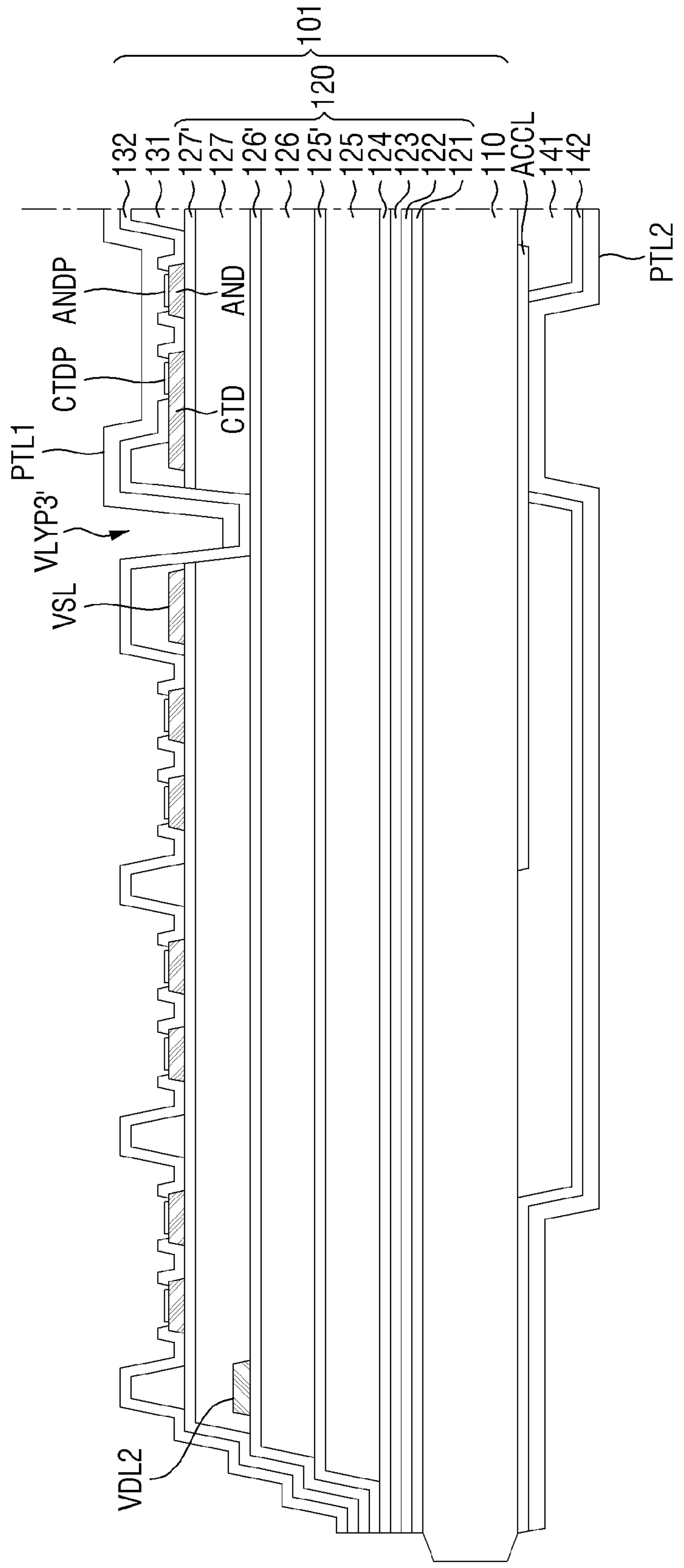

Next, referring to FIG. 33, the second protective layer PTL2 may be placed on the second surface of the support substrate 110 (operation S14).

The second protective layer PTL2 may be made of a silicon nitride layer, a silicon oxynitride layer, a silicon oxide layer, a titanium oxide layer, or an aluminum oxide layer.

The second protective layer PTL2 may cover the additional insulating layer 142 and the additional circuit layer ACCL.

Accordingly, the backplane substrate 101 having both surfaces covered with the first protective layer PTL1 and the second protective layer PTL2 may be provided. Next, the backplane substrate 101 may be transferred to a work space where the mounting of the light emitting elements LE is performed.

Figure 34:
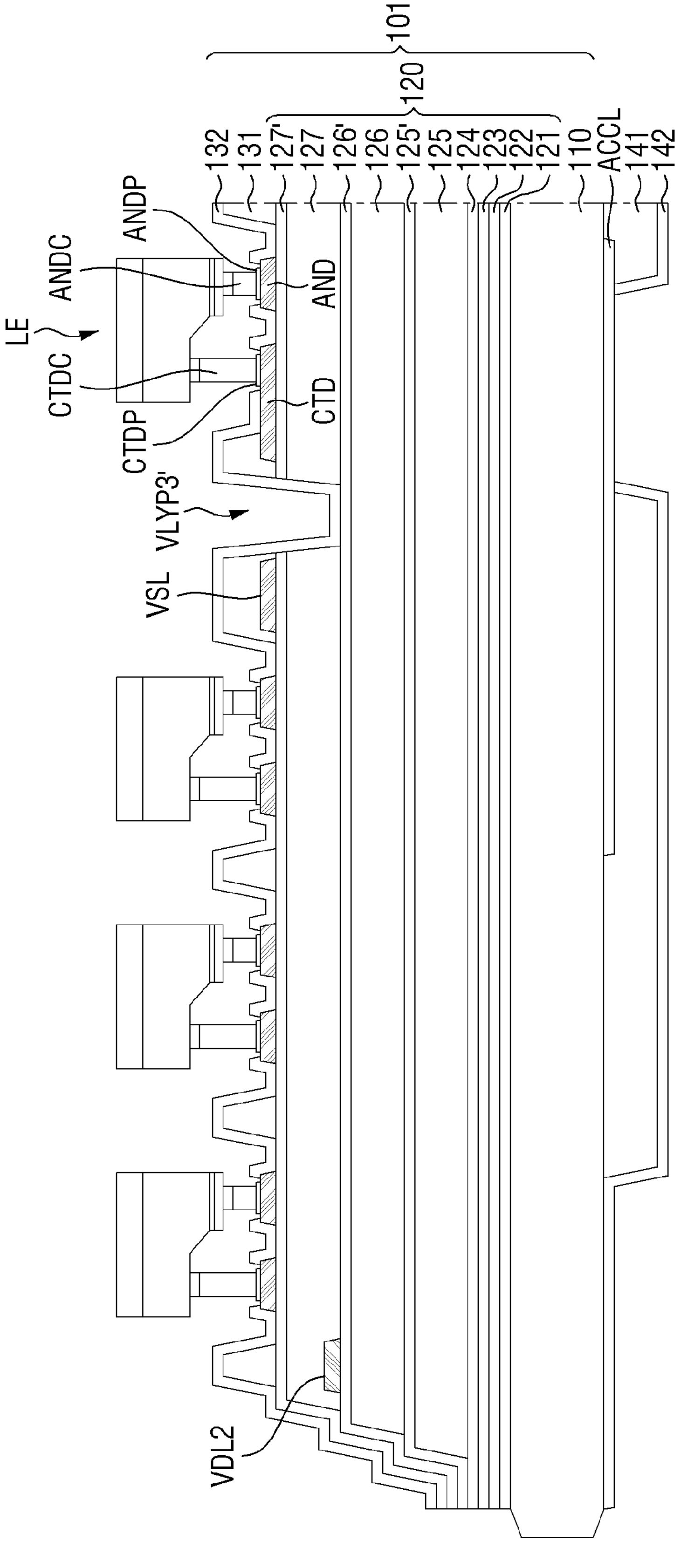

Next, referring to FIG. 34, the first protective layer PTL1 and the second protective layer PTL2 are removed from the backplane substrate 101 (operation S20). Here, the anode pads ANDP and the cathode pads CTDP of the backplane substrate 101 may be exposed.

In the placing of the first protective layer PTL1 (operation S12), the placement range of the first protective layer PTL1 may be limited to the area surrounded by the valley VLY. Accordingly, this can prevent a defect in which a portion of the cathode pad CTDP and/or a portion of the anode pad ANDP corresponding to each of the emission areas EA1 through EA3 of the first pixels PXS1 disposed between the valley VLY and the edges of the support substrate 110 are covered with the first protective layer PTL1.

In addition, a residue of the liquid material for placing the first protective layer PTL1 may be accommodated in the valley VLY. Therefore, by increasing a margin amount of the liquid material, it is possible to more easily provide a structure in which the cathode pads CTDP and the anode pads ANDP disposed in the area surrounded by the valley VLY are completely covered with the first protective layer PTL1.

Therefore, edges of the first protective layer PTL1 may not overlap the anode pads ANDP and/or the cathode pads CTDP.

Accordingly, in the removing of the first protective layer PTL1 (operation S20), it is possible to prevent, in advance, portions of the edges of the first protective layer PTL1 from remaining on the anode pads ANDP and/or the cathode pads CTDP.

Next, the light emitting elements LE may be mounted on the anode pads ANDP and the cathode pads CTDP (operation S30).

In the mounting of the light emitting elements LE (operation S30), a first contact electrode CTE1 of each of the light emitting elements LE may be fixed on an anode pad ANDP through an anode contact electrode ANDC and may be electrically connected to the anode pad ANDP.

In addition, a second contact electrode CTE2 of each of the light emitting elements LE may be fixed on a cathode pad CTDP through a cathode contact electrode CTDC and may be electrically connected to the cathode pad CTDP.

Figure 35:
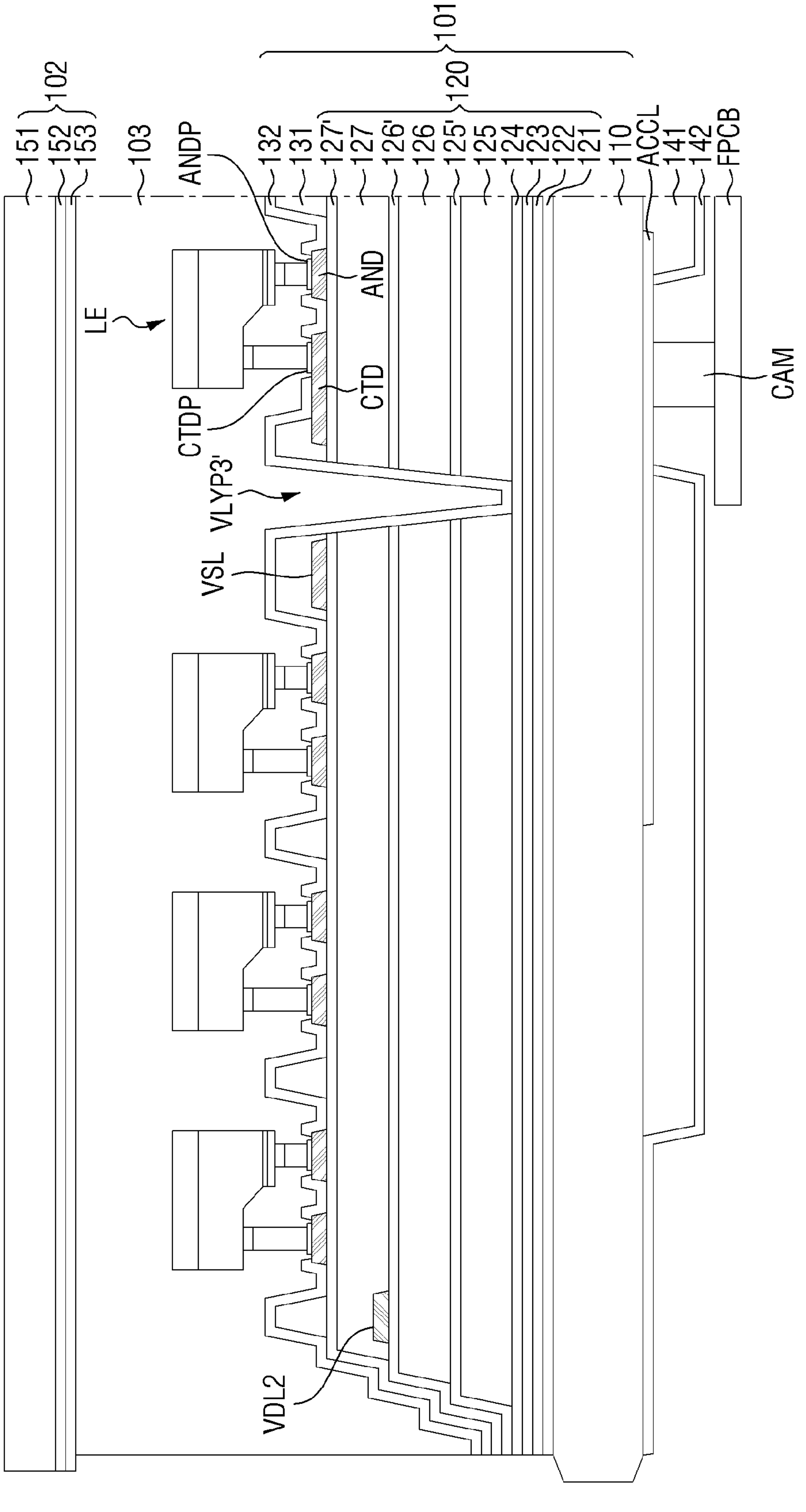

Next, as illustrated in FIG. 35, the front cover 102 opposing the first surface of the support substrate 110 and covering the light emitting elements LE may be bonded to the backplane substrate 101 (operation S40).

The front cover 102 may include a cover substrate 151, an anti-glare layer 152, and a light transmittance control layer 153 disposed on the cover substrate 151.

An adhesive member may be further disposed between the backplane substrate 101 and the front cover 102. A light-transmitting adhesive member 103 may cover the light emitting elements LE. The light-transmitting adhesive member 103 may be made of an adhesive material having light-transmitting properties. For example, the light-transmitting adhesive member 103 may be an optically clear adhesive film or an optically clear resin.

As described above, because the backplane substrate 101 according to the one or more embodiments includes the valley VLY, a defect in which the first protective layer PTL1 remains on the anode pads ANDP and/or the cathode pads CTDP can be prevented. Accordingly, this can prevent a mounting defect of the light emitting elements LE due to a residue of the first protective layer PTL1.

In one or more embodiments, because the display device 10 according to the one or more embodiments includes a relatively small bezel width, it can be easily applied to the implementation of a tiled display device.

Figure 36:
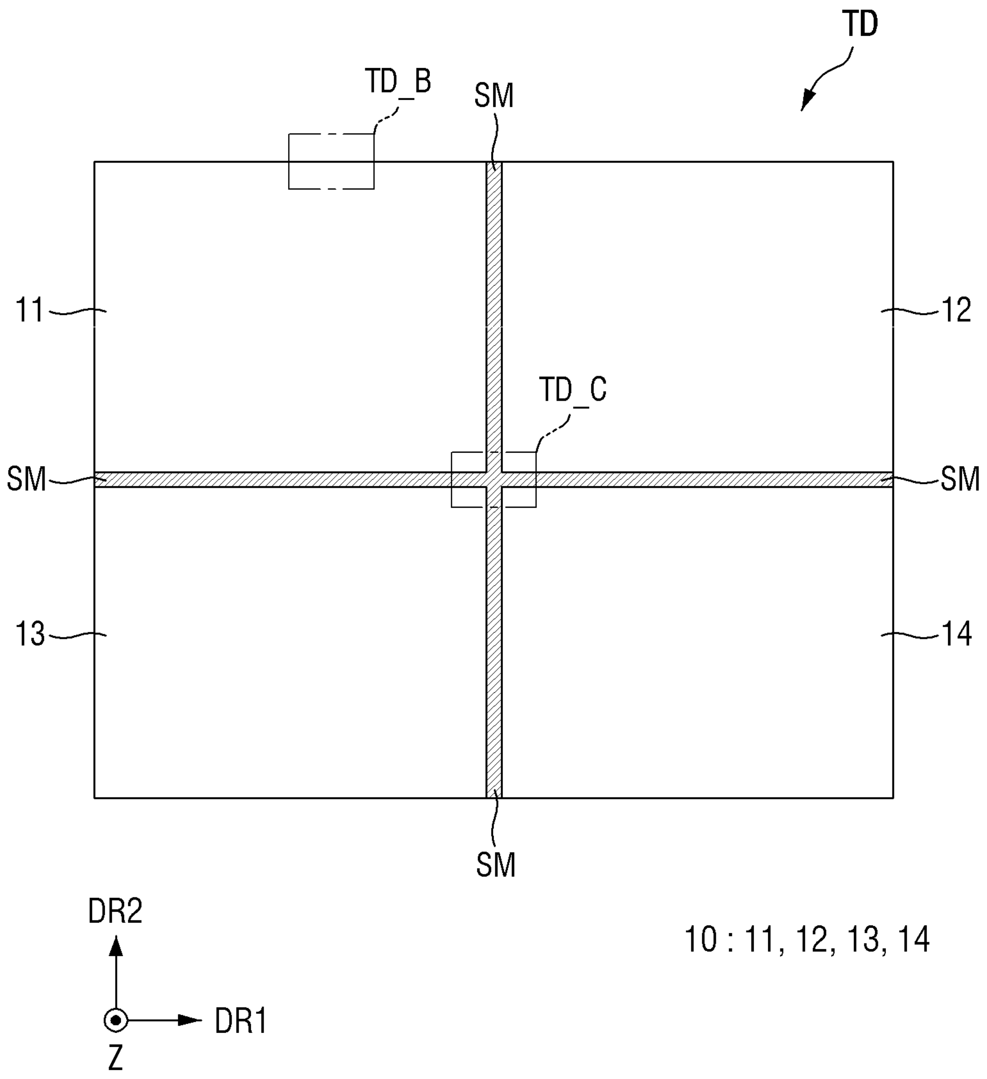
FIG. 36 is a plan view of a tiled display device according to one or more embodiments.

FIG. 36 is a plan view of a tiled display device TD according to one or more embodiments.

The tiled display device TD may include display devices 10 (11 through 14) and a seam SM between the display devices 11 through 14. For example, the tiled display device TD may include a first display device 11, a second display device 12, a third display device 13, and a fourth display device 14.

The display devices 11 through 14 may be arranged in a matrix of M (M is a positive integer) rows and N (N is a positive integer) columns. For example, the first display device 11 and the second display device 12 may neighbor each other in the first direction DR1. The first display device 11 and the third display device 13 may neighbor each other in the second direction DR2. The third display device 13 and the fourth display device 14 may neighbor each other in the first direction DR1. The second display device 12 and the fourth display device 14 may neighbor each other in the second direction DR2.

However, the number and arrangement of the display devices 11 through 14 in the tiled display device TD are not limited to those illustrated in FIG. 36. The number and arrangement of the display devices 11 through 14 in the tiled display device TD may be determined by the size of each of the display devices 10 and the tiled display device TD and the shape of the tiled display device TD.

The display devices 11 through 14 may have the same size, but one or more embodiments of the present disclosure are not limited thereto. For example, the display devices 11 through 14 may also have different sizes.

Each of the display devices 11 through 14 may be shaped like a rectangle including long sides and short sides. The long sides or short sides of the display devices 11 through 14 may be connected to each other. Some or all of the display devices 11 through 14 may be disposed at an edge of the tiled display device TD and may form a side of the tiled display device TD. At least one of the display devices 11 through 14 may be disposed at at least one corner of the tiled display device TD and may form two adjacent sides of the tiled display device TD. At least one of the display devices 11 through 14 may be surrounded by other display devices.

Each of the display devices 11 through 14 may be substantially the same as the display device 10 according to the embodiment described above with reference to FIGS. 1 through 35. Therefore, a description of each of the display devices 11 through 14 will be omitted.

The seam SM may include a coupling member or an adhesive member. In this case, the display devices 11 through 14 may be connected to each other through the coupling member or the adhesive member of the seam SM. The seam SM may be disposed between the first display device 11 and the second display device 12, between the first display device 11 and the third display device 13, between the second display device 12 and the fourth display device 14, and between the third display device 13 and the fourth display device 14.

Figure 37:
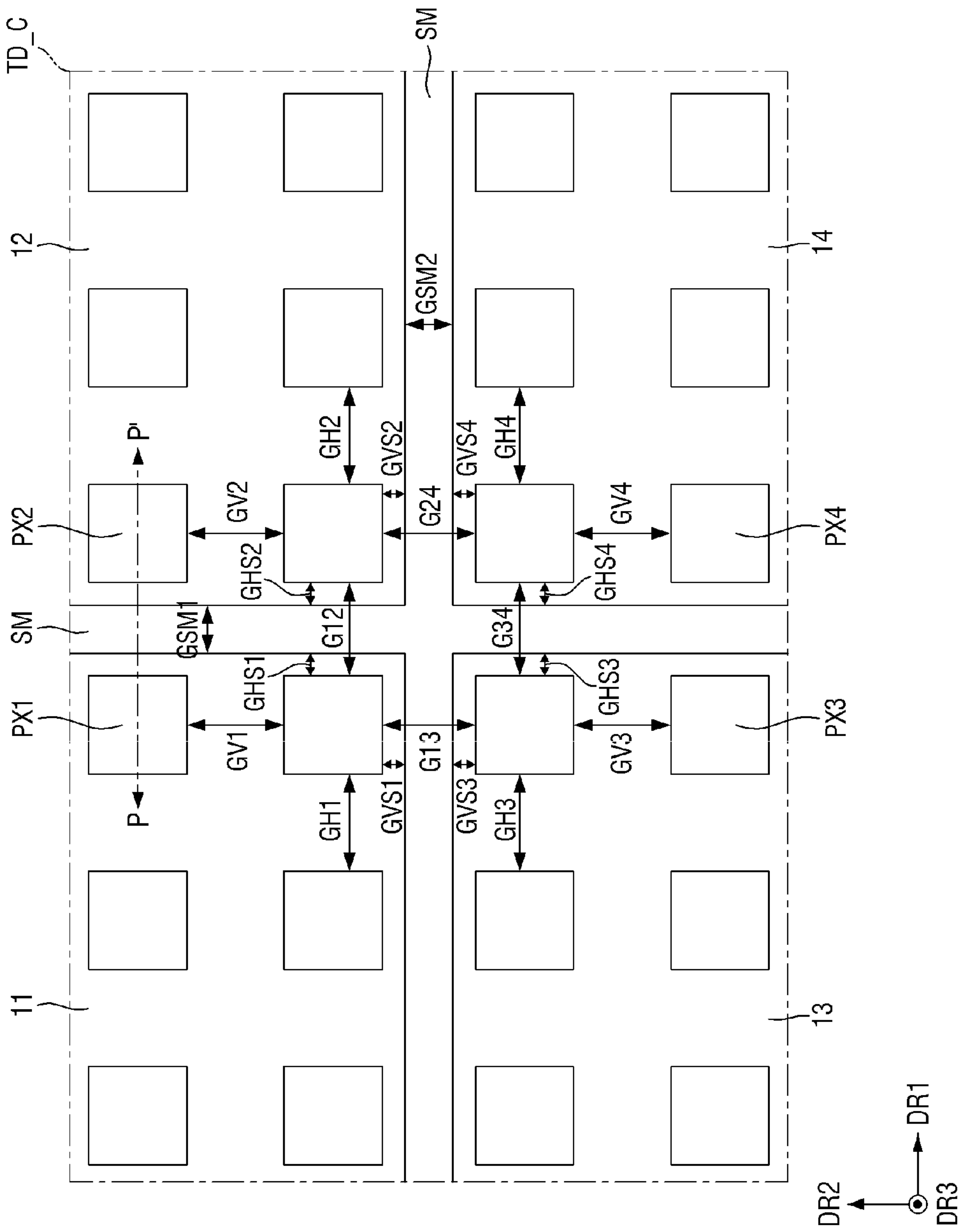
FIG. 37 is an enlarged view of a portion TD_C of FIG. 36.

FIG. 37 is an enlarged view of a portion TD_C of FIG. 36.

Referring to FIG. 37, the seam SM may have a planar shape of a cross or a plus sign in a central area of the tiled display device TD to which the first display device 11, the second display device 12, the third display device 13, and the fourth display device 14 are adjacent. The seam SM may be disposed between the first display device 11 and the second display device 12, between the first display device 11 and the third display device 13, between the second display device 12 and the fourth display device 12, and between the third display device 13 and the fourth display device 14.

The first display device 11 may include first pixels PX1 arranged in a matrix along the first direction DR1 and the second direction DR2 to display an image. The second display device 12 may include second pixels PX2 arranged in a matrix along the first direction DR1 and the second direction DR2 to display an image. The third display device 13 may include third pixels PX3 arranged in a matrix along the first direction DR1 and the second direction DR2 to display an image. The fourth display device 14 may include fourth pixels PX4 arranged in a matrix along the first direction DR1 and the second direction DR2 to display an image.

A minimum distance between the first pixels PX1 neighboring in the first direction DR1 may be defined as a first horizontal separation distance GH1, and a minimum distance between the second pixels PX2 neighboring in the first direction DR1 may be defined as a second horizontal separation distance GH2. The first horizontal separation distance GH1 and the second horizontal separation distance GH2 may be substantially the same.

The seam SM may be disposed between the first pixels PX1 and the second pixels PX2 neighboring in the first direction DR1. A minimum distance G12 between the first pixels PX1 and the second pixels PX2 neighboring in the first direction DR1 may be the sum of a minimum distance GHS1 between the first pixels PX1 and the seam SM in the first direction DR1, a minimum distance GHS2 between the second pixels PX2 and the seam SM in the first direction DR1, and a width GSM1 of the seam SM in the first direction DR1.

The minimum distance G12 between the first pixels PX1 and the second pixels PX2 neighboring in the first direction DR1, the first horizontal separation distance GH1, and the second horizontal separation distance GH2 may be substantially the same. To this end, the minimum distance GHS1 between the first pixels PX1 and the seam SM in the first direction DR1 may be smaller than the first horizontal separation distance GH1, and the minimum distance GHS2 between the second pixels PX2 and the seam SM in the first direction DR1 may be smaller than the second horizontal separation distance GH2. In addition, the width GSM1 of the seam SM in the first direction DR1 may be smaller than the first horizontal separation distance GH1 or the second horizontal separation distance GH2.

A minimum distance between the third pixels PX3 neighboring in the first direction DR1 may be defined as a third horizontal separation distance GH3, and a minimum distance between the fourth pixels PX4 neighboring in the first direction DR1 may be defined as a fourth horizontal separation distance GH4. The third horizontal separation distance GH3 and the fourth horizontal separation distance GH4 may be substantially the same.

The seam SM may be disposed between the third pixels PX3 and the fourth pixels PX4 neighboring in the first direction DR1. A minimum distance G34 between the third pixels PX3 and the fourth pixels PX4 neighboring in the first direction DR1 may be the sum of a minimum distance GHS3 between the third pixels PX3 and the seam SM in the first direction DR1, a minimum distance GHS4 between the fourth pixels PX4 and the seam SM in the first direction DR1, and the width GSM1 of the seam SM in the first direction DR1.

The minimum distance G34 between the third pixels PX3 and the fourth pixels PX4 neighboring in the first direction DR1, the third horizontal separation distance GH3, and the fourth horizontal separation distance GH4 may be substantially the same. To this end, the minimum distance GHS3 between the third pixels PX3 and the seam SM in the first direction DR1 may be smaller than the third horizontal separation distance GH3, and the minimum distance GHS4 between the fourth pixels PX4 and the seam SM in the first direction DR1 may be smaller than the fourth horizontal separation distance GH4. In addition, the width GSM1 of the seam SM in the first direction DR1 may be smaller than the third horizontal separation distance GH3 or the fourth horizontal separation distance GH4.

A minimum distance between the first pixels PX1 neighboring in the second direction DR2 may be defined as a first vertical separation distance GV1, and a minimum distance between the third pixels PX3 neighboring in the second direction DR2 may be defined as a third vertical separation distance GV3. The first vertical separation distance GV1 and the third vertical separation distance GV3 may be substantially the same.

The seam SM may be disposed between the first pixels PX1 and the third pixels PX3 neighboring in the second direction DR2. A minimum distance G13 between the first pixels PX1 and the third pixels PX3 neighboring in the second direction DR2 may be the sum of a minimum distance GVS1 between the first pixels PX1 and the seam SM in the second direction DR2, a minimum distance GVS3 between the third pixels PX3 and the seam SM in the second direction DR2, and a width GSM2 of the seam SM in the second direction DR2.

The minimum distance G13 between the first pixels PX1 and the third pixels PX3 neighboring in the second direction DR2, the first vertical separation distance GV1, and the third vertical separation distance GV3 may be substantially the same. To this end, the minimum distance GVS1 between the first pixels PX1 and the seam SM in the second direction DR2 may be smaller than the first vertical separation distance GV1, and the minimum distance GVS3 between the third pixels PX3 and the seam SM in the second direction DR2 may be smaller than the third vertical separation distance GV3. In addition, the width GSM2 of the seam SM in the second direction DR2 may be smaller than the first vertical separation distance GV1 or the third vertical separation distance GV3.

A minimum distance between the second pixels PX2 neighboring in the second direction DR2 may be defined as a second vertical separation distance GV2, and a minimum distance between the fourth pixels PX4 neighboring in the second direction DR2 may be defined as a fourth vertical separation distance GV4. The second vertical separation distance GV2 and the fourth vertical separation distance GV4 may be substantially the same.

The seam SM may be disposed between the second pixels PX2 and the fourth pixels PX4 neighboring in the second direction DR2. A minimum distance G24 between the second pixels PX2 and the fourth pixels PX4 neighboring in the second direction DR2 may be the sum of a minimum distance GVS2 between the second pixels PX2 and the seam SM in the second direction DR2, a minimum distance GVS4 between the fourth pixels PX4 and the seam SM in the second direction DR2, and the width GSM2 of the seam SM in the second direction DR2.

The minimum distance G24 between the second pixels PX2 and the fourth pixels PX4 neighboring in the second direction DR2, the second vertical separation distance GV2, and the fourth vertical separation distance GV4 may be substantially the same. To this end, the minimum distance GVS2 between the second pixels PX2 and the seam SM in the second direction DR2 may be smaller than the second vertical separation distance GV2, and the minimum distance GVS4 between the fourth pixels PX4 and the seam SM in the second direction DR2 may be smaller than the fourth vertical separation distance GV4. In addition, the width GSM2 of the seam SM in the second direction DR2 may be smaller than the second vertical separation distance GV2 or the fourth vertical separation distance GV4.

As illustrated in FIG. 37, in order to prevent the seam SM from being recognized between images displayed by the display devices 11 through 14, the minimum distance between pixels of neighboring display devices may be substantially the same as the minimum distance between pixels of each of the display devices.

Figure 38:
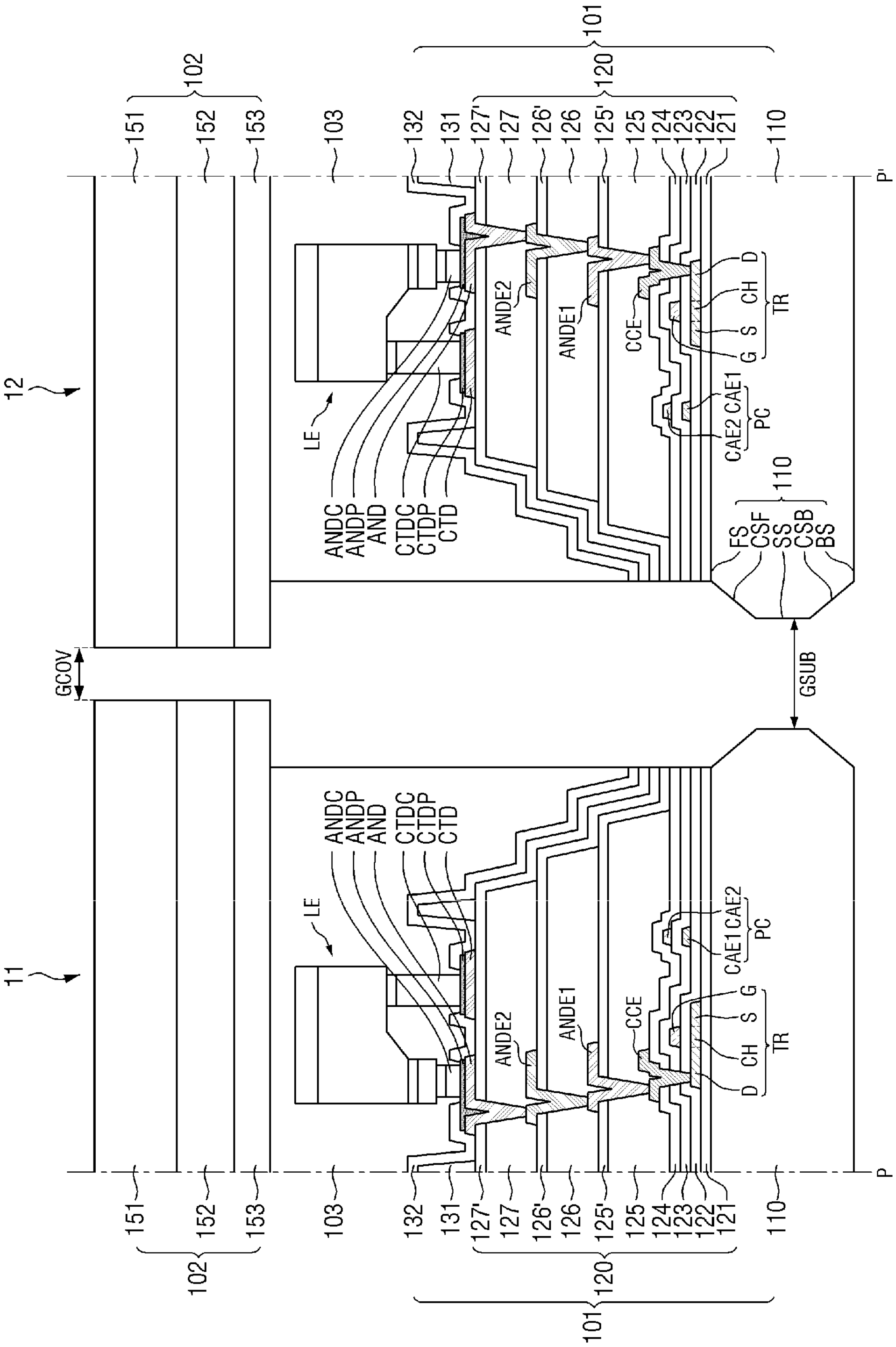
FIG. 38 is a cross-sectional view taken along the line P-P' of FIG. 37.

FIG. 38 is a cross-sectional view taken along the line P-P' of FIG. 37.

Referring to FIG. 38, each of the first display device 11 and the second display device 12 may include a backplane substrate 101, a front cover 102, and a light-transmitting adhesive member 103 between the backplane substrate 101 and the front cover 102.

The backplane substrate 101 may include a support substrate 110, a circuit layer 120, an electrode layer ELEL (AND and CTD), and a bank layer 131 and 132.

The support substrate 110 may include a first surface FS on which a plurality of light emitting elements LE are disposed, a second surface BS opposite the first surface FS, and side surfaces SS disposed between the first surface FS and the second surface BS. For example, the first surface FS may be an upper surface, and the second surface BS may be a rear surface or a lower surface.

The support substrate 110 may further include a chamfered surface CSF disposed between the first surface FS and each side surface SS and a chamfered surface CSB disposed between the second surface BS and each side surface SS. Because the chamfered surfaces CSF and CSB are regions separated from the first surface FS, the light emitting elements LE are not disposed on the chamfered surfaces CSF and CSB.

Due to the chamfered surfaces CSF and CSB, the support substrates 110 of the first display device 11 and the second display device 12 can be prevented from colliding with each other and thus being damaged.

When the first surface FS and the second surface BS have a quadrilateral shape, the chamfered surfaces CSF and CSB may be disposed adjacent to four edges of each of the first surface FS and the second surface BS.

The front cover 102 may face the first surface FS and the chamfered surfaces CSF and CSB of the support substrate 110.

That is, the front cover 102 may be wider than the support substrate 110 in the first direction DR1 and the second direction DR2 and may protrude further than the support substrate 110. Accordingly, in the first display device 11 and the second display device 12, a distance GSUB between the support substrates 110 may be greater than a distance GCOV between the front covers 102.

The front cover 102 may include a cover substrate 151 facing the first surface FS of the support substrate 110 and a light transmittance control layer 153 and an anti-glare layer 152 disposed between the cover substrate 151 and the backplane substrate 101.

The light-transmitting adhesive member 103 disposed between the backplane substrate 101 and the front cover 102 may cover the light emitting elements LE and may be attached onto the bank layer 131 and 132. The light-transmitting adhesive member 103 may be a transparent adhesive material that transmits light. For example, the light-transmitting adhesive member 103 may be an optically clear adhesive film or an optically clear resin.

The light transmittance control layer 153 is attached onto the light-transmitting adhesive member 103. The light transmittance control layer 153 may be wider than the support substrate 110 in the first direction DR1 and the second direction DR2.

The light transmittance control layer 153 is designed to reduce transmittance of light reflected by the circuit layer 120 and the electrode layer ELEL. Due to the light transmittance control layer 153, the gap GSUB between the support substrates 110 of the first display device 11 and the second display device 12 may be prevented from being recognized from the outside.

The anti-glare layer 152 is designed to prevent external light from being reflected from the surface of a display device 10 by diffusely reflecting the external light. Due to the anti-glare layer 152, a contrast ratio of an image displayed by the display device 10 can be improved. The anti-glare layer 152 may be wider than the support substrate 110.

The light transmittance control layer 153 may be implemented as a phase delay layer, and the anti-glare layer 152 may be implemented as a polarizing plate. However, this is only an example, and the structure of the front cover 102 according to one or more embodiments is not limited thereto.

Although a cross section of an area between the first display device 11 and the third display device 13 of FIG. 37, a cross section of an area between the third display device 13 and the fourth display device 14, and a cross section of an area between the second display device 12 and the fourth display device 14 are not illustrated, they are substantially the same as the cross section of the area between the first display device 11 and the second display device 12 illustrated in FIG. 38 and thus will not be described.

Figure 39:
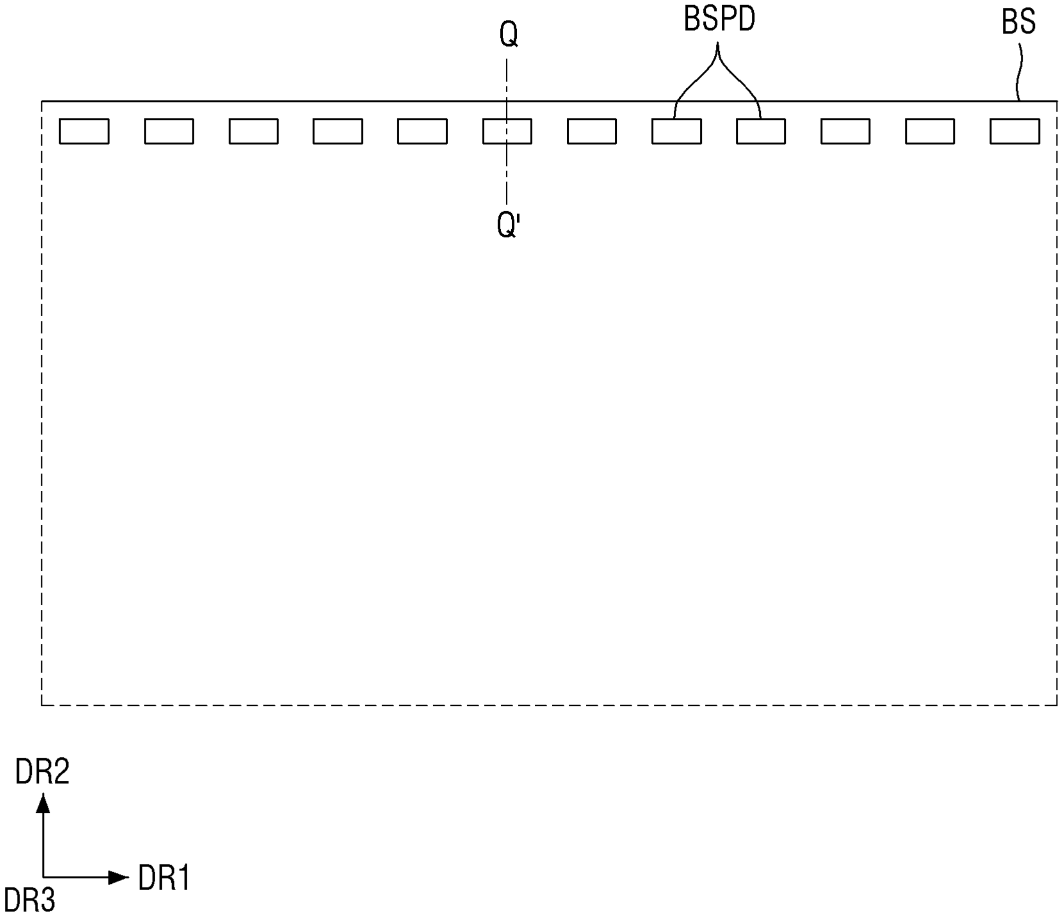
FIG. 39 is a layout view illustrating the back of portion TD_B of FIG. 36.
Figure 40:
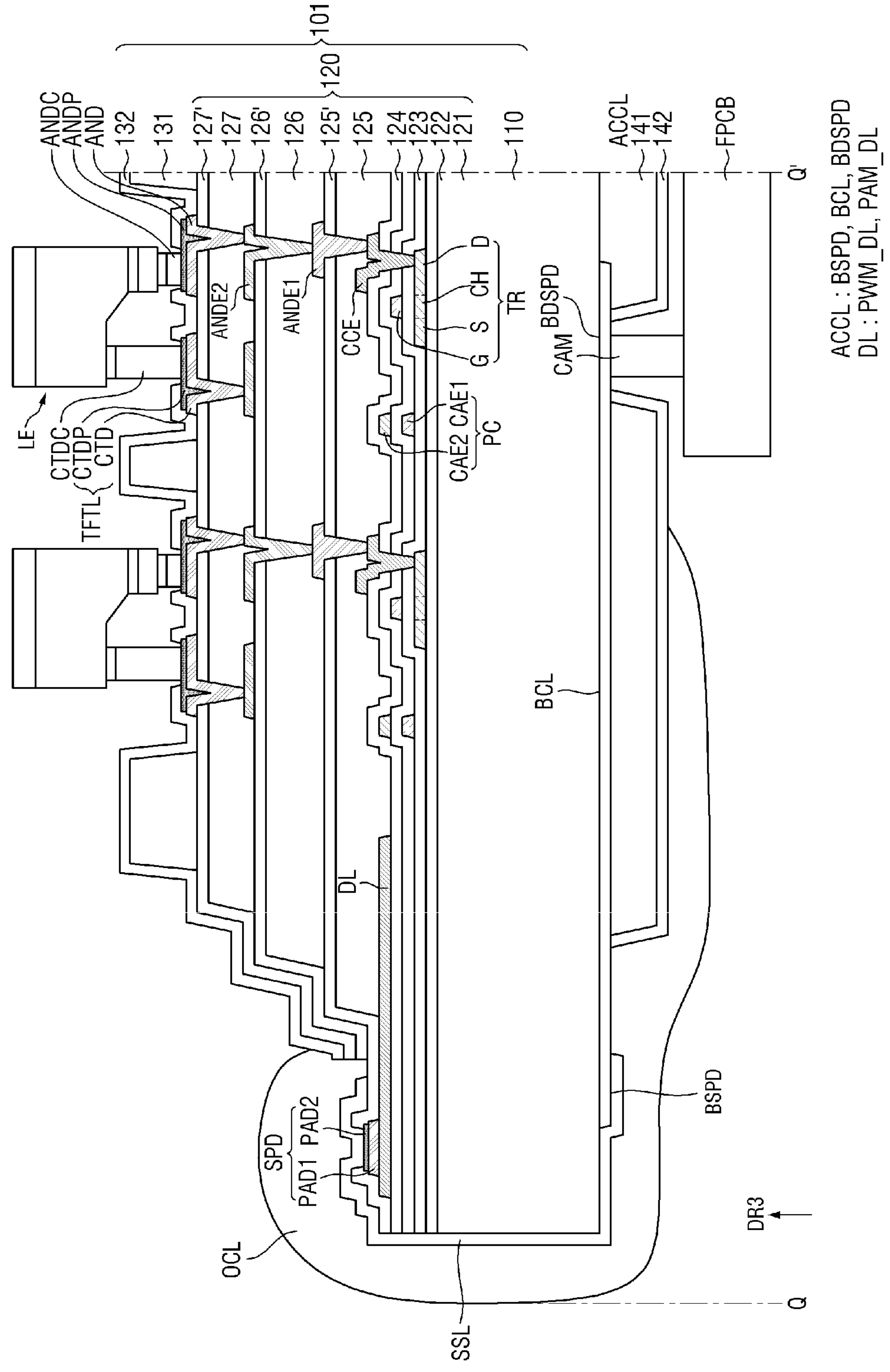
FIG. 40 is a cross-sectional view taken along the line Q-Q' of FIG. 39.

FIG. 39 is a layout view illustrating the back of portion TD_B of FIG. 36. FIG. 40 is a cross-sectional view taken along the line Q-Q' of FIG. 39.

For ease of description, FIG. 39 illustrates the second surface BS (i.e., the rear surface of the support substrate 110) of any one display device 10 from among the display devices 11 through 14 and rear pads BSPD disposed on the second surface BS.

Referring to FIG. 39, any one display device 10 may further include the rear pads BSPD arranged side by side on an edge of the second surface BS of the support substrate 110.

Referring to FIG. 40, any one display device 10 may further include signal pads SPD disposed on an edge of the first surface FS of the support substrate 110, rear pads BSPD disposed on the rear surface of the support substrate 110, side wirings SSL disposed on a side surface SS of the support substrate 110 and electrically connecting the signal pads SPD and the rear pads BSPD, an overcoat layer OCL disposed on the side surface of the support substrate 110 and covering the side wirings SSL, rear connection wirings BCL disposed on the second surface BS of the support substrate 110 and electrically connected to the rear pads BSPD, circuit board pads BDSPD electrically connected to the rear connection wirings BCL and to which a circuit board FPCB is connected, an additional planarization layer 141 disposed on the second surface BS of the support substrate 110, an additional insulating layer 142 covering the additional planarization layer 141, and a conductive adhesive member CAM electrically connecting and fixing the circuit board pads BDSPD to the circuit board FPCB.

The signal pads SPD may correspond to the rear pads BSPD one-to-one.

The signal pads SPD may be electrically connected to wirings of the circuit layer 120, respectively.

For example, each of data wirings DL (PWM_DL and PAM_DL) may be made of a fourth conductive layer CDL4 on a first planarization layer 125 and may be electrically connected to at least one signal pad SPD.

Each of the signal pads SPD may include a first pad layer PAD1 and a second pad layer PAD2 stacked sequentially. For example, the first pad layer PAD1 may be made of the same layer as a fifth conductive layer CDL5, and the second pad layer PAD2 may be made of the same layer as an electrode layer ELEL. However, this is only an example, and the structure of the signal pads SPD according to one or more embodiments are not limited thereto.

The side wirings SSL may be disposed on the first surface FS of the support substrate 110, an upper chamfered surface CSF connected to the first surface FS, a side surface SS, a lower chamfered surface CSB connected to the second surface BS, and the second surface BS. That is, the side wirings SSL may contact the upper chamfered surface CSF, the side surface SS, and the lower chamfered surface CSB.

Respective ends of the side wirings SSL may be disposed on the signal pads SPD on the first surface FS and may be electrically connected to the signal pads SPD. The other respective ends of the side wirings SSL may be disposed on the rear pads BSPD on the second surface BS and may be electrically connected to the rear pads BSPD.

Accordingly, the signal pads SPD and the rear pads BSPD may be electrically connected through the side wirings SSL.

The overcoat layer OCL is disposed on the first surface FS of the support substrate 110, the upper chamfered surface CSF connected to the first surface FS, the side surface SS, the lower chamfered surface CSB connected to the second surface BS, and the second surface BS. The overcoat layer OCL covers the side wirings SSL.

The overcoat layer OCL may be made of an organic layer such as acryl resin, epoxy resin, phenolic resin, polyamide resin, or polyimide resin.

The rear pads BSPD may be arranged side by side on an edge of the second surface BS of the support substrate 110. The rear pads BSPD may be made of a transparent conductive oxide such as indium tin oxide (ITO) or indium zinc oxide (IZO).

The rear connection wirings BCL may be disposed on the second surface BS of the support substrate 110. Each of the rear connection wirings BCL may be a single layer or a multilayer made of one or more selected from among molybdenum (Mo), aluminum (Al), chromium (Cr), gold (Au), titanium (Ti), nickel (Ni), neodymium (Nd), copper (Cu), and alloys thereof.

Respective ends of the rear connection wirings BCL may be electrically connected to the rear pads BSPD.

The additional planarization layer 141 is disposed on the second surface BS of the support substrate 110.

The additional planarization layer 141 may flatly cover a portion of an additional circuit layer ACCL excluding the rear pads BSPD and the circuit board pads BDSPD.

The additional planarization layer 141 may be made of an organic layer such as acryl resin, epoxy resin, phenolic resin, polyamide resin, or polyimide resin.

The additional insulating layer 142 is disposed on the second surface BS of the support substrate 110 and covers the additional planarization layer 141. Here, the rear pads BSPD and the circuit board pads BDSPD are not covered with the additional insulating layer 142.

The additional insulating layer 142 may be made of a silicon nitride layer, a silicon oxynitride layer, a silicon oxide layer, a titanium oxide layer, or an aluminum oxide layer.

The circuit board FPCB may oppose the second surface BS of the support substrate 110 and may be connected to the circuit board pads BSPD through the conductive adhesive member CAM. The circuit board FPCB may be implemented as a flexible film.

The conductive adhesive member CAM may be an anisotropic conductive film or an anisotropic conductive paste.

Figure 41:
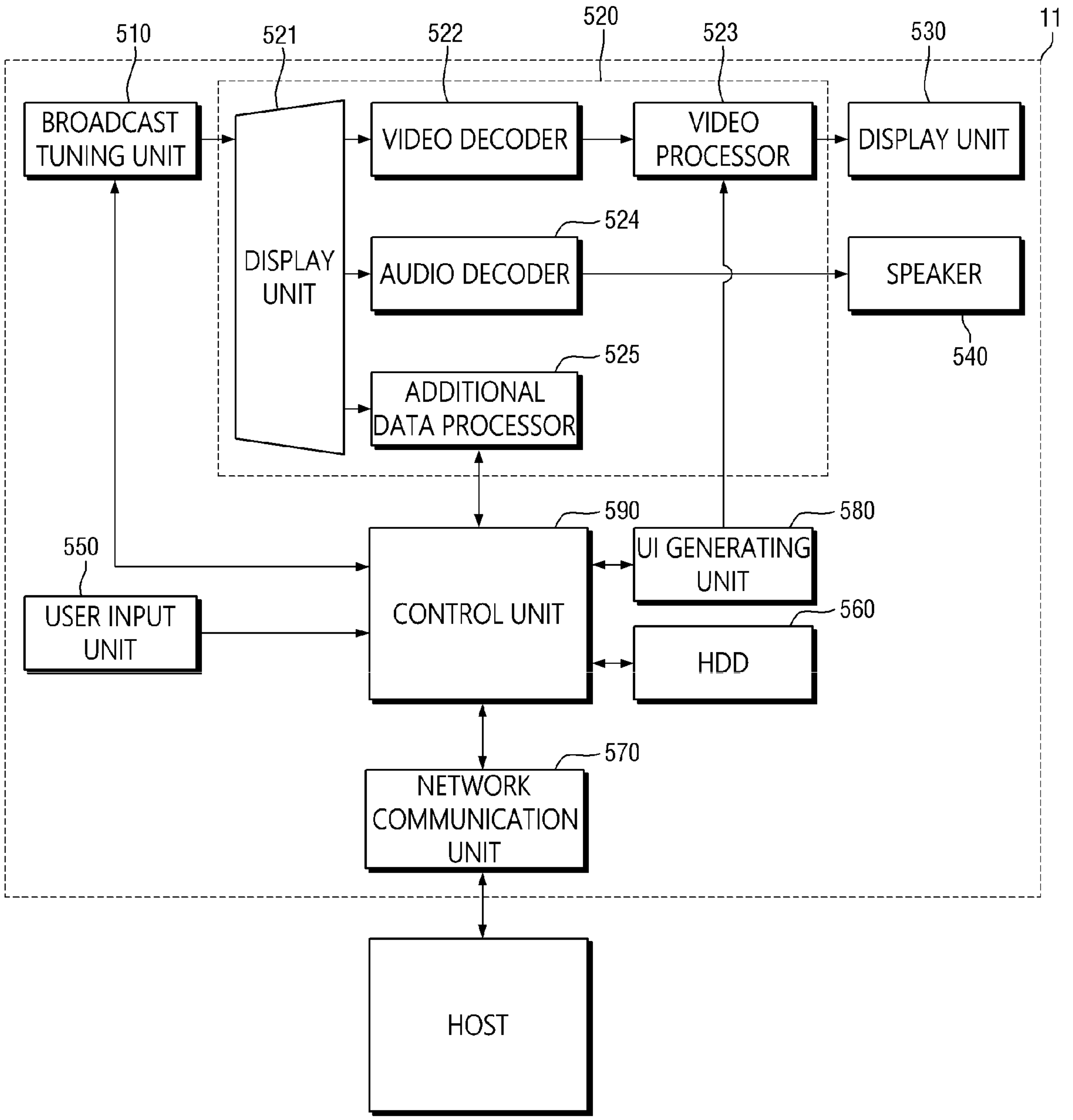
FIG. 41 is a block diagram of the tiled display device according to one or more embodiments.

FIG. 41 is a block diagram of the tiled display device TD according to one or more embodiments.

In FIG. 41, the first display device 11, which is any one of the display devices 11 through 14, and a host system HOST are illustrated for ease of description.

Referring to FIG. 41, the tiled display device TD according to the described embodiment may include the host system HOST, a broadcast tuning unit 510, a signal processing unit 520, a display unit 530, a speaker 540, a user input unit 550, a hard disk drive (HDD) 560, a network communication unit 570, a user interface (UI) generating unit 580, and a control unit 590.

The host system HOST may be implemented as any one of a television system, a home theater system, a set-top box, a navigation system, a DVD player, a Blu-ray player, a PC, a mobile phone system, and a tablet computer.

A user's command may be input to the host system HOST in various forms. For example, the user's command may be input to the host system HOST through a touch input. Alternatively, the user's command may be input to the host system HOST through a keyboard input or a button input of a remote controller.

The host system HOST may receive original video data corresponding to an original image from the outside. The host system HOST may divide the original video data by the number of display devices. For example, for the first display device 11, the second display device 12, the third display device 13 and the fourth display device 14, the host system HOST may divide the original video data into first video data corresponding to a first image, second video data corresponding to a second image, third video data corresponding to a third image, and fourth video data corresponding to a fourth image. The host system HOST may transmit the first video data to the first display device 11, transmit the second video data to the second display device 12, transmit the third video data to the third display device 13, and transmit the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, a user may view the original image into which the first through fourth images displayed on the first through fourth display devices 11 through 14 are combined.

The first display device 11 may include the broadcast tuning unit 510, the signal processing unit 520, the display unit 530, the speaker 540, the user input unit 550, the HDD 560, the network communication unit 570, the UI generating unit 580, and the control unit 590.

The broadcast tuning unit 510 may tune a suitable channel frequency (e.g., a predetermined channel frequency) under the control of the control unit 590 to receive a broadcast signal of a corresponding channel through an antenna. The broadcast tuning unit 510 may include a channel detection module and a radio frequency (RF) demodulation module.

The broadcast signal demodulated by the broadcast tuning unit 510 is processed by the signal processing unit 520 and then output to the display unit 530 and the speaker 540. Here, the signal processing unit 520 may include a demultiplexer 521, a video decoder 522, a video processor 523, an audio decoder 524, and an additional data processor 525.

The demultiplexer 521 separates the demodulated broadcast signal into a video signal, an audio signal, and additional data. The video signal, the audio signal, and the additional data are restored by the video decoder 522, the audio decoder 524, and the additional data processor 525, respectively. Here, the video decoder 522, the audio decoder 524, and the additional data processor 525 restore the video signal, the audio signal, and the additional data in a decoding format corresponding to an encoding format used when the broadcast signal is transmitted.

The decoded video signal is converted by the video processor 523 to fit the vertical frequency, resolution, aspect ratio, etc. that meet the output standard of the display unit 530, and the decoded audio signal is output to the speaker 540.

The display unit 530 includes a display panel 100 displaying an image and a panel driver controlling the driving of the display panel 100.

The user input unit 550 may receive a signal transmitted by the host system HOST. The user input unit 550 may be provided to allow input of data about a user's selection/input of commands regarding communication with other display devices 12 through 14 as well as data about channel selection and UI menu selection and manipulation transmitted by the host system HOST.

The HDD 560 stores various software programs including OS programs, recorded broadcast programs, moving images, photographs, and other data. The HDD 560 may be formed of a storage medium such as a hard disk or a non-volatile memory.

The network communication unit 570 is for short-distance communication with the host system HOST and other display devices DV2 through DV4 12 through 14.

The network communication unit 570 can be implemented as a communication module including an antenna pattern that can implement mobile communication, data communication, Bluetooth, RF, Ethernet, etc.

The network communication unit 570 may, through antenna electrodes AE, transmit and receive radio signals to and from at least one of a base station, an external terminal, and a server on a mobile communication network constructed according to technical standards or communication methods for mobile communication (e.g., Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, etc.).

The network communication unit 570 may also transmit and receive radio signals through the antenna electrodes AE in a communication network according to wireless Internet technologies. The wireless Internet technologies include, for example, Wireless LAN (WLAN), Wireless-Fidelity (Wi-Fi), Wi-Fi Direct, Digital Living Network Alliance (DLNA), Wireless Broadband (WiBro), World Interoperability for Microwave Access (WiMAX), HSDPA, HSUPA, LTE, and LTE-A. The antenna electrodes AE transmit and receive data according to at least one wireless Internet technology within a range including even Internet technologies not listed above.

In addition, the first through fourth display devices 11 through 14 may include the antenna electrodes to transmit and receive radio signals to and from each other. The first display device 11 may transmit a first radio signal, and the second through fourth display devices 12 through 14 may receive the first radio signal. In addition, the second display device 12 may transmit a second radio signal, and the first, third, and fourth display devices 11, 13, and 14 may receive the second radio signal. In addition, the third display device 13 may transmit a third radio signal, and the first, second, and fourth display devices 11, 12, and 14 may receive the third radio signal. In addition, the fourth display device 14 may transmit a fourth radio signal, and the first through third display devices 11 through 13 may receive the fourth radio signal.

The UI generating unit 580 generates a UI menu for wireless communication with the host system HOST and the second through fourth display devices 12 through 14 and may be implemented by an algorithm code and an on-screen display integrated circuit (OSD IC). The UI menu for communication with the host system HOST and the second through fourth display devices 12 through 14 may be a menu for designating a desired digital television for communication and selecting a desired function.

The control unit 590 is responsible for overall control of the first display device 11 and responsible for communication control of the host system HOST and the second through fourth display devices 12 through 14. The control unit 590 may be implemented by a micro controller unit (MCU) which stores a corresponding algorithm code for control and executes the stored algorithm code.

The control unit 590 controls a control command and data corresponding to the input and selection of the user input unit 550 to be transmitted to the host system HOST and the second through fourth display devices 12 through 14 through the network communication unit 570. In addition, when a predetermined control command and data are received from the host system HOST and the second through fourth display devices 12 through 14, the control unit 590 performs an operation according to the control command.

A backplane substrate according to one or more embodiments is provided in a display device including subpixels and the backplane includes a support substrate, a circuit layer disposed on a first surface of the support substrate, an electrode layer and a bank layer disposed on the circuit layer, and a valley spaced from edges of the support substrate and penetrating at least the bank layer.

The display device may include pixels, each of the pixels including two or more adjacent subpixels, and the pixels may include first pixels closest to the edges of the support substrate and second pixels adjacent to the first pixels.

The valley may be disposed at a boundary between emission areas of the first pixels and emission areas of the second pixels.

The bank layer may include a bank planarization layer disposed around the emission area of each of the subpixels and a bank insulating layer covering the bank planarization layer.

The valley may penetrate at least the bank planarization layer.

Because the valley is included as described above, in the process of placing a first protective layer for protecting the electrode layer using an inkjet method when the backplane substrate is transferred, a liquid material of the first protective layer may be spread in an area surrounded by the valley, and a residue exceeding a threshold amount corresponding to the area surrounded by the valley may be accommodated in the valley. Accordingly, anode pads and cathode pads disposed in the area surrounded by the valley may be completely covered with the first protective layer, but anode pads and/or cathode pads disposed in the emission areas of the first pixels disposed between the valley and the edges of the substrate may be prevented from being partially covered with the first protective layer. That is, it is possible to prevent edges of the first protective layer from overlapping the anode pads and/or the cathode pads.

Therefore, in the process of removing the first protective layer, it is possible to prevent, in advance, a defect in which portions of the edges of the first protective layer remain on the anode pads and/or the cathode pads. Accordingly, a mounting defect of light emitting elements due to a residue of the first protective layer can be prevented.

Therefore, a manufacturing defect rate of the display device and a manufacturing defect rate of a tiled display device including the display device can be reduced.

However, the effects, aspects, and features of embodiments of the present disclosure are not restricted to the one set forth herein. The above and other effects, aspects, and features of embodiments of the present disclosure will become more apparent to one of daily skill in the art to which the present disclosure pertains by referencing the claims and their equivalents.

What is claimed is:

1. A backplane substrate of a display device comprising subpixels, the backplane substrate comprising:

a support substrate;

a circuit layer on a first surface of the support substrate and comprising pixel drivers corresponding to the subpixels, respectively;

an electrode layer on the circuit layer and comprising an anode and a cathode corresponding to an emission area of each of the subpixels;

a bank layer on the circuit layer and corresponding to an area around the emission area of each of the subpixels; and a valley shaped similarly to edges of the support substrate, spaced from an edge of the edges of the support substrate and penetrating at least the bank layer, wherein the display device further comprises pixels, each comprising two or more adjacent subpixels from among the subpixels, and wherein the pixels comprise: first pixels between the edge of the support substrate and the valley.

2. The backplane substrate of claim 1, wherein the pixels further comprise second pixels adjacent to the valley, and wherein the valley is at a boundary between the first pixels and the second pixels.

3. The backplane substrate of claim 2, wherein the circuit layer comprises:

a semiconductor layer on the first surface of the support substrate;

a first conductive layer on a first gate insulating layer covering the semiconductor layer;

a second conductive layer on a second gate insulating layer covering the first conductive layer;

a third conductive layer on an interlayer insulating layer covering the second conductive layer;

a fourth conductive layer on a first planarization layer covering the third conductive layer;

a fifth conductive layer on a second planarization layer covering the fourth conductive layer; and a third planarization layer covering the fifth conductive layer, wherein the electrode layer is on the third planarization layer, and wherein the bank layer comprises a bank planarization layer on the circuit layer and a bank insulating layer covering the bank planarization layer.

4. The backplane substrate of claim 3, wherein the bank insulating layer comprises an inorganic insulating material, and wherein the bank insulating layer extends to edges of the emission area of each of the subpixels and covers a portion of edges of the anode and a portion of edges of the cathode.

5. The backplane substrate of claim 3, wherein the circuit layer further comprises:

a first power wiring configured to transmit a first power to the pixel drivers; and a second power wiring configured to transmit a second power to the pixel drivers, wherein the electrode layer further comprises a third power wiring connected to the cathode of each of the subpixels, wherein the valley comprises a first valley portion overlapping the third power wiring and penetrating the bank planarization layer, and wherein a portion of the third power wiring between the first pixels and the second pixels contacts the bank insulating layer through the first valley portion.

6. The backplane substrate of claim 5, wherein the fifth conductive layer comprises the second power wiring, and wherein the valley further comprises:

a second valley portion overlapping the second power wiring; and a third valley portion different from the first valley portion and the second valley portion.

7. The backplane substrate of claim 6, wherein each of the second valley portion and the third valley portion penetrates the bank planarization layer.

8. The backplane substrate of claim 6, wherein the second valley portion penetrates the bank planarization layer and the third planarization layer, and wherein a portion of the second power wiring between the first pixels and the second pixels contacts the bank insulating layer through the second valley portion.

9. The backplane substrate of claim 8, wherein the third valley portion penetrates the bank planarization layer and the third planarization layer.

10. The backplane substrate of claim 8, wherein the third valley portion penetrates the bank planarization layer, the third planarization layer, and the second planarization layer.

11. The backplane substrate of claim 5, wherein the electrode layer further comprises:

an anode pad on the anode; and a cathode pad on the cathode, and wherein a light emitting element of each of the subpixels comprises a flip chip-type micro-light emitting diode element and is mounted on the anode pad and the cathode pad of a corresponding subpixel of the subpixels.

12. The backplane substrate of claim 5, wherein the pixel drivers of the subpixels are electrically connected to the anodes of the subpixels, respectively, wherein the circuit layer further comprises:

a scan write wiring configured to transmit a scan write signal;

a scan initialization wiring configured to transmit a scan initialization signal;

a sweep signal wiring configured to transmit a sweep signal;

a first data wiring configured to transmit a first data voltage; and a second data wiring configured to transmit a second data voltage, wherein one pixel driver of the pixel drivers comprises:

a first pixel driving circuit unit configured to generate a control current according to the first data voltage;

a second pixel driving circuit unit configured to generate a driving current to be transmitted to the anode, according to the second data voltage; and a third pixel driving circuit unit configured to control a period during which the driving current is applied to the anode according to the control current of the first pixel driving circuit unit, and wherein the first pixel driving circuit unit comprises:

a first transistor configured to generate the control current according to the first data voltage;

a second transistor configured to apply the first data voltage of the first data wiring to a first electrode of the first transistor according to the scan write signal;

a third transistor configured to apply an initialization voltage of an initialization voltage wiring to a gate electrode of the first transistor according to the scan initialization signal;

a fourth transistor configured to connect the gate electrode of the first transistor and a second electrode of the first transistor according to the scan write signal; and a first capacitor located between the sweep signal wiring and the gate electrode of the first transistor.

13. The backplane substrate of claim 12, wherein the circuit layer further comprises:

a gate voltage wiring configured to transmit a gate level voltage;

a first emission wiring configured to transmit a first emission signal; and a scan control wiring configured to transmit a scan control signal, and wherein the first pixel driving circuit unit further comprises:

a fifth transistor configured to connect the first power wiring to the first electrode of the first transistor according to the first emission signal;

a sixth transistor configured to connect the second electrode of the first transistor to the third pixel driving circuit unit according to the first emission signal; and a seventh transistor configured to connect a first node between the sweep signal wiring and the first capacitor to the gate voltage wiring according to the scan control signal.

14. The backplane substrate of claim 13, wherein the second pixel driving circuit unit comprises:

an eighth transistor configured to generate the driving current according to the second data voltage;

a ninth transistor configured to apply the second data voltage of the second data wiring to a first electrode of the eighth transistor according to the scan write signal;

a tenth transistor configured to apply the initialization voltage of the initialization voltage wiring to a gate electrode of the eighth transistor according to the scan initialization signal; and an eleventh transistor configured to connect the gate electrode of the eighth transistor and a second electrode of the eighth transistor according to the scan write signal.

15. The backplane substrate of claim 14, wherein the second pixel driving circuit unit further comprises:

a twelfth transistor configured to connect the second power wiring to the first electrode of the eighth transistor according to the first emission signal;

a thirteenth transistor configured to connect the first power wiring to a second node according to the scan control signal;

a fourteenth transistor configured to connect the second power wiring to the second node according to the first emission signal; and a second capacitor located between the gate electrode of the eighth transistor and the second node.

16. The backplane substrate of claim 15, wherein the third pixel driving circuit unit is connected to the sixth transistor of the first pixel driving circuit unit at a third node, and wherein the third pixel driving circuit unit comprises:

a fifteenth transistor comprising a gate electrode connected to the third node;

a sixteenth transistor configured to connect the third node to the initialization voltage wiring according to the scan control signal;

a seventeenth transistor configured to connect a second electrode of the fifteenth transistor to the anode according to a second emission signal;

an eighteenth transistor configured to connect the anode to the initialization voltage wiring according to the scan control signal; and a third capacitor located between the third node and the initialization voltage wiring.

17. The backplane substrate of claim 16, wherein the semiconductor layer comprises a channel, a source electrode, and a drain electrode of each of the first through eighteenth transistors, wherein the first conductive layer comprises a gate electrode of each of the first through eighteenth transistors and first through third capacitor electrodes that are ends of the first through third capacitors, respectively, wherein the second conductive layer comprises fourth through sixth capacitor electrodes that are the other ends of the first through third capacitors, respectively, wherein the third conductive layer comprises the initialization voltage wiring, the scan initialization wiring, the scan write wiring, the first emission wiring, a second emission wiring, the sweep signal wiring, the gate voltage wiring, and the scan control wiring, wherein the fourth conductive layer comprises the first data wiring and the second data wiring, and wherein the fifth conductive layer comprises the second power wiring, wherein the first power wiring comprises a first power main wiring extending in a first direction; and a first power sub-wiring extending in a second direction and electrically connected to the first power main wiring, wherein the third conductive layer further comprises the first power main wiring, wherein the fourth conductive layer further comprises the first power sub-wiring, and wherein the third conductive layer further comprises a third power auxiliary wiring configured to receive a third power.

18. The backplane substrate of claim 17, wherein the fourth conductive layer further comprises a first anode connection electrode spaced from the first data wiring, the second data wiring, and the first power main wiring and electrically connected to the seventeenth transistor, the eighteenth transistor, and a nineteenth transistor, wherein the fifth conductive layer further comprises a second anode connection electrode spaced from the second power wiring and electrically connected to the first anode connection electrode, and wherein the anode is electrically connected to the second anode connection electrode.

19. The backplane substrate of claim 3, wherein the circuit layer further comprises:

a first auxiliary insulating layer between the first planarization layer and the fourth conductive layer and comprising an inorganic insulating material;

a second auxiliary insulating layer between the second planarization layer and the fifth conductive layer and comprising the inorganic insulating material; and a third auxiliary insulating layer between the third planarization layer and the electrode layer and comprising the inorganic insulating material.

20. A display device comprising:

a backplane substrate comprising pixel drivers respectively corresponding to subpixels and an anode and a cathode corresponding to an emission area of each of the subpixels;

pixels, each comprising two or more adjacent subpixels from among the subpixels; and light emitting elements respectively corresponding to the emission areas of the subpixels, wherein each of the light emitting elements is mounted on the anode and the cathode of each of the subpixels, wherein the backplane substrate comprises:

a support substrate;

a circuit layer on a first surface of the support substrate and comprising the pixel drivers;

an electrode layer on the circuit layer and comprising the anode and the cathode of each of the subpixels;

a bank layer on the circuit layer and corresponding to an area around the emission area of each of the subpixels; and a valley shaped similarly to edges of the support substrate, spaced from an edge of the edges of the support substrate and penetrating at least the bank layer, wherein the pixels comprise: first pixels between the edge of the support substrate and the valley.

21. The display device of claim 20, wherein the pixels further comprise second pixels adjacent to the valley, and wherein the valley is at a boundary between the first pixels and the second pixels.

22. The display device of claim 21, wherein the circuit layer comprises:

a semiconductor layer on the first surface of the support substrate;

a first conductive layer on a first gate insulating layer covering the semiconductor layer;

a second conductive layer on a second gate insulating layer covering the first conductive layer;

a third conductive layer on an interlayer insulating layer covering the second conductive layer;

a fourth conductive layer on a first planarization layer covering the third conductive layer;

a fifth conductive layer on a second planarization layer covering the fourth conductive layer; and a third planarization layer covering the fifth conductive layer, wherein the electrode layer is on the third planarization layer, wherein the bank layer comprises a bank planarization layer on the circuit layer and a bank insulating layer covering the bank planarization layer, and wherein the bank insulating layer comprises an inorganic insulating material and extends to edges of the emission area of each of the subpixels and covers a portion of edges of the anode and a portion of edges of the cathode.

23. The display device of claim 22, wherein the circuit layer further comprises:

a first power wiring configured to transmit a first power to the pixel drivers; and a second power wiring configured to transmit a second power to the pixel drivers, wherein the electrode layer further comprises a third power wiring connected to the cathode of each of the subpixels, wherein the fifth conductive layer comprises the second power wiring, wherein the valley comprises:

a first valley portion overlapping the third power wiring;

a second valley portion overlapping the second power wiring; and a third valley portion being other than the first valley portion and the second valley portion, wherein the first valley portion penetrates the bank planarization layer, and wherein a portion of the third power wiring located between the first pixels and the second pixels contacts the bank insulating layer through the first valley portion.

24. The display device of claim 23, wherein the second valley portion penetrates the bank planarization layer and the third planarization layer, and wherein a portion of the second power wiring located between the first pixels and the second pixels contacts the bank insulating layer through the second valley portion.

25. The display device of claim 23, wherein the third valley portion penetrates the bank planarization layer, the third planarization layer, and the second planarization layer.

26. The display device of claim 23, wherein each of the light emitting elements comprises:

a base substrate;

a first semiconductor on a surface of the base substrate;

an active layer on a portion of the first semiconductor;

a second semiconductor on the active layer and having a conductivity type different from that of the first semiconductor;

a first contact electrode on another portion of the first semiconductor; and a second contact electrode on the second semiconductor.

27. The display device of claim 26, wherein the electrode layer further comprises:

an anode pad on the anode; and a cathode pad on the cathode, wherein the anode pad is electrically connected to the first contact electrode through an anode contact electrode, and wherein the cathode pad is electrically connected to the second contact electrode through a cathode contact electrode.

28. The display device of claim 23, wherein the pixel drivers of the subpixels are electrically connected to the anodes of the subpixels, respectively, wherein the circuit layer further comprises:

a scan write wiring configured to transmit a scan write signal;

a scan initialization wiring configured to transmit a scan initialization signal;

a sweep signal wiring configured to transmit a sweep signal;

a first data wiring configured to transmit a first data voltage; and a second data wiring configured to transmit a second data voltage, wherein one pixel driver of the pixel drivers comprises:

a first pixel driving circuit unit configured to generate a control current according to the first data voltage;

a second pixel driving circuit unit configured to generate a driving current to be transmitted to the anode, according to the second data voltage; and a third pixel driving circuit unit configured to control a period during which the driving current is applied to the anode according to the control current of the first pixel driving circuit unit, wherein the first pixel driving circuit unit comprises:

a first transistor configured to generate the control current according to the first data voltage;

a second transistor configured to apply the first data voltage of the first data wiring to a first electrode of the first transistor according to the scan write signal;

a third transistor configured to apply an initialization voltage of an initialization voltage wiring to a gate electrode of the first transistor according to the scan initialization signal;

a fourth transistor configured to connect the gate electrode of the first transistor and a second electrode of the first transistor according to the scan write signal; and a first capacitor located between the sweep signal wiring and the gate electrode of the first transistor.

29. The display device of claim 28, wherein the circuit layer further comprises:

a gate voltage wiring configured to transmit a gate level voltage;

a first emission wiring configured to transmit a first emission signal; and a scan control wiring configured to transmit a scan control signal, and wherein the first pixel driving circuit unit further comprises:

a fifth transistor configured to connect the first power wiring to the first electrode of the first transistor according to the first emission signal;

a sixth transistor configured to connect the second electrode of the first transistor to the third pixel driving circuit unit according to the first emission signal; and a seventh transistor configured to connect a first node between the sweep signal wiring and the first capacitor to the gate voltage wiring according to the scan control signal.

30. The display device of claim 29, wherein the second pixel driving circuit unit comprises:

an eighth transistor configured to generate the driving current according to the second data voltage;

a ninth transistor configured to apply the second data voltage of the second data wiring to a first electrode of the eighth transistor according to the scan write signal;

a tenth transistor configured to apply the initialization voltage of the initialization voltage wiring to a gate electrode of the eighth transistor according to the scan initialization signal; and an eleventh transistor configured to connect the gate electrode of the eighth transistor and a second electrode of the eighth transistor according to the scan write signal.

31. The display device of claim 30, wherein the second pixel driving circuit unit further comprises:

a twelfth transistor configured to connect the second power wiring to the first electrode of the eighth transistor according to the first emission signal;

a thirteenth transistor configured to connect the first power wiring to a second node according to the scan control signal;

a fourteenth transistor configured to connect the second power wiring to the second node according to the first emission signal; and a second capacitor located between the gate electrode of the eighth transistor and the second node.

32. The display device of claim 31, wherein the third pixel driving circuit unit is connected to the sixth transistor of the first pixel driving circuit unit at a third node, and wherein the third pixel driving circuit unit comprises:

a fifteenth transistor comprising a gate electrode connected to the third node;

a sixteenth transistor configured to connect the third node to the initialization voltage wiring according to the scan control signal;

a seventeenth transistor configured to connect a second electrode of the fifteenth transistor to the anode according to a second emission signal;

an eighteenth transistor configured to connect the anode to the initialization voltage wiring according to the scan control signal; and a third capacitor located between the third node and the initialization voltage wiring.

33. The display device of claim 32, wherein the semiconductor layer comprises a channel, a source electrode, and a drain electrode of each of the first through eighteenth transistors, wherein the first conductive layer comprises a gate electrode of each of the first through eighteenth transistors and first through third capacitor electrodes that are ends of the first through third capacitors, respectively, wherein the second conductive layer comprises fourth through sixth capacitor electrodes that are other ends of the first through third capacitors, respectively, wherein the third conductive layer comprises the initialization voltage wiring, the scan initialization wiring, the scan write wiring, the first emission wiring, a second emission wiring, the sweep signal wiring, the gate voltage wiring and the scan control wiring, wherein the fourth conductive layer comprises the first data wiring and the second data wiring, wherein the fifth conductive layer comprises the second power wiring, wherein the first power wiring comprises a first power main wiring extending in a first direction and a first power sub-wiring extending in a second direction and electrically connected to the first power main wiring, wherein the third conductive layer further comprises the first power main wiring, wherein the fourth conductive layer further comprises the first power sub-wiring, and wherein the third conductive layer further comprises a third power auxiliary wiring to which third power is applied.

34. The display device of claim 33, wherein the fourth conductive layer further comprises a first anode connection electrode spaced from the first data wiring, the second data wiring and the first power main wiring and electrically connected to the seventeenth transistor, the eighteenth transistor, and a nineteenth transistor, wherein the fifth conductive layer further comprises a second anode connection electrode spaced from the second power wiring and electrically connected to the first anode connection electrode, and wherein the anode is electrically connected to the second anode connection electrode.

35. The display device of claim 23, wherein the backplane substrate further comprises:

an additional circuit layer on a second surface of the support substrate;

an additional planarization layer on a portion of the second surface of the support substrate and covering a portion of the additional circuit layer;

an additional insulating layer on the second surface of the support substrate, covering the additional planarization layer, and comprising the inorganic insulating material;

a side wiring on a side surface of the support substrate and electrically connecting the circuit layer and the additional circuit layer; and an overcoat layer covering the side wiring, wherein a surface of the backplane substrate is covered with a first protective layer on the bank layer, and the other surface of the backplane substrate is covered with a second protective layer on the additional insulating layer, and wherein the first protective layer is in an area surrounded by the valley.

* * * * *